United States Patent
Sato et al.

(10) Patent No.: US 8,830,287 B2
(45) Date of Patent: Sep. 9, 2014

(54) SURFACE-EMISSION LASER ARRAY, OPTICAL SCANNING APPARATUS AND IMAGE FORMING APPARATUS

(71) Applicants: Shunichi Sato, Miyagi (JP); Akihiro Itoh, Miyagi (JP); Hiroyoshi Shouji, Miyagi (JP); Yoshinori Hayashi, Kanagawa (JP); Daisuke Ichii, Kanagawa (JP); Kei Hara, Miyagi (JP); Mitsumi Fujii, Iwate (JP)

(72) Inventors: Shunichi Sato, Miyagi (JP); Akihiro Itoh, Miyagi (JP); Hiroyoshi Shouji, Miyagi (JP); Yoshinori Hayashi, Kanagawa (JP); Daisuke Ichii, Kanagawa (JP); Kei Hara, Miyagi (JP); Mitsumi Fujii, Iwate (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/930,409

(22) Filed: Jun. 28, 2013

(65) Prior Publication Data

US 2013/0286150 A1  Oct. 31, 2013

Related U.S. Application Data

(62) Division of application No. 13/304,874, filed on Nov. 28, 2011, now Pat. No. 8,508,567, which is a division of application No. 11/993,406, filed as application No. PCT/JP2007/059563 on Apr. 27, 2007, now Pat. No. 8,089,498.

(30) Foreign Application Priority Data

| Apr. 28, 2006 | (JP) | 2006-126074 |
| Apr. 28, 2006 | (JP) | 2006-126076 |
| Feb. 16, 2007 | (JP) | 2007-035652 |
| Mar. 8, 2007 | (JP) | 2007-057955 |

(51) Int. Cl.

| B41J 2/45 | (2006.01) |
| H01S 5/42 | (2006.01) |
| B82Y 20/00 | (2011.01) |
| B41J 2/47 | (2006.01) |
| H01S 5/183 | (2006.01) |
| H01S 5/343 | (2006.01) |
| G02B 26/12 | (2006.01) |

(52) U.S. Cl.
CPC . *B41J 2/45* (2013.01); *H01S 5/423* (2013.01); *H01S 5/18311* (2013.01); *H01S 5/3432* (2013.01); *H01S 5/18358* (2013.01); *B82Y 20/00* (2013.01); *B41J 2/473* (2013.01); *G02B 26/123* (2013.01)
USPC ......................................................... 347/238

(58) Field of Classification Search
USPC ................. 347/233, 238; 372/50.12, 50.122, 372/50.124
See application file for complete search history.

(56) References Cited

U.S. PATENT DOCUMENTS

| 4,814,667 A | 3/1989 | Tanaka |
| 4,888,603 A | 12/1989 | Hart et al. |

(Continued)

FOREIGN PATENT DOCUMENTS

| EP | 0781661 A1 | 7/1997 |
| EP | 0781662 A1 | 7/1997 |

(Continued)

OTHER PUBLICATIONS

Mar. 29, 2011 European search report in connection with counterpart European patent application No. 07 74 2998.

(Continued)

*Primary Examiner* — Hai C Pham
(74) *Attorney, Agent, or Firm* — Cooper & Dunham LLP

(57) ABSTRACT

A surface-emission laser array comprises a plurality of surface-emission laser diode elements arranged in the form of a two-dimensional array, wherein a plurality of straight lines drawn perpendicularly to a straight line extending in a first direction from respective centers of the plurality of surface emission laser diode elements aligned in a second direction perpendicular to the first direction, are formed with generally equal interval in the first direction, the plurality of surface-emission laser diode elements are aligned in the first direction with an interval set to a reference value, and wherein the number of the surface-emission laser diode elements aligned in the first direction is smaller than the number of the surface-emission laser diode elements aligned in the second direction.

9 Claims, 47 Drawing Sheets

(56) References Cited

U.S. PATENT DOCUMENTS

| | | | |
|---|---|---|---|
| 5,848,087 A * | 12/1998 | Iwasa et al. | 372/50.23 |
| 5,923,691 A | 7/1999 | Sato | |
| 5,939,733 A | 8/1999 | Sato | |
| 5,956,070 A | 9/1999 | Paoli et al. | |
| 6,002,700 A | 12/1999 | Sato | |
| 6,072,196 A | 6/2000 | Sato | |
| 6,101,018 A | 8/2000 | Naiki et al. | |
| 6,144,685 A | 11/2000 | Iwasa et al. | |
| 6,172,787 B1 * | 1/2001 | Naiki | 359/204.1 |
| 6,188,466 B1 | 2/2001 | Iwasa et al. | |
| 6,207,973 B1 | 3/2001 | Sato et al. | |
| 6,233,264 B1 | 5/2001 | Sato | |
| 6,450,664 B1 | 9/2002 | Kelly | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Takahashi et al. | |
| 6,844,888 B2 | 1/2005 | Nakamura | |
| 6,959,025 B2 | 10/2005 | Jikutani et al. | |
| 7,052,152 B2 | 5/2006 | Harbers et al. | |
| 7,218,432 B2 | 5/2007 | Ichii et al. | |
| 7,901,102 B2 | 3/2011 | Jung et al. | |
| 2004/0183890 A1 * | 9/2004 | Sakamoto et al. | 347/233 |
| 2004/0247009 A1 | 12/2004 | Noda et al. | |
| 2005/0169334 A1 | 8/2005 | Sato | |
| 2005/0238075 A1 | 10/2005 | Jikutani et al. | |
| 2006/0007979 A1 | 1/2006 | Jikutani et al. | |
| 2006/0092264 A1 * | 5/2006 | Matsuzaki et al. | 347/233 |
| 2006/0261352 A1 | 11/2006 | Takahashi et al. | |
| 2008/0232412 A1 | 9/2008 | Mizuuchi et al. | |
| 2009/0016395 A1 | 1/2009 | Noda et al. | |

FOREIGN PATENT DOCUMENTS

| | | | |
|---|---|---|---|
| EP | 1411603 A1 | 4/2004 | |
| JO | 11-340570 | 12/1999 | |
| JP | 1-159269 | 6/1989 | |
| JP | 8-72306 | 3/1996 | |
| JP | 9-200431 | 7/1997 | |
| JP | 11-354888 | 12/1999 | |
| JP | 3013886 | 12/1999 | |
| JP | 2000-94745 | 4/2000 | |
| JP | 2001-272615 | 10/2001 | |
| JP | 3279464 | 2/2002 | |
| JP | 2002-314191 | 10/2002 | |
| JP | 2003-273456 | 9/2003 | |
| JP | 2005-10268 | 1/2005 | |
| JP | 2005-17607 | 1/2005 | |
| JP | 2005010268 A * | 1/2005 | B41J 2/44 |
| JP | 2005-234510 | 9/2005 | |
| JP | 2005-274755 | 10/2005 | |
| JP | 2005-3093001 | 11/2005 | |
| JP | 2005-340779 | 12/2005 | |
| JP | 2006-196852 | 7/2006 | |
| WO | WO2005/062434 A1 | 7/2005 | |

OTHER PUBLICATIONS

N. Ueki et al. "VCSEL Array Applicable to Laser Printer", IEICE Electronics Society Meeting 2004, CS-3-4, pp. S-31-S-32.

* cited by examiner

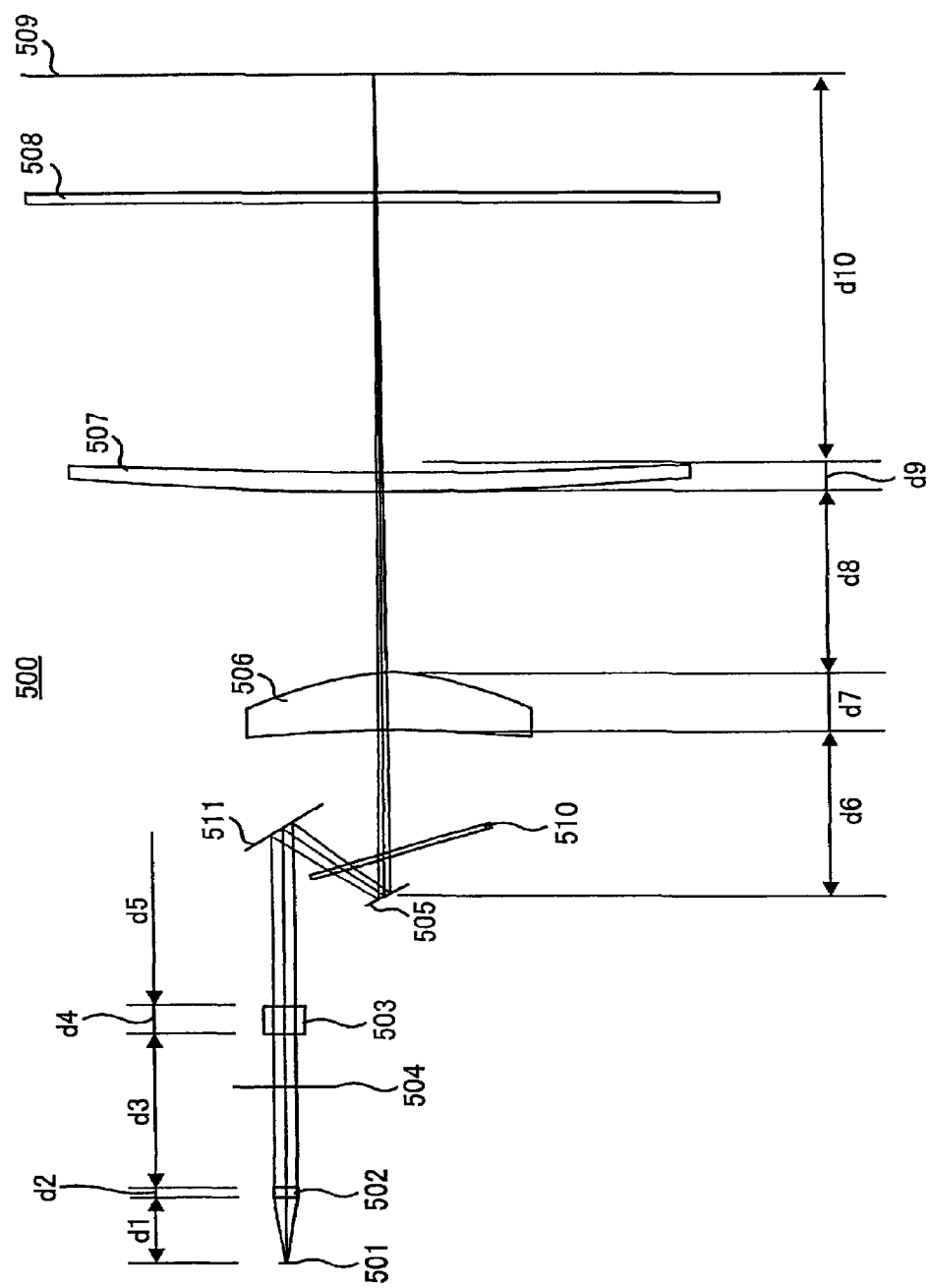

X1 > X2 > X3 > X4

SURFACE-EMISSION LASER ARRAY, OPTICAL SCANNING APPARATUS AND IMAGE FORMING APPARATUS

CROSS-REFERSNCE TO RELATED APPLICATIONS

This application is a divisional of U.S. application Ser. No. 13/304,874, filed on Nov. 28, 2011, which is a divisional of U.S application Ser. No. 11/993,406, filed on Dec, 20, 2007 which is a Section 371 of PCT/JP2007/059563 filed on Apr. 27, 2007, claiming the priority of Japanese patent Applications Nos. 2006-126074, 2006-126076, 2007-035652and 2007-057955, filed with Japanese Patent Office on Apr. 28,2006, Apr. 28, 2006, Feb. 16, 2007, and Mar. 8, 2007, respectively.

TECHNICAL FIELD

The present invention generally relates to surface-emission laser arrays, optical scanning apparatuses and image forming apparatuses, and more particularly to a surface-emission laser array including therein a plurality of surface-emission layer elements, an optical scanning apparatus that uses such a surface-emission laser array, and an image forming apparatus that uses such an optical scanning apparatus.

BACKGROUND ART

In the art of electron photography, image forming method that uses laser beam is used extensively as the image forming method capable of achieving image recording of high-definition image quality. In electron photography, a latent image is formed by causing a laser beam to scan over a photosensitive drum in an axial direction thereof (main scanning of the laser beam) by using a polygonal mirror, while rotating the photosensitive drum at the same time about a rotational direction thereof (sub-scanning of the laser beam).

In such a technological field of electron photography, there is a continuous demand of higher resolution and higher output speed. In the case resolution of image has increased by two times, the duration of two times as large as the duration needed for image forming process of conventional resolution becomes necessary for each of the main scanning process and the sub-scanning process, and thus, the duration of four times as large as the duration in the case of conventional image forming process becomes necessary with such high-resolution image forming process. Thus, for realizing high resolution image forming process, there is a need of achieving high-speed output of images at the same time.

For achieving such high-speed image formation, it is conceivable to use high laser beam output, multiple laser beam construction, high-sensitivity photosensitive bodies, and the like. Thus, it is generally practiced in the art of high-speed image forming apparatuses to use a writing optical source that produces multiple laser beams. With this approach, the area where the latent images are formed becomes n times as large as the conventional case of using a single laser beam when n laser beams are used simultaneously. Associated with this, it becomes possible to reduce the time needed for image formation to 1/n.

For example, there is a proposal of a multiple-beam laser diode (Patent References 1 and 2) that includes plural optical sources on a single chip. However, these conventional constructions use edge-emission laser diodes disposed to form a one-dimensional array, and because of this, there is a drawback of large electric power consumption, which in turn necessitates the use of a cooling system. From practical viewpoint of cost, the system of four beams or eight beams is thought as the limit of such an approach. Further, when the number of the laser beams is increased, there tends to arise a large deviation of the laser beam from the optical axis of the optical elements constituting the optical system, leading to degradation of optical properties.

On the other hand, a surface-emission laser diode is a semiconductor laser device that emits a light perpendicularly to the substrate and has an advantageous feature of easy integration to form a two-dimensional array. Further, as compared with the laser diodes of edge-emission type, a surface-emission laser diode has an advantageous feature of small electric power consumption, which is ten times as small as compared with the edge-emission laser diodes. Thus, use of surface-emission laser diode is thought to be advantageous when integrating a large number of optical sources to form a two-dimensional array.

For example, there is a known surface-emission laser array designed for a writing optical system that includes 32 surface-emission laser diode elements arranged in eight rows and four columns and uses a polygonal mirror for causing the scanning of the laser beams (Non-Patent Reference 1).

With this surface-emission laser array, eight of the surface-emission laser diode elements are aligned in the sub-scanning direction and fourth surface-emission laser diode elements are aligned in the main-scanning direction. Thus, designating the interval between each neighboring pair of the eight surface-emission laser diodes aligned in the sub-scanning direction (direction of drum rotation) as "d" and designating the interval between each neighboring pair of the four surface-emission laser diodes aligned in the main scanning direction (longitudinal direction of the drum) as "x", the 32 surface-emission laser diode elements are disposed such that the interval between four straight lines drawn perpendicularly to a line extending in the sub-scanning direction from 4 respective centers of the four surface-emission laser diode elements aligned in the main scanning direction becomes equal and takes a value of d/4, and such that d is smaller than x (d<x).

With this, high-density writing with the density of 2400 dpi (dot/inch) is realized. Further, in the case the main scanning by polygonal mirror is not used and the optical sources are disposed in one-to-one correspondence as in the case of LED (light emitting diode) printer described in Patent Reference 3, the main scanning direction and the sub-scanning direction are interchanged.

Further, there is a known surface-emission laser array designed for a writing optical system that includes 36 surface-emission laser diode elements arranged in six rows and six columns and uses a polygonal mirror for causing the scanning of the laser beams (Patent References 4 and 5).

With this surface-emission laser array, six of the surface-emission laser diode elements are aligned in the sub-scanning direction and 6 of the surface-emission laser diode elements are aligned in the main-scanning direction. Thus, designating the interval between each neighboring pair of the six surface-emission laser diodes aligned in the sub-scanning direction (direction of drum rotation) as "d" and designating the interval between each neighboring pair of the six surface-emission laser diodes aligned in the main scanning direction (longitudinal direction of the drum) as "x", the 36 surface-emission laser diode elements are disposed such that the interval between six straight lines drawn perpendicularly to a line extending in the sub-scanning direction from six respective centers of the six surface-emission laser diode elements aligned in the main scanning direction becomes equal with each other and takes a value of d/6.

Thus, in the case of concentrating the 36 laser beams emitted from the 36 surface-emission laser diode elements thus disposed by using a single collimating lens, it is preferable that that all the laser beams are gathered in the vicinity of the optical axis of the collimating lens for avoiding aberration of the lens. Thus, it is preferable that the surface-emission laser diode elements constituting the surface-emission laser array of the form of two-dimensional array are disposed with high integration density as high as possible. In view of the foregoing demand, there is a proposal of increasing the density of the plural surface-emission laser diode elements (Patent Reference 6). In Patent Reference 6, the plural surface-emission laser diode elements are disposed with a constant interval with each other.

Patent Reference 1

Japanese Laid-Open Patent Application 11-340570

Patent Reference 2

Japanese Laid-Open Patent Application 11-354888

Patent Reference 3

U.S. Pat. No. 5,848,087

Patent Reference 4

Japanese Laid-Open Patent Application 2005-274755

Patent Reference 5

Japanese Laid-Open Patent Application 2005-234510

Patent Reference 6

Japanese Laid-Open Patent Application 2001-272615

Non-Patent Reference 1

IEICE Electronics Society Meeting 2004, CS-3-4

DISCLOSURE OF THE INVENTION

When conducting high density recording by using a writing optical system that causes scanning of the optical beam by using a polygonal mirror, it should be noted that the recording density in the sub-scanning direction is determined by the magnification of the optical system and the interval between the surface-emission laser diode elements in the sub-scanning direction defined as the interval of the straight lines drawn perpendicularly to a line extending in the sub-scanning direction from the respective centers of the surface-emission laser elements.

However, because of the constraints imposed by the size of the surface-emission laser diode elements and because of the constraints imposed by the need of securing space for electrically and spatially separating the surface-emission laser diode elements with each other and for providing interconnection patterns for the surface-emission laser diode elements, there has been a limitation for reducing the separation between the surface-emission laser diode elements in the sub-scanning direction.

Further, there arises a problem that the adjacent surface-emission laser diode elements cause thermal interference with each other because of the heat generated therefrom when a plurality of surface-emission laser diode elements are integrated with high integration density, and associated therewith, there arise various problems such as decrease of output power or deterioration of reliability.

Because the plural surface-emission laser diode elements are disposed in the form of two-dimensional array in such a surface-emission laser array, there is a tendency that the laser diode elements at the central part of the array are affected heavily by other laser diode elements in the array, and thus, there is a tendency that the surface-emission laser diode elements at the central part of the array show large drop of output power caused by the temperature rise. Thus, even when the surface-emission laser diode elements in the array are operated under the condition such that uniform laser output should be obtained when the laser diode elements are operated individually, there are cases in which the laser output becomes non-uniform inside the surface-emission laser array. Further, in view of the fact that lifetime of a surface-emission laser diode element becomes shorter when it is operated at higher temperatures, the lifetime of the surface-emission laser array, being determined by the lifetime of the laser diode elements disposed at the central part thereof, is shortened inevitably.

The present invention has been made in view of the foregoing problems and it is an object of the present invention to provide a surface-emission laser array capable of reducing the interval between the surface-emission laser diode elements therein in a first direction, the interval in the first direction being defined as an interval of straight lines drawn perpendicularly from respective centers of the respective surface-emission laser diode elements to another straight line that extends in the first direction.

Another object of the present invention is to provide an optical scanning apparatus that uses a surface emission laser array capable of reducing the interval between the surface-emission laser diode elements used therein in a first direction, the interval in the first direction being defined as an interval of straight lines drawn from respective centers of the respective surface-emission laser diode elements perpendicularly to another straight line that extends in the first direction.

Another object of the present invention is to provide an image forming apparatus that uses a surface emission laser array capable of reducing the interval between the surface-emission laser diode elements used therein in a first direction, the interval in the first direction being defined as an interval of straight lines drawn from respective centers of the respective surface-emission laser diode elements perpendicularly to another straight line that extends in the first direction.

Another object of the present invention is to provide a surface-emission laser array capable of obtaining a uniform output throughout plural surface-emission laser diode elements constituting the surface-emission laser array even when the plural surface-emission laser diode elements are operated at the same time.

Another object of the present invention is to provide a surface-emission laser array having an extended lifetime.

Another object of the present invention is to provide an optical scanning apparatus having a surface-emission laser array capable of obtaining a uniform output throughout plural surface-emission laser diode elements constituting the surface-emission laser array even when the plural surface-emission laser diode elements are operated at the same time.

Another object of the present invention is to provide an optical scanning apparatus having a surface-emission laser array of an extended lifetime.

Another object of the present invention is to provide an image forming apparatus having a surface-emission laser array capable of obtaining a uniform output throughout plural surface-emission laser diode elements constituting the surface-emission laser array even when the plural surface-emission laser diode elements are operated at the same time.

Another object of the present invention is to provide an optical scanning apparatus having a surface-emission laser array of an extended lifetime.

In an aspect, the present invention provides a surface-emission laser array in which a plurality of surface-emission laser diode elements are arranged in the form of a two-dimensional array. Thereby, a plurality of straight lines drawn perpendicularly to a straight line extending in a first direction from respective centers of said plurality of surface emission laser diode elements aligned in a second direction perpendicular to said first direction, are formed with generally equal interval in said first direction. Further, the plurality of surface-emission laser diode elements are aligned in the first direction with an interval set to a reference value. The number of the surface-emission laser diode elements aligned in the first direction is smaller than the number of the surface-emission laser diode elements aligned in the second direction.

In another aspect, the present invention provides a surface-emission laser array in which a plurality of surface-emission laser diode elements are arranged in the form of a two-dimensional array. Thereby, a plurality of straight lines drawn perpendicularly to a straight line extending in a first direction from respective centers of said plurality of surface emission laser diode elements aligned in a second direction perpendicular to said first direction, are formed with generally uniform separation in said first direction. Further, the surface-emission laser diode elements aligned in the first direction are disposed with a first interval in the first direction; the surface-emission laser diode elements aligned in the second direction are disposed with a second interval in the second direction, the first interval being smaller than the second interval. The number of the surface-emission laser diode elements aligned in the first direction is equal to or smaller than the number of the surface-emission laser diode elements aligned in the second direction.

Preferably, the number of the surface-emission laser diode elements aligned in the second direction changes in the first direction, and the number of the surface-emission laser diode elements aligned in the first direction changes in the second direction.

In another aspect, the present invention provides a surface-emission laser array comprising m×n surface-emission laser diode elements. M (m being an integer equal to or larger than 2) of said m×n surface-emission laser diode elements are aligned in a first direction, and n (n being an integer equal to or larger than 2) of said m×n surface-emission laser diode elements are aligned in a second direction perpendicular to the first direction. N straight lines drawn perpendicularly to a line extending in the first direction from respective centers of the n surface-emission laser diode are formed with generally uniform interval in the first direction.

Further, there holds a relationship d<x and m≤n, where d represents the interval of the m surface-emission laser diode elements aligned in the first direction, and x represents the interval of the n surface-emission laser diode elements aligned in the second direction.

In another aspect, the present invention provides a surface-emission laser array in which a plurality of surface-emission laser diode elements are arranged in the form of a two-dimensional array. Thereby, a plurality of straight lines drawn perpendicularly to a straight line extending in a first direction from respective centers of said plurality of surface emission laser diode elements aligned in a second direction perpendicular to said first direction, are formed with generally equal interval in said first direction. Further, at least one interconnection pattern connected to at least one surface-emission laser diode element of the plurality of surface-emission laser diode elements disposed between one surface-emission laser diode element at one side and another surface-emission laser diode element at the other side, is disposed between surface-emission laser diode elements aligned in the second direction.

Preferably, the plurality of surface-emission laser diode elements comprise m×n surface-emission laser diode elements in which m (m being an integer equal to or larger than 2) surface-emission diode elements are aligned in a first direction, and n (n being an integer equal to or larger than 2) surface-emission diode elements are aligned in a second direction perpendicular to the first direction. Further, there holds a relationship d<x and m≤n, where d represents the interval of the m surface-emission laser diode elements aligned in the first direction, and x represents the interval of the n surface-emission laser diode elements aligned in the second direction.

Preferably, the plural surface-emission laser diode elements are disposed in a zigzag pattern in the first direction.

Preferably, the surface-emission laser array forms an optical scanning apparatus, and wherein the first direction is a sub-scanning direction and the second direction is a main scanning direction of the optical scanning apparatus.

In another aspect the present invention provides an optical scanning apparatus comprising the surface-emission laser array as set forth before, a deflection part deflecting a plurality of laser beams emitted from the surface-emission laser array, and an optical element directing the optical beams deflected by the deflection part to a scanning surface.

Preferably, there holds a relationship $|\beta m|>|\beta s|$, wherein $\beta m$ stands for a lateral magnification between the surface-emission laser array and the scanning surface in the main scanning direction and $\beta s$ stands for a lateral magnification in the sub-scanning direction.

Further, the present invention provides an image forming apparatus having the surface-emission laser array as set forth before as a writing optical source.

Further, the present invention provides an image forming apparatus having the optical scanning apparatus as set forth before.

According to the surface-emission laser array, the plurality of surface-emission laser diode elements are disposed two-dimensionally in the first direction and in the second direction, wherein the surface-emission laser diode elements aligned in the first direction are disposed with an interval set to a reference value, and wherein the number of the surface-emission laser diode elements aligned in the first direction is set smaller than the number of the surface-emission laser diode elements aligned in the second direction.

Thus, according to the present invention, the interval between the surface-emission laser diode elements in the first direction, defined as the interval of the straight lines drawn perpendicularly from the respective centers of the surface-emission laser diode elements forming the surface-emission laser array to the line extending in the first direction, can be reduced.

Further, according to the surface-emission laser array of the present invention, the plurality of surface-emission laser elements are disposed two-dimensionally in the first direction and in the second direction, wherein the interval between the surface-emission laser diode elements aligned in the first direction is set smaller than the interval of the surface-emission laser diode elements aligned in the second direction, and the number of the surface-emission laser diode elements aligned in the first direction is set equal to or smaller than the number of the surface-emission laser diode elements aligned in the second direction.

Thus, according to the present invention, the interval between the surface-emission laser diode elements in the first direction, defined as the interval of the straight lines drawn perpendicularly from the respective centers of the surface-emission laser diode elements forming the surface-emission laser array to the line extending in the first direction, can be reduced.

Further, with the surface-emission laser array of the present invention, the plurality of surface-emission laser diode elements are disposed two-dimensionally in the first direction and in the second direction, and at least one interconnection pattern connected to at least one surface-emission laser diode element of the plural surface-emission laser diode elements disposed between a surface-emission laser diode element located in one side and another surface-emission laser diode element located in another side, is disposed between a pair of surface-emission laser diode elements aligned in the second direction. Thus, with the present invention, the interconnection pattern is not provided between the surface-emission laser diode elements aligned in the first direction but only between the surface-emission laser diode elements aligned in the second direction.

Thus, according to the present invention, the interval between the surface-emission laser diode elements in the first direction, defined as the interval of the straight lines drawn perpendicularly from the respective centers of the surface-emission laser diode elements forming the surface-emission laser array to the line extending in the first direction, can be reduced.

In another aspect, the present invention provides a surface-emission laser array comprising a plurality of surface-emission laser diode elements disposed two-dimensionally such that a plurality of straight lines drawn to a straight line extending in a first direction from respective centers of the plurality of surface-emission laser diode elements aligned in a second direction perpendicular to the first direction, are formed with generally equal interval, and wherein a plurality of surface-emission laser diode elements aligned in any of the first and second directions are disposed with an interval such that the interval is set larger in a central part of the surface-emission laser array as compared with a peripheral part of the surface-emission laser array.

In the present specification, the interval between the surface-emission laser diode elements is defined as the distance between the centers of two surface-emission laser diode elements.

Preferably, the interval between the surface-emission laser diode elements aligned in the first direction is set larger in the central part of the surface-emission laser array than in the peripheral part of the surface-emission laser array. Preferably, the interval between the plural surface-emission laser elements in the first direction is different depending on a location in the array in the first direction.

Preferably, the interval between the surface-emission laser diode elements aligned in the second direction is set larger in the central part of the surface-emission laser array than in the peripheral part of the surface-emission laser array.

Preferably, the interval between the plural surface-emission laser elements in the second direction is different in the location in the array.

Preferably, the surface-emission laser diode elements aligned in the first direction are formed with a larger interval in the central part of the surface-emission laser array than in the peripheral part and the surface-emission laser diode elements aligned in the second direction are formed with a larger interval in the central part of the surface-emission laser array than in the peripheral part Preferably, the surface-emission laser diode elements aligned in the first direction changes the interval depending on the location in the array in the first direction, and the surface-emission laser diode elements aligned in the second direction changes the interval depending on the location in the array in the second direction.

Preferably, each of the plural surface-emission laser diode elements aligned in the second direction at a first location in the first direction, is disposed between two of the surface-emission laser diode elements aligned in the second direction and adjacent with each other, at a second location adjacent to the first location in the first direction.

Preferably, the surface-emission laser array forms an optical scanning apparatus, and wherein the first direction is a sub-scanning direction and the second direction is a main scanning direction of the optical scanning apparatus.

In another aspect, the present invention provides a surface-emission laser array comprising a plurality of surface-emission laser diode elements arrayed two-dimensionally, wherein there are provided a plurality of arrays of the surface-emission laser diode elements including therein at least two surface-emission laser diode elements aligned in a row in a first direction, such that the array of the surface-emission laser diode elements is disposed in plural number in a second direction perpendicular to the first direction, the plurality of the surface-emission laser diode elements are disposed with an equal interval in the first direction, the plurality of arrays of the surface-emission laser diode elements are disposed such that an interval between two adjacent arrays is larger in a central part than in a peripheral part of the plurality of arrays of the surface-emission laser diode elements in the second direction, the number of arrays being larger than the number of the surface-emission laser diode elements included in one array.

In another aspect, the present invention provides a surface-emission laser array comprising a plurality of surface-emission laser diode elements arrayed two-dimensionally, the surface-emission laser diode elements being disposed with lower density in a central part of the surface-emission laser array as compared with a peripheral part of the surface-emission laser array.

In another aspect, the present invention provides an optical scanning apparatus scanning a surface by an optical beam, wherein the optical scanning apparatus comprises an optical source unit including therein the surface-emission laser array of the present invention as noted before, a deflector deflecting the optical beams from the optical source unit; and a scanning optical system focusing the optical beams deflected by the deflector to the surface.

In another aspect, the present invention provides an image forming apparatus comprising at least one image carrier; and the optical scanning apparatus of the present invention that scans a plurality of optical beams carrying image information over the at least one image carrier.

In another aspect, the present invention provides an image forming apparatus having the surface-emission laser array of the present invention as a writing optical source.

According to the present invention, the surface-emission laser diode elements occupying the central part of the surface-emission laser array are disposed with a larger interval as compared with the surface-emission laser diode elements disposed in the peripheral part of the surface-emission laser array. As a result, the influence of heat generated by the surface-emission laser diode elements disposed in the peripheral part of the surface-emission laser array upon the surface-emission laser diode elements in the central part is reduced even when the plural surface-emission laser diode elements are driven at the same time, and the temperature rise of the surface-emission laser diode elements at the central part of the surface-emission laser array is suppressed as compared with the case in which the plural surface-emission laser diode elements are disposed in a uniform interval in the main scanning direction and in the sub-scanning direction.

As a result, according to the present invention, it becomes possible to make the output characteristics of the surface-emission laser diode elements forming the surface-emission laser array uniform. Further, it becomes possible to increase the lifetime of the surface-emission laser array because of lowering of the temperature of the surface-emission laser diode elements that experience severest temperature rise in the surface-emission laser array.

BRIEF DESCRIPTION OF THE DRAWINGS

FIG. 23 is a schematic diagram showing the construction of an optical scanning apparatus that uses the surface-emission laser array shown in FIG. 8;

BEST MODE FOR IMPLEMENTING THE INVENTION

Figure 1:
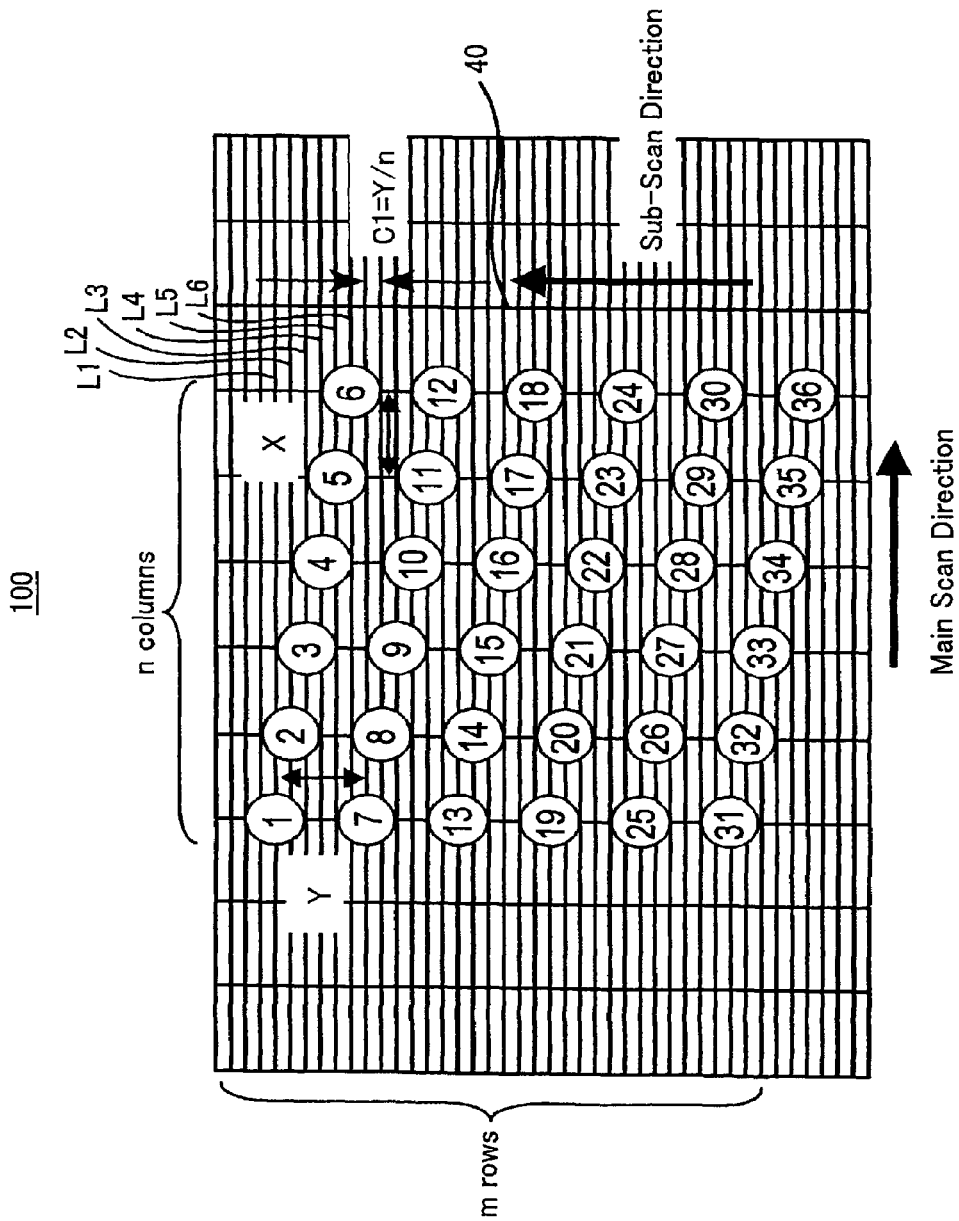
FIG. 1 is a plan view diagram of a surface-emission laser array according to Embodiment 1 of the present invention.

Hereinafter, the present invention will be described for embodiments with reference to the drawings. In the drawings, those parts corresponding to the parts are designated by the same reference numerals and the description thereof will be not repeated. In the present specification, it should be noted that "interval" represents a distance between respective centers of two surface-emission laser diode elements.

[Embodiment 1]

FIG. 1 is a plan view diagram of a surface-emission laser array according to Embodiment 1 of the present invention.

Referring to FIG. 1, the surface-emission laser array 100 of Embodiment 1 includes surface-emission laser diode elements 1-36.

The surface-emission laser elements 1-36 are disposed two-dimensionally in the form of array of six rows and six columns Thereby, the six of the surface-emission laser diode elements, 1, 7, 13, 19, and 31 or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, are aligned in the sub-scanning direction, while the six of the surface-emission laser diode elements, 1-6, or 7-12, or 13-18, or 14-24, or 25-30, or 31-36, are aligned in the main scanning direction.

Thereby, it should be noted that the six surface-emission laser diode elements, 1-6, or 7-12, or 13-18, or 14-24, or 25-30, or 31-36, aligned in the main scanning direction, are disposed with stepwise displacement in the sub-scanning direction. As a result, 36 laser beams are emitted from the 36 surface-emission laser diode elements 1-36 without causing overlapping.

Further, it should be noted that the six surface-emission laser diode elements, 1-6, or 7-12, or 13-18, or 14-24, or 25-30, or 31-36, are aligned in the main scanning direction with an interval X for two adjacent surface-emission laser diode elements.

Further, the six surface-emission laser diode elements, 1, 7, 13, 19, 25 and 31, or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, aligned in the sub-scanning direction, are disposed with an interval Y for two adjacent surface-emission laser diode elements.

The interval Y is set smaller than the interval X.

With this construction, it should be noted that six straight lines L1-L6 drawn perpendicularly to a straight line 40 extending in the sub-scanning direction from respective centers of the six surface-emission laser diode elements 1-6, which are aligned in the main scanning direction, are formed with an equal interval $C_1$ in the sub-scanning direction, wherein the interval $C_1$ is determined as $C_1 = Y/6$.

Likewise, the sixth straight lines drawn perpendicularly to the straight line 40 from the respective centers of the six surface-emission laser diode elements, 7-12, 13-18, 19-24, 25-30, and 31-36, which are also aligned in the main-scanning direction, are formed with an equal interval equal to the interval $C_1$ in the sub-scanning direction.

Figure 2:
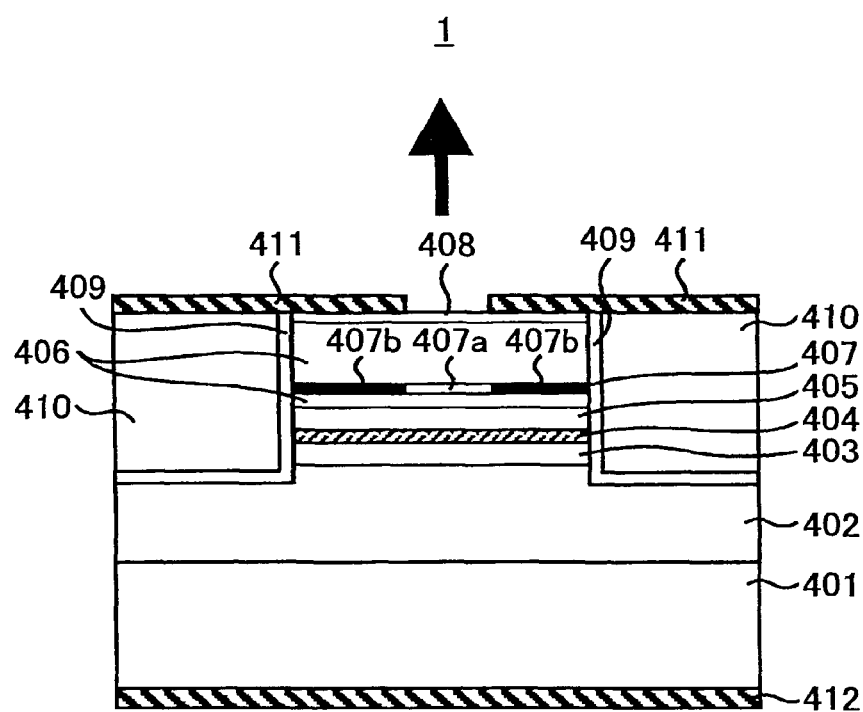
FIG. 2 is a schematic cross-sectional diagram of the surface-emission laser diode element shown in FIG. 1.

FIG. 2 is a schematic cross-sectional diagram of the surface-emission laser diode element shown in FIG. 1.

Referring to FIG. 2, the surface-emission laser diode element 1 comprises a substrate 401, reflection layers 402 and 406, cavity spacer layers 403 and 405, an active layer 404, a selective oxidation layer 407, a contact layer 408, an $SiO_2$ layer 409, an insulating resin layer 410, a p-side electrode 411, and an n-side electrode 412.

The substrate 401 is formed of GaAs of n-type (n-GaAs). The reflection layer 402 is formed by repeating the pair of n-$Al_{0.9}Ga_{0.1}$As/n-$Al_{0.3}Ga_{0.7}$As as the unit of repetition and has a structure of [n-$Al_{0.9}Ga_{0.1}$As/n-$Al_{0.3}Ga_{0.7}$As] repeated for 40.5 times, wherein the reflection layer 402 is formed on one principal surface of the substrate 401. Thereby, each of the n-$Al_{0.9}Ga_{0.1}$As layer and the n-$Al_{0.3}Ga_{0.7}$As layer has a thickness set equal to $\lambda/4n$ (n being the refractive index of each semiconductor layer), wherein $\lambda$ represents the oscillation wavelength of the surface-emission laser diode element 1.

The cavity spacer layer 403 is formed of an undoped $Al_{0.6}Ga_{0.4}$As layer and is formed on the reflection layer 402. The active layer 54 has a quantum well structure that includes therein a quantum well layer of $Al_{0.12}Ga_{0.88}$As and a barrier layer of $Al_{0.3}Ga_{0.7}$As and is formed on the cavity spacer layer 403.

The cavity spacer layer 405 is formed of an undoped $Al_{0.6}Ga_{0.4}$As layer and is formed on the active layer 404. The reflection layer 406 is formed by repeating the pair of p-$Al_{0.9}Ga_{0.1}$As/p-$Al_{0.3}Ga_{0.7}$As as the unit of repetition and has a structure of [p-$Al_{0.9}Ga_{0.1}$As/n-$Al_{0.3}Ga_{0.7}$As] repeated for 24 times, wherein the reflection layer 406 is formed on the cavity spacer layer 405. Thereby, each of the p-$Al_{0.9}Ga_{0.1}$As layer and the p-$Al_{0.3}Ga_{0.7}$As layer has a thickness set equal to $\lambda/4n$ (n being the refractive index of each semiconductor layer).

The selective oxidation layer 407 is formed of p-AlAs and is provided inside the reflection layer 406. Thereby, it should be noted that the selective oxidation layer 407 includes a non-oxidized region 407a and an oxidized region 407b and has a thickness of 20 nm.

The contact layer 408 is formed of p-GaAs and is formed on the reflection layer 406. The $SiO_2$ layer 409 is formed so as to cover a part of the principal surface of the reflection layer 402, and the edge surfaces of the cavity spacer layer 403, the active layer 404, the cavity spacer layer 405, the reflection layer 406, the selective oxidation layer 407 and the contact layer 408.

The insulation resin layer 410 is formed adjacent to the $SiO_2$ layer 409. The p-side electrode 411 is formed on a part of the contact layer 408 and the insulating resin layer 410. The n-side electrode 412 is formed on a backside of the substrate 401.

Each of the reflection layer s 402 and 406 constitute a semiconductor distributed Bragg reflector that confines the oscillating light formed in the active layer 404 into the active layer 404 as a result of Bragg multiple reflection.

Further, the oxidized region 407b has a refractive index smaller than the refractive index of the non-oxidized region 407a. Thereby, the oxidized region 407b constitutes a current confinement part that confines the electric current injected from the p-side electrode 411 to flow to the active layer 404 exclusively through the non-oxidized region 407a and further works to confine the oscillation light formed in the active layer 404 within the non-oxidized region 407a. With this, the surface-emission laser diode element 1 performs laser oscillation with low threshold current.

Figure 3:
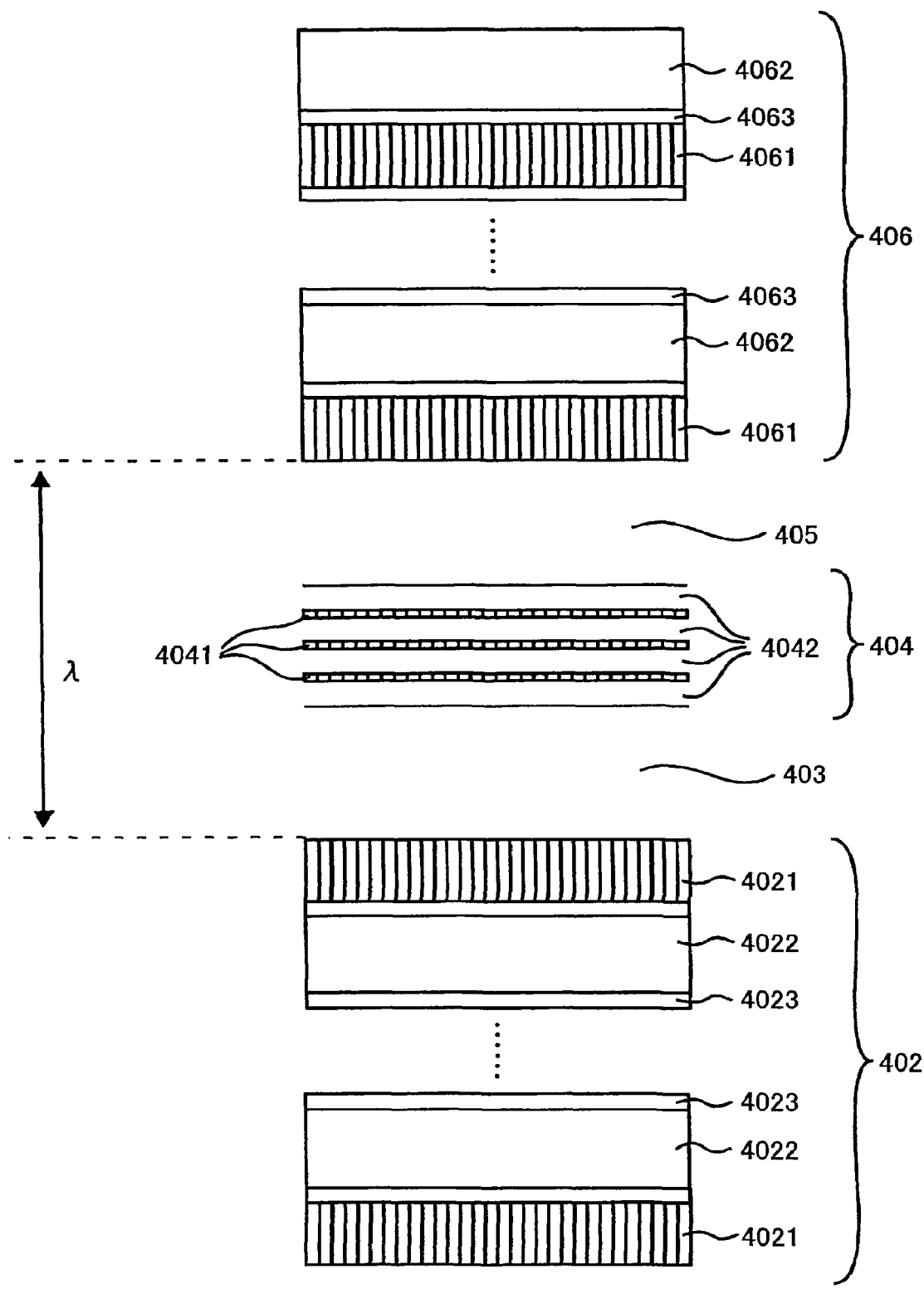
FIG. 3 is a cross-sectional diagram showing a part of the surface-emission laser diode element of FIG. 2 in the vicinity of an active layer thereof.

FIG. 3 is a cross-sectional diagram showing a part of the surface-emission laser diode element 1 of FIG. 2 in the vicinity of the active layer 404.

Referring g to FIG. 3, the reflection layer 402 includes a low-refractive index layer 4021, a high refractive index layer 4022 and a compositional gradation layer 4023. The low-refractive index layer 4021 is formed of n-$Al_{0.9}Ga_{0.1}As$, while the high refractive index layer 4022 is formed of n-$Al_{0.3}Ga_{0.7}As$. On the other hand, the compositional gradation layer 4023 is formed of n-AlGaAs in which there is a gradual change of Al content from any of the low refractive index layer 4021 and the high refractive index layer 4022 to the other of the low refractive index layer 4021 and the high refractive index layer 4022. Further, the low refractive index layer 4021 makes a contact with the cavity space layer 403.

The reflection layer 406 includes a low refractive index layer 4061, a high refractive index layer 4062 and a compositional gradation layer 4063. The low-refractive index layer 4061 is formed of p-$Al_{0.9}Ga_{0.1}As$, while the high refractive index layer 4062 is formed of p-$Al_{0.3}Ga_{0.1}As$. On the other hand, the compositional gradation layer 4063 is formed of p-AlGaAs in which there is a gradual change of Al content from any of the low refractive index layer 4061 and the high refractive index layer 4062 to the other of the low refractive index layer 4061 and the high refractive index layer 4062. Further, the low refractive index layer 4061 makes a contact with the cavity space layer 405.

The active layer 404 is formed of three quantum well layer s 4041 having a composition of Al0.12Ga0.88As and four barrier layers 4042 each having a composition of $Al_{0.3}Ga_{0.7}As$, wherein the three well layers 4041 and the four barrier layers 4042 are stacked alternately. Further, the low refractive index layer 4042 makes a contact with the cavity space layers 403 and 405.

In the surface-emission layer diode element 1, the cavity spacer layers 403 and 405 form a resonator together with the active layer 404, wherein the thickness of the resonator in the direction perpendicular to the substrate 401 is set equal to one wavelength (=λ) of the surface-emission laser diode element 1. In other words, the cavity spacer layers 403 and 405 form a one-wavelength resonator together with the active layer 404.

Further, it should be noted that each of the surface-emission laser diode elements 2-36 shown in FIG. 1 has a construction identical to that of the surface-emission laser diode element 1 of FIGS. 2 and 3.

FIGS. 4A-4H are diagrams showing the fabrication process of the surface-emission laser array 100 shown in FIG. 1. In the explanation of FIGS. 4A-4H, the fabrication process of the surface-emission laser array 100 will be explained by referring to the step of fabricating one of the 36 surface-emission laser diode elements 1-36 shown in FIG. 1.

Figure 4A:
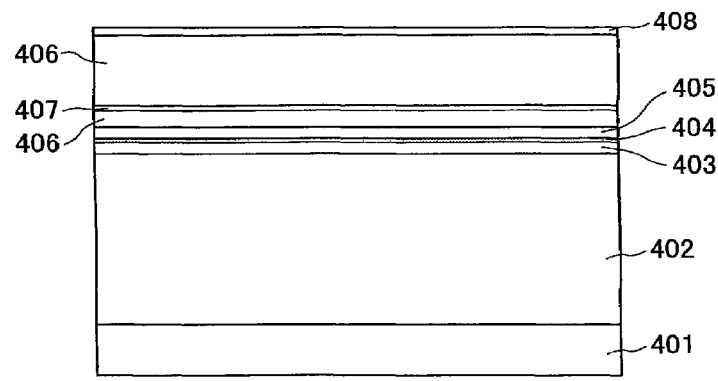
FIGS. 4A-4H are diagrams showing the fabrication process of the surface-emission laser array shown in FIG. 1.

Referring to FIG. 4A, the reflection layer 402, the cavity spacer layer 403, the active layer 404, the cavity spacer layer 405, the selective oxidation layer 407 and the contact layer 408 are stacked consecutively on the substrate by an MOCVD (metal organic chemical vapor deposition) process upon commencement of the series of processes.

In this case, the n-$Al_{0.9}Ga_{0.1}As$ layer and the n-$Al_{0.3}Ga_{0.7}As$ layer of the reflection layer 402 are formed while using trimethyl aluminum (TMA), trimethyl gallium (TMG), arsine ($AsH_3$) and hydrogen selenide ($H_2Se$) for the source material. Further, the $Al_{06}Ga_{0.4}As$ layer of the cavity spacer layer 403 is formed while using trimethyl aluminum (TMA), trimethyl gallium (TMG) and arsine ($AsH_3$) for the source material.

Further, the $Al_{0.12}Ga_{0.88}As/Al_{0.3}Ga_{0.7}As$ structure of the active layer 404 is formed while using trimethyl aluminum (TMA), trimethyl gallium (TMG) and arsine ($AsH_3$) for the source material.

Further, the $Al_{0.6}Ga_{0.4}As$ layer of the cavity spacer layer 405 is formed while using trimethyl aluminum (TMA), trimethyl gallium (TMG) and arsine ($AsH_3$) as the source material.

Further, the p-$Al_{0.9}Ga_{0.1}As$/p-$Al_{0.3}Ga_{0.7}As$ structure of the reflection layer 406 is formed while using trimethyl aluminum (TMA), trimethyl gallium (TMG), arsine ($AsH_3$) and carbon tetrabromide ($CBr_4$) for the source material. Alternatively, it is possible to use dimethylzinc (DMZn) in place of carbon tetrabromide ($CBr_4$).

Further, the p-AlAs lawyer of the selective oxidation layer 407 is formed while using trimethyl aluminum (TMA), arsine ($AsH_3$) and carbon tetrabromide ($CBr_4$) for the source material, and the p-GaAs layer of the contact layer 58 is formed while using trimethyl gallium (TMG), arsine ($AsH_3$) and carbon tetrabromide ($CBr_4$) for the source material. In this case, too, it is possible to use dimethylzinc (DMZn) in place of carbon tetrabromide ($CBr_4$).

Figure 4B:
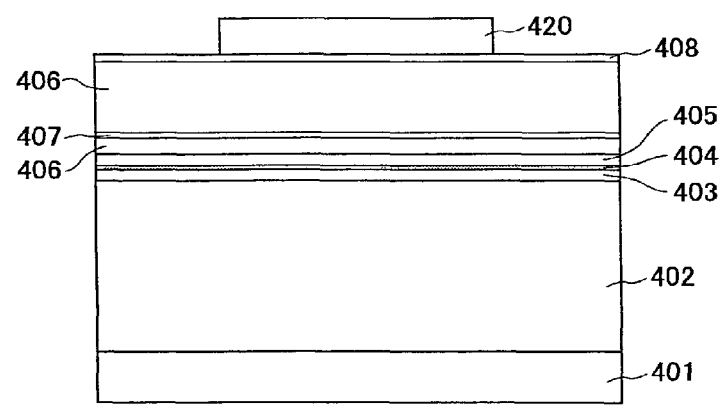

Thereafter, a resist film is formed on the contact layer 408 in the step of FIG. 4B, and a resist pattern 420 is formed on the contact layer 408 while using a photolithographic process.

Figure 4C:
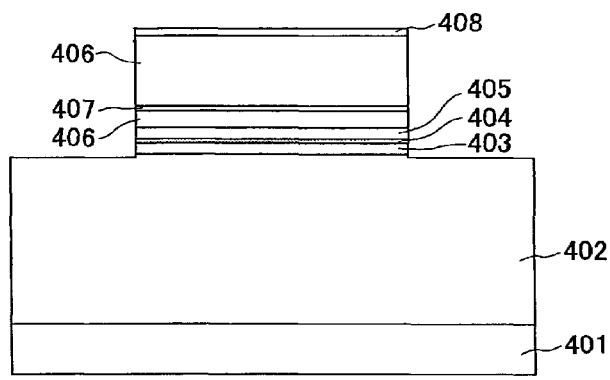

Upon formation of the resist pattern 420, the reflection layer 402, the cavity spacer layer 403, the active layer 404, the cavity space layer 405, the reflection layer 406, the selective oxidation layer 407 and the contact layer 408 are subjected to a dry etching process in the step of FIG. 4C at the peripheral parts thereof while using the resist pattern 420 as a mask. Thereafter, the resist pattern 420 is removed.

Figure 4D:
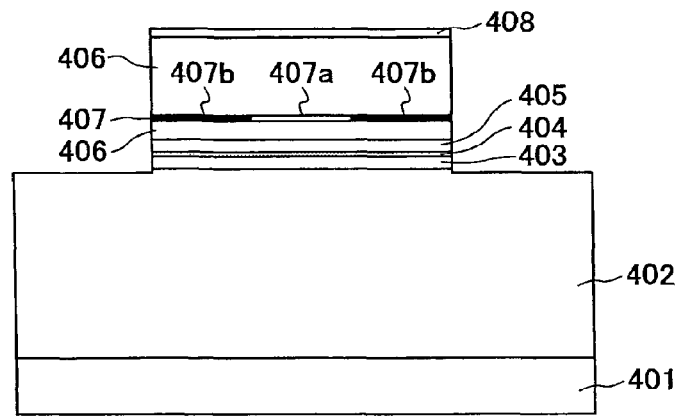

Next, after the step of FIG. 4C, the step of FIG. 4D is conducted in which the structure thus obtained is heated to 425° C. in the ambient formed by bubbling of water of 85° C. with a nitrogen gas. With this, oxidation proceeds in the selective oxidation layer 407 from the peripheral part thereof to the central part, and with this, the non-oxidized layer 407a and the oxidized layer 407b are formed in the selective oxidation layer 407.

Figure 4E:
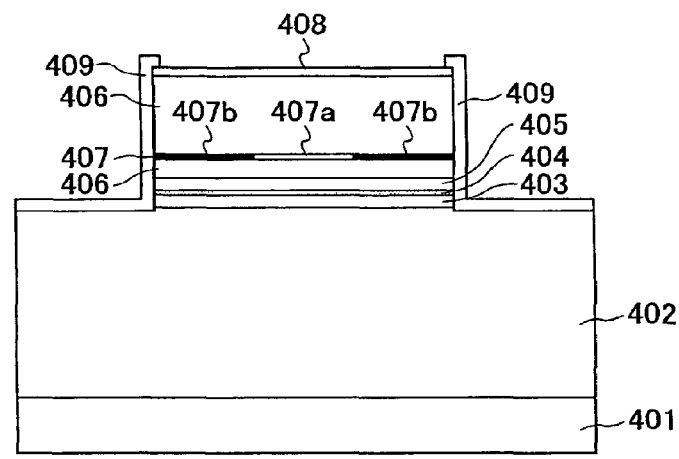

Thereafter, in the step of FIG. 4E, the $SiO_2$ layer 409 is formed on the entire surface of the structure obtained with the step of FIG. 4D by using a CVD (chemical vapor deposition) process. Thereafter, the $SiO_2$ film is removed by a photolithographic process from the optical beam exit region and the surrounding region.

Figure 4F:
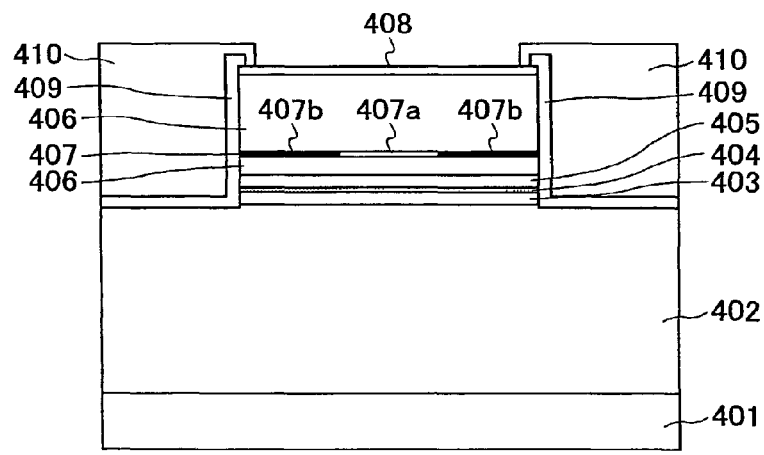

Further, in the step of FIG. 4F, the insulating resin layer 410 is applied over the entire structure by a spin coating process, and the insulating resin layer 410 is removed from the region serving for the optical beam exit.

Figure 4G:
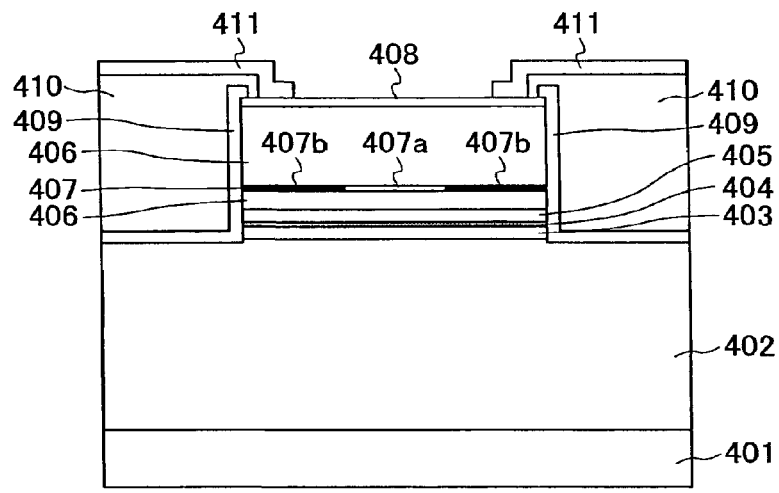
Figure 4H:
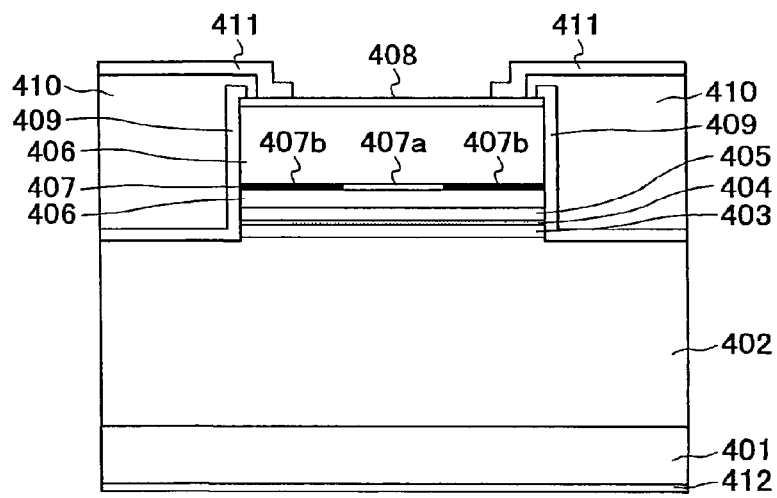

Next, in the step of FIG. 4G, a resist pattern of a predetermined size is formed after the formation of the insulating resin layer 410, and a p-side electrode material is deposited on the entire surface of the structure thus obtained by way of evaporation deposition process. Further, by lifting off the p-side electrode material on the resist pattern, the p-side electrode 411 is formed. Further, in the step of FIG. 4H, the back surface of the substrate 401 is polished and the n-side electrode 412 is formed on the back side thus polished. Thereafter, ohmic contact is formed for each of the p-side electrode 411 and the n-side electrode 412 by applying an annealing process. With this, the surface-emission laser array 100 is completed.

While FIGS. 4B and 4C represent dry etching process for forming one surface-laser diode element, it should be noted that the dry etching process is conducted for all of the 36 surface-emission laser diode elements 1-36 concurrently in the steps of FIGS. 4B and 4C. In this case, it should be noted that the resist pattern for forming the 36 surface-emission laser diode elements 1-36 simultaneously is provided by using a photomask adapted for the array of the 36 surface-emission laser elements 1-36 to be formed as shown in FIG. 1. Thus, the resist pattern used for forming the 36 surface-emission laser diode elements 1-36 simultaneously is formed by using a photomask designed such that the intervals X and Y satisfy the relationship Y<X and such that the six straight lines drawn perpendicularly to the straight line 40 from the respective centers of the six surface-emission laser diode elements, 1-6 or 7-12 or 13-18 or 19-24 or 25-30 or 31-36, are formed with the uniform interval C1.

The surface-emission laser array 100 of the present embodiment has the feature that the interval Y between the surface-emission laser diode elements aligned in the sub-scanning direction is set smaller than the interval Y between the surface-emission laser diode elements aligned in the main scanning direction. With this, it becomes possible to reduce the interval C1 (=Y/6) as compared with the case of setting the interval Y to be larger than the interval X, while such a construction is advantageous for high-density recording.

While it is possible to narrow the interval between the surface-emission laser diode elements aligned in the sub-scanning direction and the interval of the surface-emission laser diode elements aligned in the main scanning direction at the same time, it is preferable to maintain relatively large interval in the main scanning direction for high-density recording, in view of the need of reducing thermal interference between the surface-emission laser diode elements and in view of the need of securing sufficient space for providing interconnection patterns for the respective surface-emission laser diode elements.

In Embodiment 1, the interval X is set for example to 30 µm, while the interval Y is set to 24 µm. As a result, the interval $C_1$ is set to Y/6 (=24/6=4 µm).

In the case of disposing the surface-emission laser diode elements to align in the sub-scanning direction and in the main scanning direction with the same number, it has been practiced in the art to increase the interval between the surface-emission laser diode elements aligned in the sub-scanning direction over the interval between the surface-emission laser diode elements aligned in the main scanning direction. Contrary to the foregoing, by decreasing the interval between the surface-emission laser diode elements aligned in the sub-scanning direction to be smaller than the interval between the surface-emission laser diode elements aligned in the main scanning direction as in the case of the present invention, it becomes possible to reduce the interval C1 as compared with the conventional case and recording with higher density becomes possible.

Figure 5:
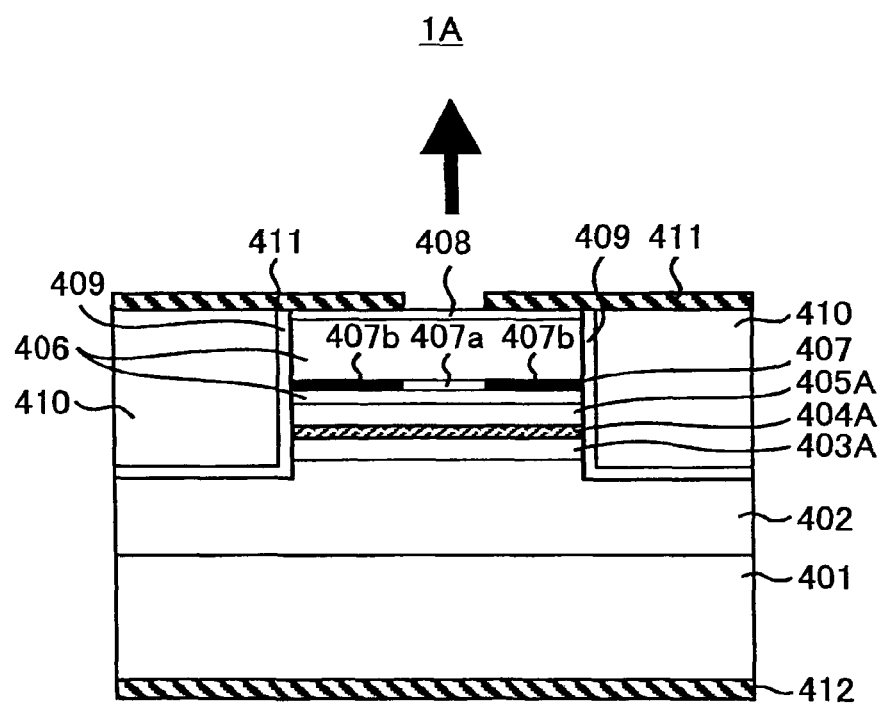
FIG. 5 is another schematic cross-sectional diagram of the surface-emission laser diode element shown in FIG. 1.

FIG. 5 is another schematic cross-sectional diagram of the surface-emission laser diode elements 1-36 shown in FIG. 1.

Referring to FIG. 5, the surface-emission laser diode element 1A has a construction similar to that of the surface-emission laser diode element 1 noted before, except that the cavity spacer layers 403 and 405 of the surface-emission laser diode element 1 shown in FIG. 2 are replaced with cavity spacer layers 403A and 405A, respectively, and that the active layer 404 is replaced with an active layer 404A.

The cavity spacer layer 403A is formed of a layer of $Al_{0.7}Ga_{0.3}As$ formed on the reflection layer 402. The active layer 404A has a quantum well structure formed of quantum well layers of GaINPAs having a composition causing accumulation of a compressive strain and barrier layers of Ga0.6In0.4P accumulating therein a tensile strain, wherein the active layer 404A is formed on the cavity spacer layer 403A. Further, the cavity spacer layer 405A is formed of a layer of $(Al_{0.7}Ga_{0.3})_{0.5}In_{0.5}P$ and is formed on the active layer 404A. The surface-emission laser diode element 1A produces a laser beam of 780 nm upon oscillation.

Figure 6:
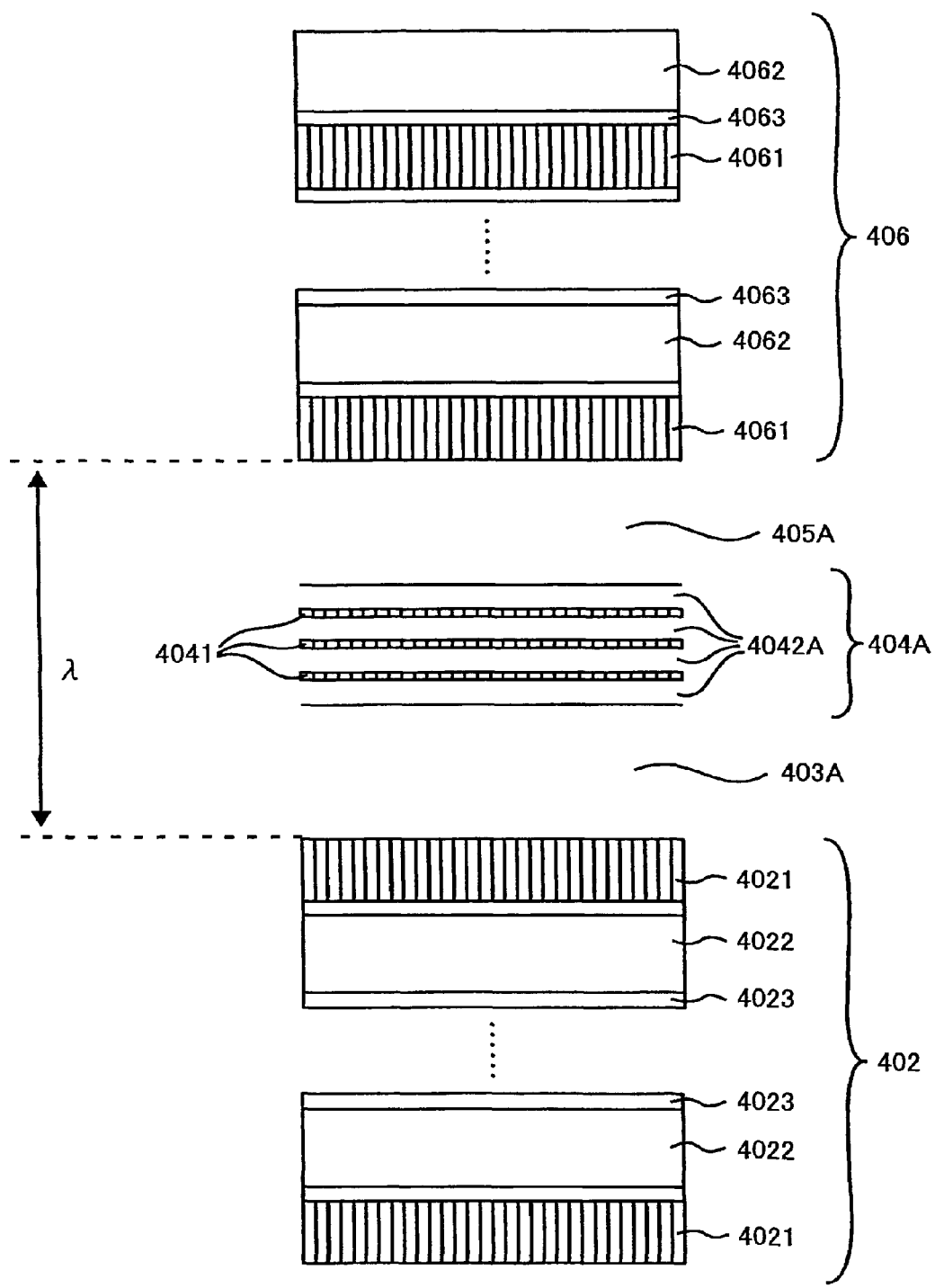
FIG. 6 is a cross-sectional diagram showing a part of the surface-emission laser diode element of FIG. 7 in the vicinity of an active layer thereof.

FIG. 6 is a cross-sectional diagram showing a part of the surface-emission laser diode element 1A of FIG. 5 in the vicinity of the active layer 404A.

Referring to FIG. 6, it can be seen that the low-refractive index layer 4021 of the reflection layer 402 is formed in contact with the cavity spacer layer 403A and the low refractive index layer 4061 of the reflection layer 406 is formed in contact with the cavity spacer layer 405A.

The active layer 404A is formed of a quantum well structure in which three quantum well layers 4041A each of GaInPAs and four barrier layers 4042A each of $Ga_{0.6}In_{0.4}P$ are stacked alternately. Further, the barrier layer 4042A makes a contact with the cavity space layers 403A and 405A.

Further, in the surface-emission layer diode element 1A, the cavity spacer layers 403A and 405A form a resonator together with the active layer 404A, wherein the thickness of the resonator in the direction perpendicular to the substrate 401 is set equal to the laser oscillation wavelength (=λ) of the surface-emission laser diode element 1A. Thus, the cavity spacer layers 403A and 405A form a one-wavelength resonator together with the active layer 404A.

Table 1 below shows a bandgap difference ΔEg between the cavity spacer layer 403A or 405A and the quantum well layer 4041A and further the bandgap difference ΔEg between the barrier layer 4042A and the quantum well layer 4041A, for the case in which the cavity spacer layer 403A or 405A and the well layer 4041A of the active layer 404A form an AlGaAs/AlGaAs structure and also for the case in which the cavity spacer layer 403A or 405A and the well layer 4041A of the active layer 404A form an AlGaInP/GaInPAs structure.

TABLE 1

| | | λ | |
|---|---|---|---|
| | | 780 nm | 850 nm (ref) |
| Spacer/QW spacer | | AlGaAs/AlGaAs<br>A10.6Ga0.4As<br>Eg = 2.0226 eV | AlGaInP/GaInPAs<br>(AlxGa1 − x) 0.5In0.5P<br>Eg (x = 0.7) = 2.324 eV | AlGaAs/GaAs<br>A10.6Ga0.4As<br>Eg = 2.0226 eV |
| active | QW | A10.12Ga0.88As<br>Eg = 1.5567 eV | GaInPAs (compressive)<br>Eg = 1.5567 eV | GaAs<br>Eg = 1.42 eV |
| | barrier | A10.3Ga0.7As<br>Eg = 1.78552 eV | GaxIn1 − xP (tensile)<br>Eg (X = 0.6) = 2.02 eV | A10.3Ga0.7As<br>Eg = 1.78552 eV |
| ΔEg (spacer − QW) | | 465.9 meV | 767.3 meV | 602.6 meV |
| ΔEg (barrier − QW) | | 228.8 meV | 463.3 meV | 365.5 meV |

Each of the surface-emission laser diode elements 1-36 shown in FIG. 1 may be formed of the surface-emission laser diode element 1A shown in FIG. 5.

Referring to Table 1, it can be seen that the bandgap difference ΔEg between the cavity spacer layer 403A or 405A and the quantum well layer 4041A becomes 465.9 meV and the bandgap difference ΔEg between the barrier layer 4042A and the quantum well layer 4041A becomes 228.8 meV, in the case the cavity spacer layers 403A and 405A are formed of AlGaAs and the quantum well layer 4041A of the active layer 404A is formed of AlGaAs and the surface-emission laser diode element has the oscillation wavelength of 780 nm.

Further, it can be seen that the bandgap difference ΔEg between the cavity spacer layer 403A or 405A and the quantum well layer 4041A becomes 602.6 meV and the bandgap difference ΔEg between the barrier layer 4042A and the quantum well layer 4041A becomes 365.5 meV, in the case the cavity spacer layers 403A and 405A are formed of AlGaAs and the quantum well layer 4041A of the active layer 404A is formed of GaAs and the surface-emission laser diode element has the oscillation wavelength of 850 nm.

On the other hand, it can be seen also that the bandgap difference ΔEg between the cavity spacer layer 403A or 405A and the quantum well layer 4041A becomes 767.3 meV and the bandgap difference ΔEg between the barrier layer 4042A and the quantum well layer 4041A becomes 463, 3 meV, in the case the cavity spacer layers 403A and 405A are formed of AlGaInP and the quantum well layer 4041A of the active layer 404A is formed of GaInPAs and the surface-emission laser diode element has the oscillation wavelength of 780 nm.

It should be noted that the surface-emission laser diode element 1A is fabricated according to the process shown in FIGS. 4A-4H. In this case, the $(Al_{0.7}Ga_{0.3})_{0.5}In_{0.5}P$ layer constituting the cavity spacer layers 403A and 405A is formed by using trimethyl aluminum (TMA), trimethyl gallium (TMG), trimethyl indium (TMI) and phosphine ($PH_3$) for the source, the GaInPAs layer constituting the quantum well layer 4041A of the active layer 404A is formed by using trimethyl gallium (TMG), trimethyl indium (TMI), phosphine ($PH_3$) and arsine ($AsH_3$) for the source, and the $Ga_{0.6}In_{0.4}P$ layer constituting the barrier layer 4042A of the active layer 404A is formed by using trimethyl gallium (TMG), trimethyl indium (TMI) and phosphine ($PH_3$) for the source.

Thus, by constructing the spacer layers 403A and 405A with AlGaInP and the quantum well layer 4041A of the active layer 404A with GaInPAs, it becomes possible to significantly increase the bandgap difference ΔEg between the cavity spacer layer 403A or 405A and the quantum well layer 4041A and further the bandgap difference ΔEg between the barrier layer 4042A and the quantum well layer 4041A as compared with before. As a result, the effect of carrier confinement into the quantum well layer 41A is enhanced significantly, and the surface-emission laser diode element 1A can oscillate at lower threshold and can emit the laser beam with higher output power.

Further, because the active layer 404A contains GaInPAs accumulating therein compressive strain, there is caused band separation between heavy holes and light holes, while this leads to increase of gain. With this, the surface-emission laser diode element provides high gain and it becomes possible to obtain laser oscillation at low threshold with high output power. Here, it should be noted that this effect cannot be attained with the surface-emission laser diode element of 780 nm or 850 nm that uses AlGaAs system materials, which have a lattice constant generally equal to that of the GaAs substrate.

Further, as a result of the improvement of carrier confinement, and as a result of the improvement of gain attained by the use of the strained quantum well structure for the active layer 54A, there is attained a decrease of threshold current for the surface-emission laser diode element 1A, and it becomes possible to reduce the reflectivity of the reflection layer 406 provided at the exist side of the laser beam, while this allows further increase of the output power.

With further increase of gain, it becomes possible to suppress the drop of optical output caused by temperature rise of the surface-emission laser diode element 1A, and it becomes possible to reduce the interval between the elements further in the surface-emission laser array 100.

Because the active layer 404A is formed of a material free from Al, it becomes possible to suppress the formation of non-optical recombination center by suppressing incorporation of oxygen into such layers, while this leads to increase of lifetime of the surface-emission laser diode element. As a result, it becomes possible to reuse the writing unit or optical source unit.

In the case the surface-emission laser diode element 1A is used for the surface-emission laser diode elements 1-36 shown in FIG. 1, the interval between the surface-emission laser diode elements aligned in the sub-scanning direction is again set smaller than the interval between the surface-emission laser diode elements aligned in the main scanning direction, and it becomes possible to reduce the interval C1 as compared with the conventional case, while this enables high density recording.

Figure 7:
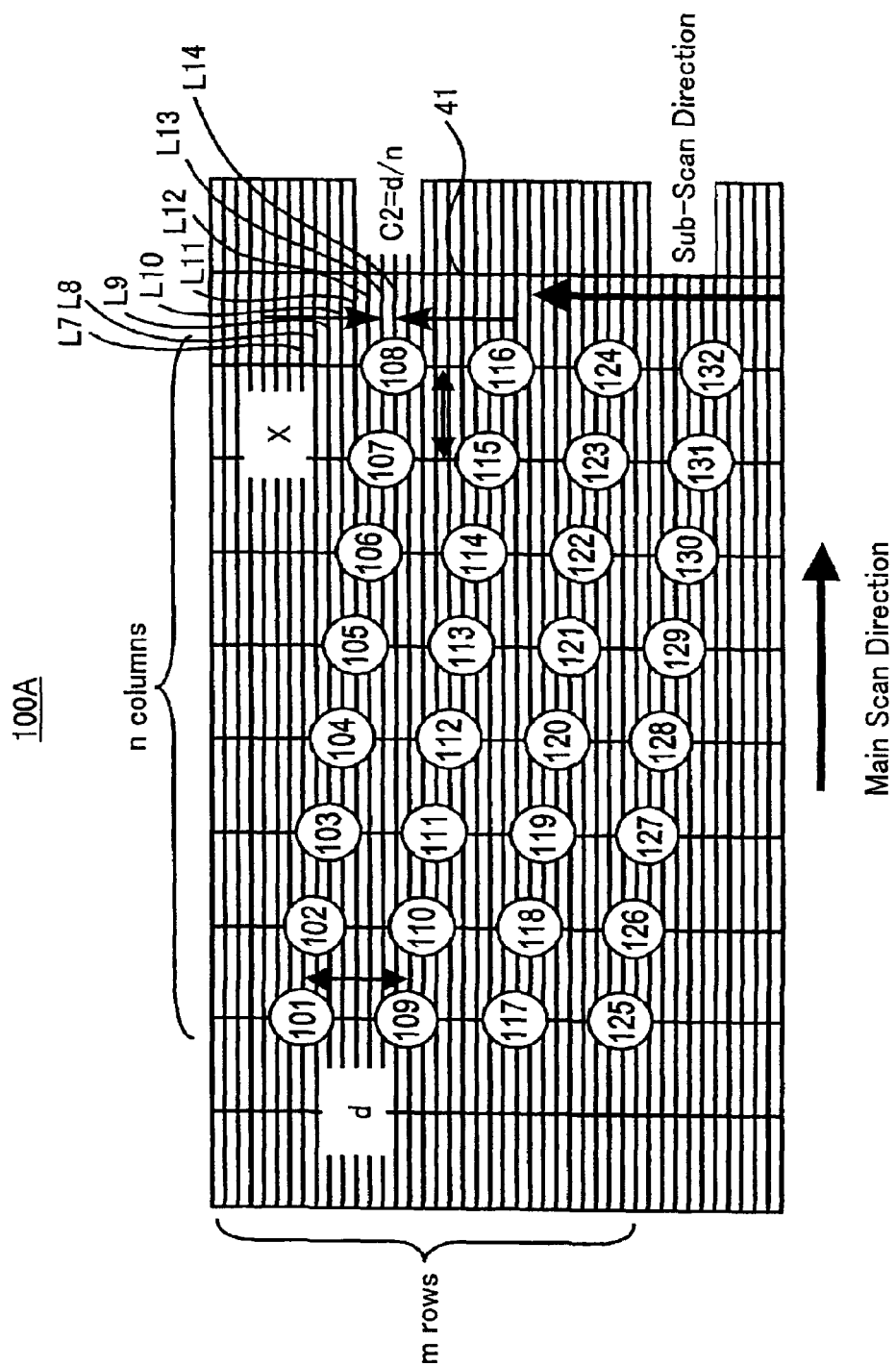
FIG. 7 is another plan view diagram of the surface-emission laser array according to Embodiment 1 of the present invention.

FIG. 7 is another plan view diagram of the surface-emission laser array according to Embodiment 1 of the present invention. Here, the surface-emission laser array of Embodiment 1 may be a surface-emission laser array 100A shown in FIG. 7.

Referring to FIG. 7, the surface-emission laser array 100A includes surface-emission laser diode elements 101-132.

The surface-emission laser elements 101-132 are disposed two-dimensionally in the form of array of four rows and eight columns Thereby, the four of the surface-emission laser diode elements, 101, 109, 117 and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108, 116, 124 and 132, are aligned in the sub-scanning direction, while the eight of the surface-emission laser diode elements, 101-108, or 109-116, or 117-124, or 125-132, are aligned in the main scanning direction.

Thereby, it should be noted that the eight surface-emission laser diode elements, 101-108, or 109-116, or 117-124, or 125-132, aligned in the main scanning direction, are disposed with stepwise displacement in the sub-scanning direction. As a result, 32 laser beams are emitted from the 32 surface-emission laser diode elements 101-132 without causing overlapping.

Further, it should be noted that the eight surface-emission laser diode elements, 101-108, or 109-116, or 117-124, or 125-132, are aligned in the main scanning direction with an interval X for two adjacent surface-emission laser diode elements.

Thereby, the interval between two adjacent surface-emission laser diode elements included in the array of four surface-emission laser diode elements, 101, 109, 117 and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108, 116, 124 and 132, which are aligned in the sub-scanning direction, is set to an interval d.

The interval d is set smaller than the interval X.

With this construction, it should be noted that eight straight lines L7-L14 drawn perpendicularly to the straight line 41 extending in the sub-scanning direction from respective centers of the eight surface-emission laser diode elements 101-108, which are aligned in the main scanning direction, are formed with an equal interval $C_2$ in the sub-scanning direction, wherein the interval C2 is determined as $C_2=d/8$.

Likewise, the eight straight lines drawn perpendicularly to the straight line 41 from the respective centers of the eight surface-emission laser diode elements, 109-116, 117-124, 125-132 also aligned in the main-scanning direction, are formed with an equal interval equal to the interval $C_2$ in the sub-scanning direction.

In Embodiment 1, the interval d is set for example to 24 μm, while the interval X is set to 30 μm. As a result, the interval $C_2$ becomes equal to 24/8=3 μm.

In the conventional surface-emission laser array in which there are disposed 32 surface-emission laser diode elements in a two-dimensional array of eight rows and four columns, the interval $C_2$ becomes equal to 6 μm (=24/6).

Thus, by setting the interval d of the surface-emission laser diode elements aligned in the sub-scanning direction to be smaller than the interval X of the surface-emission laser diode elements aligned in the main scanning direction, and by reducing the number of the surface-emission laser diode elements aligned in the sub-scanning direction to be smaller than the number of the surface-emission laser diode elements aligned in the main scanning direction, it becomes possible to reduce the interval $C_2$ from the conventional value of 6 μm to 3 μm. As a result, it becomes possible to achieve high density optical writing while using the surface-emission laser array 100A.

Each of the surface-emission laser diode elements 101-132 shown in FIG. 7 is formed of the surface-emission laser diode element 1 shown in FIGS. 2 and 3 or the surface-emission laser diode element 1A shown in FIGS. 5 and 6.

Figure 8:
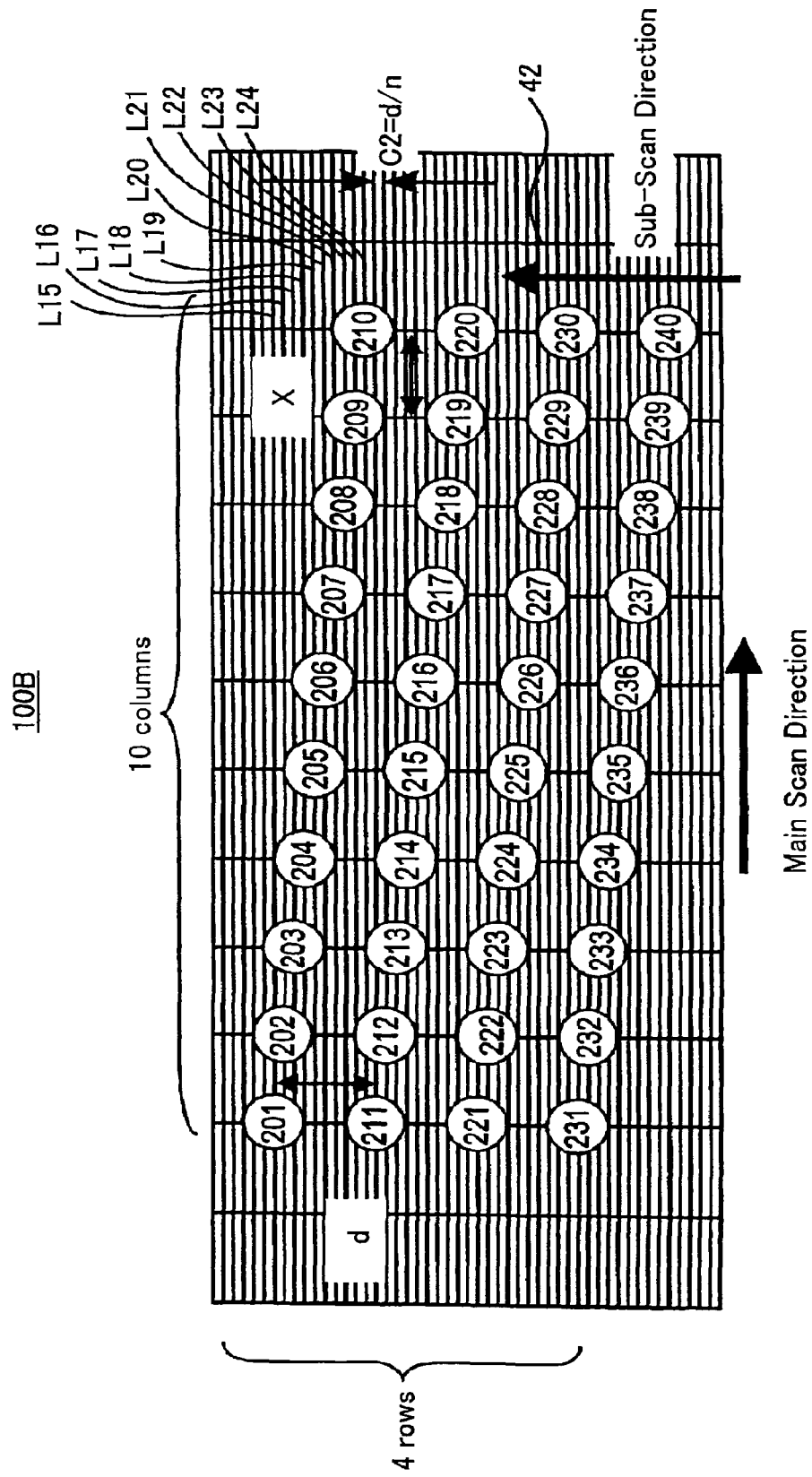
FIG. 8 is another plan view diagram of the surface-emission laser array according to Embodiment 1 of the present invention.

FIG. 8 is yet another plan view diagram of the surface-emission laser array according to Embodiment 1 of the present invention. Here, the surface-emission laser array of Embodiment 1 may be a surface-emission laser array 100B shown in FIG. 8.

Referring to FIG. 8, the surface-emission laser array 100B includes surface-emission laser diode elements 201-240.

The surface-emission laser elements 201-240 are disposed two-dimensionally in the form of array of four rows and ten columns Thereby, the four surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, or 209, 219, 229 and 239, or 210, 220, 230 and 240, are aligned in the sub-scanning direction, while the ten surface-emission laser diode elements, 201-210, or 211-220, or 221-230, or 231-240, are aligned in the main scanning direction.

Thereby, it should be noted that the ten surface-emission laser diode elements, 201-210, or 211-220, or 221-230, or 231-240, aligned in the main scanning direction, are disposed with stepwise displacement in the sub-scanning direction. As a result, 40 laser beams are emitted from the 40 surface-emission laser diode elements 201-240 without causing overlapping.

Further, it should be noted that the ten surface-emission laser diode elements, 201-210, or 211-220, or 221-230, or 231-240, are aligned in the main scanning direction with an interval X for two adjacent surface-emission laser diode elements.

Further, in the four surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, or 209, 219, 229 and 239, or 219, 229, 239 and 240, aligned in the sub-scanning direction, adjacent 2 surface-emission laser diode elements are disposed with the interval d.

The interval d is set smaller than the interval X.

With this construction, it should be noted that ten straight lines L15-L24 drawn perpendicularly to the straight line 42 extending in the sub-scanning direction from respective centers of the ten surface-emission laser diode elements 201-210, which are aligned in the main scanning direction, are formed with an equal interval $C_2$ in the sub-scanning direction, wherein the interval $C_2$ is determined as $C_2=d/10$.

Likewise, the ten straight lines, drawn perpendicularly to the straight line 42 from the respective centers of the ten surface-emission laser diode elements, 211-220, 221-230, 231-240 also aligned in the main-scanning direction, are formed with an equal interval equal to the interval $C_2$ in the sub-scanning direction.

In Embodiment 1, the interval d is set for example to 24 μm, while the interval X is set to 30 μm. As a result, the interval $C_2$ becomes equal to 24/10=2.4 μm. Thus, it becomes possible to reduce the interval $C_2$ from 3 μm to 2.4 μm by increasing the number of the surface-emission laser diode elements aligned in the main scanning direction from eight (see FIG. 7) to ten. As a result, it becomes possible to achieve high density optical writing while using the surface-emission laser array 100B.

Each of the surface-emission laser diode elements 201-240 shown in FIG. 8 is formed of the surface-emission laser diode element 1 shown in FIGS. 2 and 3 or the surface-emission laser diode element 1A shown in FIGS. 5 and 6.

Figure 9:
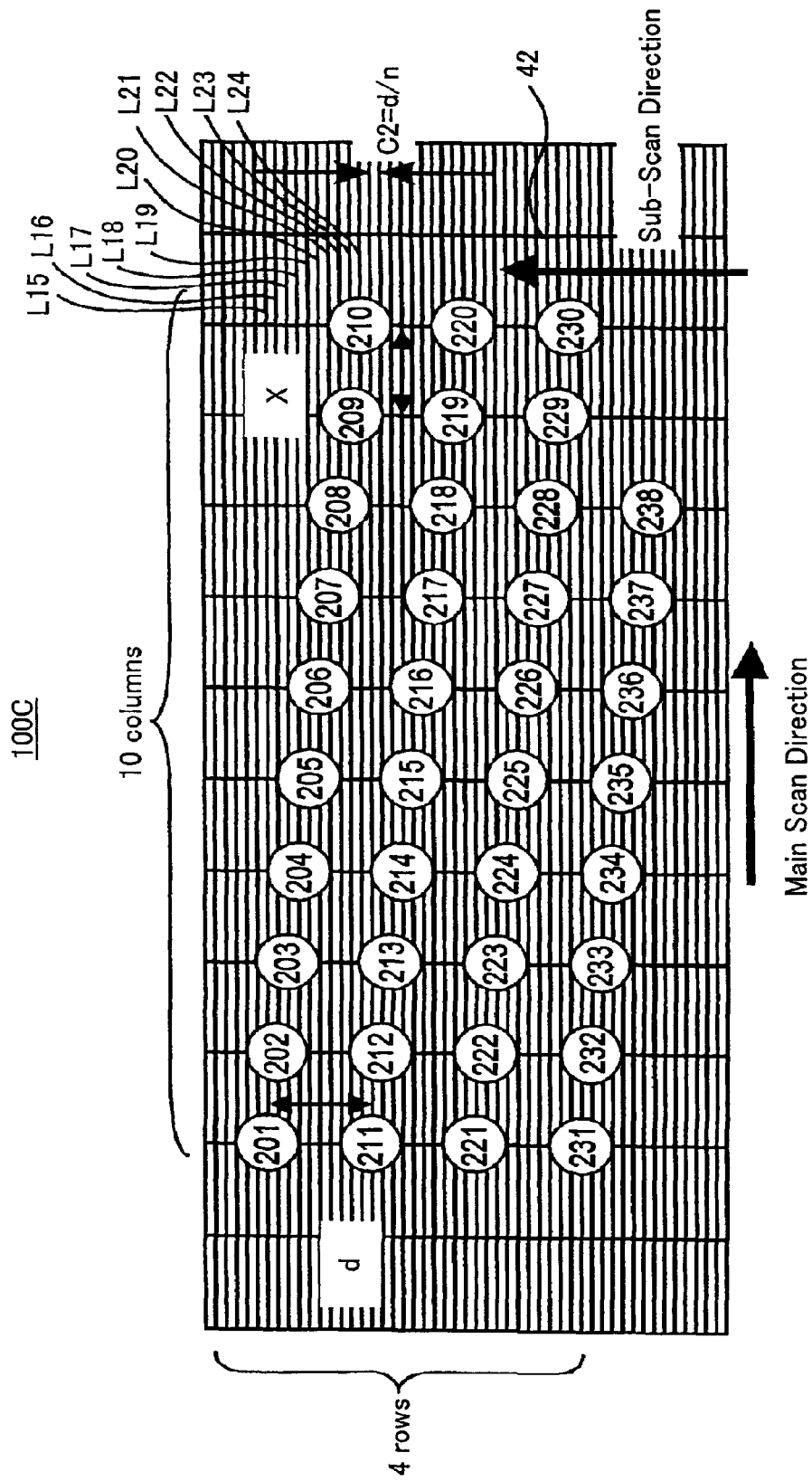
FIG. 9 is another plan view diagram of the surface-emission laser array according to Embodiment 1 of the present invention.

FIG. 9 is yet another plan view diagram of the surface-emission laser array according to Embodiment 1 of the present invention. Here, the surface-emission laser array of Embodiment 1 may be a surface-emission laser array 100C shown in FIG. 9.

Referring to FIG. 9, the surface-emission laser array 100C includes surface-emission laser diode elements 201-238.

Thereby, it should be noted that the surface-emission laser array 100C has the construction in which eight surface-emission laser diode elements 231-238 aligned in the main scanning direction are added to the 30 surface-emission laser diode elements 201-230 disposed two-dimensionally in the formation of three rows and ten columns. Further, the surface-emission laser array 100C has a construction in which six surface-emission laser diode elements, 209, 210, 219, 220, 229 and 230, are added to the construction in which 32 surface-emission laser diode elements, 201-208, 211-218, 221-228, 231-238, are disposed two-dimensionally in the form of four rows and eight columns. Further, the surface-emission laser array 100C has a construction in which two surface-emission laser diode elements are deleted from the two-dimensional array of 40 surface-emission laser diode elements of four rows and ten columns.

Thereby, the four surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, and the three surface-emission laser diode elements 209, 219 and 229, or 210, 220 and 230, are disposed in the sub-scanning direction, while the ten of the surface-emission laser diode elements, 201-210, or 211-220, or 221-230, and the eight of the surface-emission laser diode elements, 231-238, are aligned in the main scanning direction.

Thereby, it should be noted that the ten surface-emission laser diode elements, 201-210, or 211-220, or 221-230, and the eight surface-emission laser diode elements, 231-238, aligned in the main scanning direction, are disposed with stepwise displacement in the sub-scanning direction. As a result, 38 laser beams are emitted from the 38 surface-emission laser diode elements 201-238 without causing overlapping.

In the ten surface-emission laser diode elements, 201-210, or 211-220, or 221-230, and in the eight surface-emission laser diode elements 231-238 disposed in the main scanning direction, the interval between two adjacent surface-emission laser diode elements is set to the interval X.

Further, in the four surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, and in the three surface-emission laser diode elements 209, 219 and 229 or 210, 220 and 230, aligned in the sub-scanning direction, adjacent two surface-emission laser diode elements are disposed with the interval d.

The interval d is set smaller than the interval X.

With this construction, it should be noted that ten straight lines L15-L24 drawn perpendicularly to the straight line 42 extending in the sub-scanning direction from respective centers of the ten surface-emission laser diode elements 201-210, which are aligned in the main scanning direction, are formed with the equal interval $C_2$ in the sub-scanning direction, wherein the interval $C_2$ is determined as $C_2=d/10$.

Likewise, the ten straight lines, drawn perpendicularly to the straight line 42 from the respective centers of the ten surface-emission laser diode elements, 211-220 or 221-230, also aligned in the main-scanning direction, are formed with an equal interval equal to the interval $C_2$ in the sub-scanning direction. Likewise, the eight straight lines, drawn perpendicularly to the straight line 42 from the respective centers of the eight surface-emission laser diode elements, 231-238, also aligned in the main-scanning direction, are formed with an equal interval equal to the interval $C_2$ in the sub-scanning direction.

Further, with Embodiment 1, the interval d is set to 2.4 µm and the interval X is set to 30 µm, and thus, with the surface-emission laser array 100C, the interval $C_2$ is set to 24/10=2.4 µm. Thus, it becomes possible to reduce the interval $C_2$ from 3 µm to 2.4 µm by increasing the number of the surface-emission laser diode elements aligned in the main scanning direction from eight (see FIG. 7) to ten. As a result, it becomes possible to achieve high density optical writing while using the surface-emission laser array 100C.

Each of the surface-emission laser diode elements 201-238 shown in FIG. 9 is formed of the surface-emission laser diode element 1 shown in FIGS. 2 and 3 or the surface-emission laser diode element 1A shown in FIGS. 5 and 6.

Figure 10:
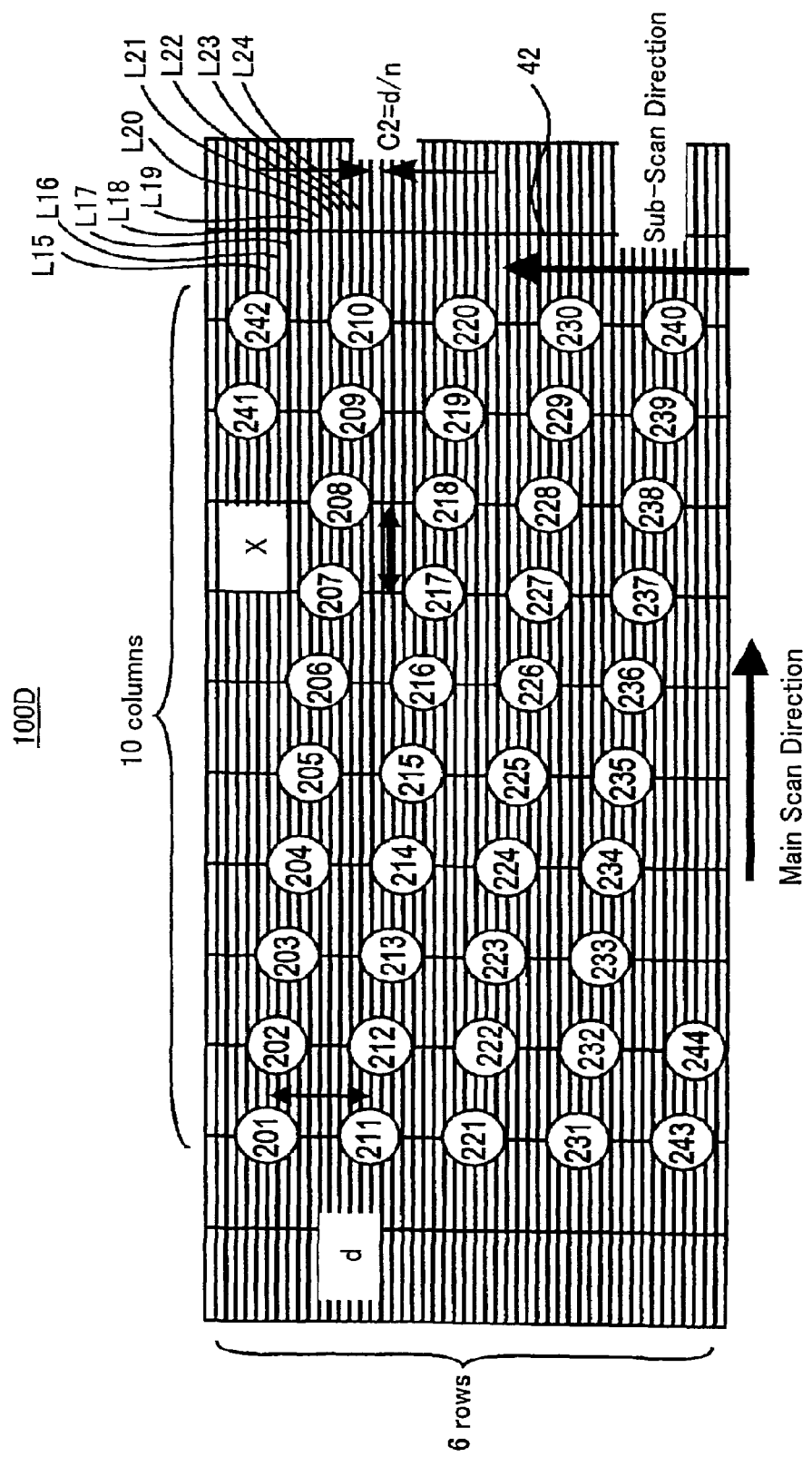
FIG. 10 is another plan view diagram of the surface-emission laser array according to Embodiment 1 of the present invention.

FIG. 10 is yet another plan view diagram of the surface-emission laser array according to Embodiment 1 of the present invention. Here, the surface-emission laser array of Embodiment 1 may be a surface-emission laser array 100D shown in FIG. 10.

Referring to FIG. 10, the surface-emission laser diode array 100D has a construction of adding the surface-emission laser diode elements 241-244 to the surface-emission laser diode array 100B shown in FIG. 8. Otherwise, the surface-emission laser diode array 100D is identical to the surface-emission laser array 100B.

Thereby, the five surface-emission laser diode elements, 201, 211, 221, 231 and 243, or 202, 212, 222, 232 and 244, or 209, 219, 229, 239 and 241, or 210, 220, 220, 220 and 242, and the 4 surface-emission laser diode elements 203, 213 and 222 and 233, or 204, 214, 224 and 234, or 205, 215, 225 and 235, or 206, 216, 226 and 236, or 207, 217, 227 and 237, or 208, 218, 228 and 238, are aligned in the sub-scanning direction, while the ten of the surface-emission laser diode elements, 201-210, or 211-220, or 221-230, or 231-240, and the two of the surface-emission laser diode elements, 241 and 242 or 243 and 244, are aligned in the main scanning direction.

Thereby, it should be noted that the ten surface-emission laser diode elements, 201-210, or 211-220, or 221-230, or 231-240, and the two surface-emission laser diode elements 241 and 242, or 243 and 244, aligned in the main scanning direction, are disposed with stepwise displacement in the sub-scanning direction. As a result, 44 laser beams are emitted from the 44 surface-emission laser diode elements 201-244 without causing overlapping.

In the ten surface-emission laser diode elements, 201-210, or 211-220, or 221-230, or 231-240, and in the two surface-emission laser diode elements 241 and 242, or 243 and 244, aligned in the main scanning direction, the interval between two adjacent surface-emission laser diode elements is set to the interval X.

Further, in the array of five surface-emission laser diode elements, 201, 211, 221, 231 and 243, or 202, 212, 222, 232 and 244, or 209, 219, 229, 239 and 241, or 210, 220, 230, 240 and 242, and in the array of four surface-emission laser diode elements 203, 213, 223 and 233, or 204, 214, 224 and 234, or 205, 215, 225 and 235, or 206, 216, 226 and 236, or 207, 217, 227 and 237, or 208, 218, 228 and 238, both aligned in the sub-scanning direction, adjacent 2 surface-emission laser diode elements are disposed with the interval d.

The interval d is set smaller than the interval X.

Likewise, the two straight lines, drawn perpendicularly to the straight line 42 extending in the sub-scanning direction from the respective centers of the two surface-emission laser diode elements, 241 and 242, or 243 and 244, also aligned in the main-scanning direction, are formed with an equal interval equal to the interval $C_2$ in the sub-scanning direction. Otherwise, the construction is identical to that of the surface-emission laser array 100B explained before.

Thus, it becomes possible to reduce the interval $C_2$ from 3 µm to 2.4 µm by increasing the number of the surface-emission laser diode elements disposed in some rows (the second row through the fifth row) from eight (see FIG. 7) to ten, without providing the same number of surface-emission laser diode elements to each row. As a result, it becomes possible to achieve high density optical writing while using the surface-emission laser array 100D.

Each of the surface-emission laser diode elements 201-244 shown in FIG. 10 is formed of the surface-emission laser diode element 1 shown in FIGS. 2 and 3 or the surface-emission laser diode element 1A shown in FIGS. 5 and 6.

Figure 11:
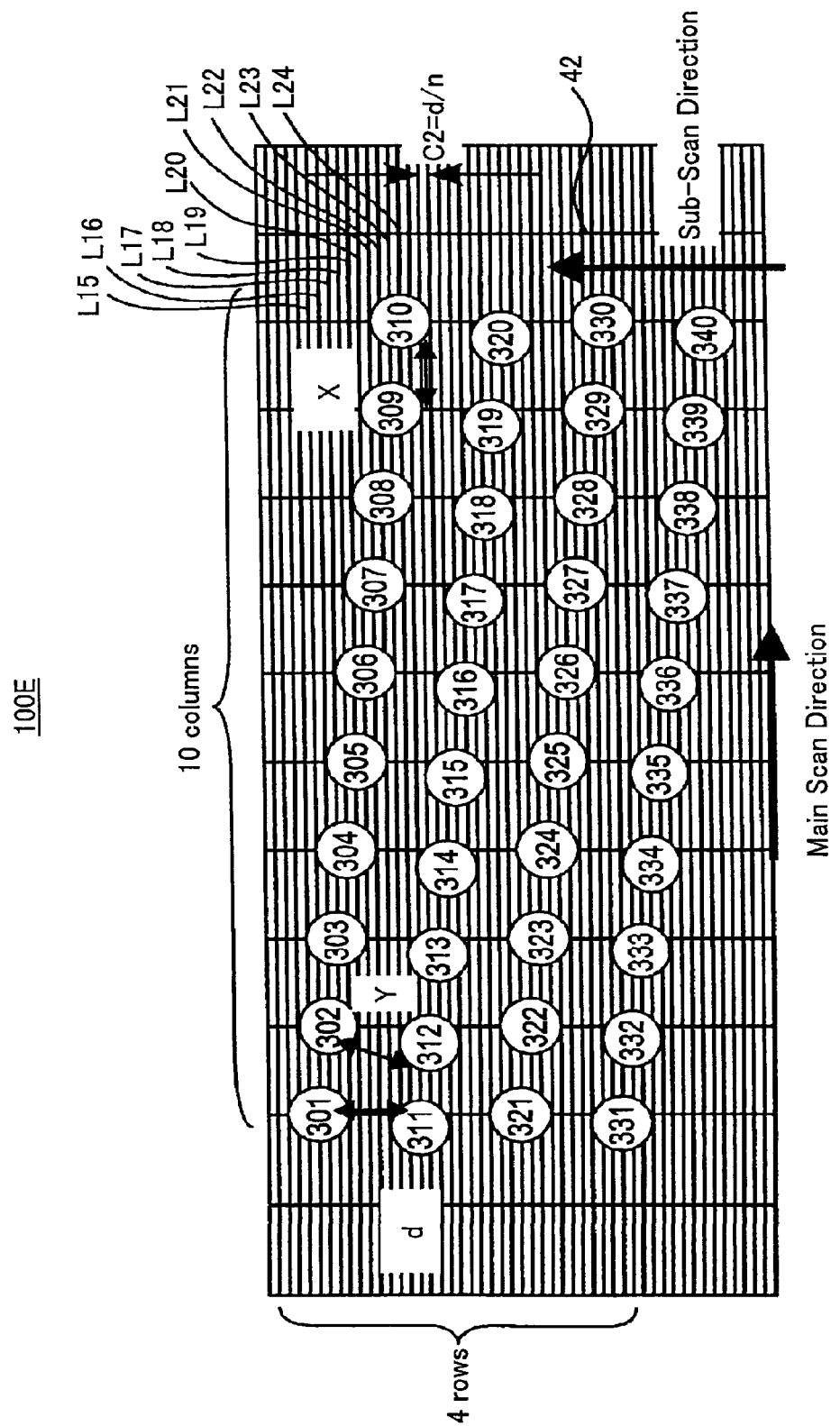
FIG. 11 is another plan view diagram of the surface-emission laser array according to Embodiment 1 of the present invention.

FIG. 11 is yet another plan view diagram of the surface-emission laser array according to Embodiment 1 of the present invention. Here, the surface-emission laser array of Embodiment 1 may be a surface-emission laser array 100E shown in FIG. 11.

Referring to FIG. 11, the surface-emission laser array 100E includes surface-emission laser diode elements 301-340.

The surface-emission laser elements 301-340 are disposed two-dimensionally in the form of array of four rows and ten columns Thereby, the four surface-emission laser diode elements, 301, 311, 321 and 331, or 302, 312, 322 and 332, or 303, 313, 323 and 333, or 304, 314, 324 and 334, or 305, 315, 325 and 335, or 306, 316, 326 and 336, or 307, 317, 327 and 337, or 308, 318, 328 and 338, or 309, 319, 329 and 339, or 310, 320, 330 and 340, are aligned in the sub-scanning direction but with a zigzag pattern, while the ten surface-emission laser diode elements, 301-310, or 311-320, or 321-330, or 331-340, are aligned in the main scanning direction.

Thereby, it should be noted that the ten surface-emission laser diode elements, 301-310, or 311-320, or 321-330, or 331-340, aligned in the main scanning direction, are disposed with stepwise displacement in the sub-scanning direction. As a result, 40 laser beams are emitted from the 40 surface-emission laser diode elements 301-340 without causing overlapping.

Further, it should be noted that the ten surface-emission laser diode elements, 301-310, or 311-320, or 321-330, or 331-340, are aligned in the main scanning direction with an interval X for two adjacent surface-emission laser diode elements.

Further, in the four surface-emission laser diode elements, 301, 311, 321 and 331, or 302, 312, 322 and 332, or 303, 313, 323 and 333, or 304, 314, 324 and 334, or 305, 315, 325 and 335, or 306, 316, 326 and 336, or 307, 317, 327 and 337, or 308, 318, 328 and 338, or 309, 319, 329 and 339, or 310, 320, 330 and 340, aligned in the sub-scanning direction, adjacent two surface-emission laser diode elements are disposed with the interval d.

The interval d is set smaller than the interval X.

With this construction, it should be noted that ten straight lines L15-L24 drawn perpendicularly to the straight line 42 extending in the sub-scanning direction from respective centers of the ten surface-emission laser diode elements 301-310, which are aligned in the main scanning direction, are formed with the uniform interval $C_2$ in the sub-scanning direction, wherein the interval $C_2$ is determined as $C_2=d/10$.

Likewise, the ten straight lines, drawn perpendicularly to the straight line 42 from the respective centers of the ten surface-emission laser diode elements, 311-320, 321-330, 331-340 also aligned in the main-scanning direction, are formed with an equal interval equal to the interval $C_2$ in the sub-scanning direction.

Further, with Embodiment 1, the interval d is set to 2.4 μm and the interval X is set to 30 μm, and thus, with the surface-emission laser array 100E, the interval $C_2$ is set to 24/10=2.4 μm.

Thus, it becomes possible to reduce the interval $C_2$ from 3 μm to 2.4 μm by increasing the number of the surface-emission laser diode elements aligned in the main scanning direction from eight (see FIG. 7) to ten. As a result, it becomes possible to achieve high density optical writing while using the surface-emission laser array 100E.

Each of the surface-emission laser diode elements 301-340 shown in FIG. 11 is formed of the surface-emission laser diode element 1 shown in FIGS. 2 and 3 or the surface-emission laser diode element 1A shown in FIGS. 5 and 6.

Figure 12:
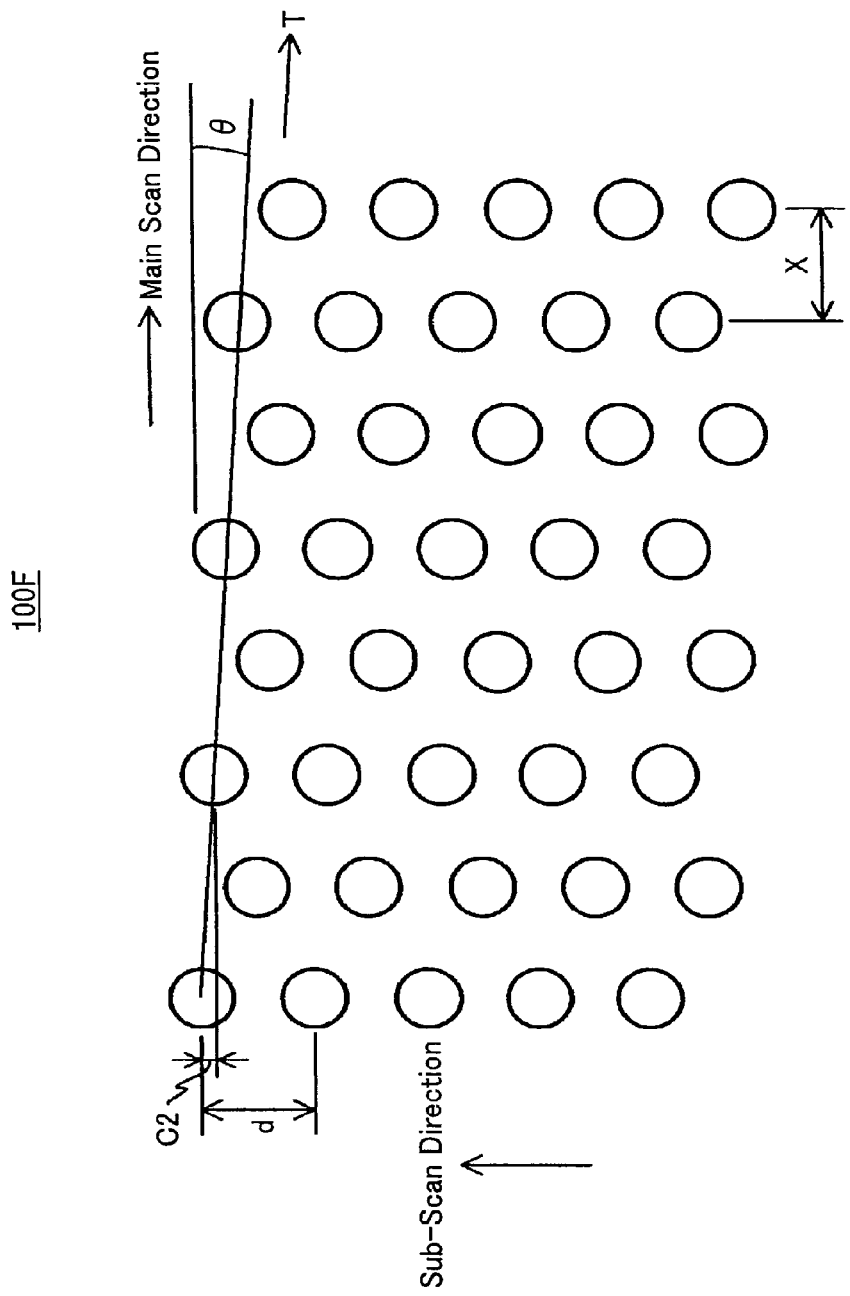
FIG. 12 is another plan view diagram of the surface-emission laser array according to Embodiment 1 of the present invention.

FIG. 12 is yet another plan view diagram of the surface-emission laser array according to Embodiment 1 of the present invention. Here, the surface-emission laser array of Embodiment 1 may be a surface-emission laser array 100F shown in FIG. 12.

With this surface-emission laser array 100F, there are formed 40 surface-emission laser elements on a single substrate. With this surface emission laser array, there are provided ten rows of optical emission parts each including therein four surface-emission laser diode elements with an equal interval in the direction (designated hereinafter as "T direction" for the purpose of convenience) such that the each row forms an oblique angle θ from the main scanning direction toward the sub-scanning direction. Hereinafter, for the sake of convenience, the rows will be designated as the first row, the third row, the fourth row, . . . and the tenth row, starting from the top side to the bottom side in the sheet of FIG. 12. Thereby, it should be noted that these ten rows of optical emission parts are disposed with an equal interval in the sub-scanning direction. Thus, the 40 surface-emission laser diode elements are arranged in the form of a two-dimensional array. Thereby, it should be noted that the location of the optical emission parts are displaced in the main scanning direction between the odd number rows and the even number rows.

In the present example, the 40 surface-emission laser diode elements are disposed with an equal interval X in the main scanning direction and with an equal interval $C_2$ in the sub-scanning direction. Thereby, the distance $C_2$ between two surface-emission laser diode elements adjacent with each other in the sub-scanning direction is given as $C_2=Y/8$. Further, there holds the relationship d<X.

With this construction, it is possible to suppress the temperature rise further.

Thus, with the surface-emission laser array 100 explained above (see FIG. 1), in which the 36 surface-emission laser diode elements 1-36 are disposed in the form of two-dimensional array of six rows and six columns, such that the interval Y between the surface emission laser diode elements 1, 7, 13, 19, 25 and 31, or 2, 8, 14, 20, 26 and 32, or 3, 9, 15, 21, 27 and 33, or 4, 10, 16, 22, 28 and 34, or 5, 11, 17, 23, 29 and 35, or 6, 12, 18, 24, 30 and 36, aligned in the sub-scanning direction, to be smaller than the interval X between the surface-emission laser diode elements 1-6, or 7-12, or 13-18, or 19-24, or 25-30, or 31-36, aligned in the main scanning direction, the interval between the six straight lines L1-L6 drawn perpendicularly to the straight line 40 extending in the sub-scanning direction from the respective centers of the six surface-emission laser diode elements, 1-6, or 7-12, or 12-18, or 19-24, or 25-30, or 21-36, aligned in the main scanning direction, is set to the equal interval $C_1$.

Further, with the surface-emission laser array 100A explained above (see FIG. 7), in which the 32 surface-emission laser diode elements 101-132 are disposed in the form of two-dimensional array of 4 rows and eight columns, such that the interval d between the surface emission laser diode elements 101, 109, 117 and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108, 116, 124 and 132, aligned in the sub-scanning direction, to be smaller than the interval X between the surface-emission laser diode elements 101-108, or 109-116, or 117-124, or 125-132, aligned in the main scanning direction, the interval between the eight straight lines L7-L14 drawn perpendicularly to the straight line 41 extending in the sub-scanning direction from the respective centers of the eight surface-emission laser diode elements, 101-108, or 109-116, or 117-124, or 125-132, aligned in the main scanning direction, is set to the equal interval $C_2$.

Further, with the surface-emission laser array 100B explained above (see FIG. 8), in which the 40 surface-emission laser diode elements 201-240 are disposed in the form of two-dimensional array of four rows and ten columns, such that the interval d between the surface emission laser diode elements 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, or 209, 219, 229 and 239, or 210, 220, 230 and 240, aligned in the sub-scanning direction, to be smaller than the interval X between the surface-emission laser diode elements 201-210, or 211-220, or 221-230, or 231-240, aligned in the main scanning direction, the interval between the ten straight lines L15-L24 drawn perpendicularly to the straight line 42 extending in the sub-scanning direction from the respective centers of the 10 surface-emission laser diode elements, 201-210, or 211-220, or 221-230, or 231-240, aligned in the main scanning direction, is set to the equal interval $C_2$.

Further, with the surface-emission laser array 100C explained above (see FIG. 9), in which the 38 surface-emission laser diode elements 201-238 are disposed in the form of two-dimensional array of four rows and ten columns, such that the interval d between the surface emission laser diode elements 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208, 218, 228 and 238, or 209, 219, 229 and 239, or 210, 220 and 230, aligned in the sub-scanning direction, to be smaller than the interval X between the surface-emission laser diode elements 201-210, or 211-220, or 221-230, or 231-238, aligned in the main scanning direction, the interval between the ten straight lines L15-L24 or eight straight lines L15-L22 drawn perpendicularly to the straight line 42 extending in the sub-scanning direction from the respective centers of the 10 or 8 surface-emission laser diode elements, 201-210, or 211-220, or 221-230, or 231-238, aligned in the main scanning direction, is set to the equal interval $C_2$.

Further, with the surface-emission laser array 100D explained above (see FIG. 10), in which the 44 surface-emission laser diode elements 201-244 are disposed in the form of two-dimensional array of 6 rows and 10 columns, such that the interval d between the surface emission laser diode elements 201, 211, 221, 231 and 243, or 202, 212, 222, 232 and 244, or 203, 213, 223 and 233, or 204, 214, 224 and 234, or 205, 215, 225 and 235, or 206, 216, 226 and 236, or 207, 217, 227 and 237, or 208, 218, 228 and 238, or 209, 219, 229, 239 and 241, or 210, 220 and 230, 240 and 242, aligned in the sub-scanning direction, to be smaller than the interval X between the surface-emission laser diode elements 201-210, or 211-220, or 221-230, or 231-240, or 241 and 242, or 243 and 244, aligned in the main scanning direction, the interval between the ten straight lines L15-L24 or two straight lines L15 and L16, or L23 and L24, drawn perpendicularly to the straight line 42 extending in the sub-scanning direction from the respective centers of the ten or two surface-emission laser diode elements, 201-210, or 211-220, or 221-230, or 231-240, or 241 and 242, or 243 and 244, aligned in the main scanning direction, is set to the equal interval $C_2$.

Further, with the surface-emission laser array 100E explained above (see FIG. 11), in which the 40 surface-emission laser diode elements 301-340 are disposed in the form of two-dimensional array of four rows and ten columns, such that the interval d between the surface emission laser diode elements 301, 311, 321 and 331, or 302, 312, 322 and 332, or 303, 313, 323 and 333, or 304, 314, 324 and 334, or 305, 315, 325 and 335, or 306, 316, 326 and 336, or 307, 317, 327 and 337, or 308, 318, 328 and 338, or 309, 319, 329 and 339, or 310, 320, 330 and 340, aligned in the sub-scanning direction, to be smaller than the interval X between the surface-emission laser diode elements 301-310, or 311-320, or 321-330, or 331-340, aligned in the main scanning direction, the interval between the ten straight lines L15-L24 drawn perpendicularly to the straight line 42 extending in the sub-scanning direction from the respective centers of the ten surface-emission laser diode elements, 301-310, or 311-320, or 321-330, or 331-340, aligned in the main scanning direction, is set to the equal interval $C_2$.

Further, with the surface-emission laser array 100F of Embodiment 1 (see FIG. 12), 40 surface-emission laser diode elements are disposed in the two-dimensional array, wherein the interval in the sub-scanning direction is set to the equal interval $C_2$ by setting the interval d to be smaller than the interval X.

Thus, with the surface-emission laser array according to Embodiment 1, in which m×n surface-emission laser diode elements (m, n being an integer equal to or larger than 2) in m rows and n columns, the interval between the m surface-emission laser diode elements aligned in the sub-scanning direction is set smaller than the interval between the n surface-emission laser diode elements aligned in the main scanning direction, and the interval between the n straight lines drawn perpendicularly to a line extending in the sub-scanning direction from respective, n centers of the n surface-emission laser diode elements aligned in the main scanning direction is set to an equal interval value.

Thus, with Embodiment 1, the number of the surface-emission laser diode elements aligned in the sub-scanning direction is set smaller than the number of the surface-emission laser diode elements aligned in the main scanning direction (thus there holds m≤n), and the interval between the m surface-emission laser diode elements aligned in the sub-scanning direction to be smaller than the interval between the n surface-emission laser diode elements aligned in the main-scanning direction, and with this, the interval (equal interval) between the n straight lines drawn perpendicularly to the straight line extending in the sub-scanning direction from the respective, n centers of the n surface-emission laser diode elements aligned in the main scanning direction is set smaller than the conventional case.

For the surface-emission laser array of Embodiment 1, any construction can be used as long as the construction includes plural surface-emission laser diode elements disposed in the form of two-dimensional array such that plural surface-emission laser diode elements therein are aligned in the first direction with an interval smaller than the interval between the plural surface-emission laser diode elements aligned in the second direction perpendicular to the first direction, and that the straight lines drawn perpendicularly to a straight line extending in the first direction from the respective centers of the plural surface-emission laser diode elements aligned in the second direction are formed with an equal interval in the first direction.

For the surface-emission laser array of Embodiment 1, any construction can be used as long as the construction includes plural surface-emission laser diode elements disposed in the form of two-dimensional array such that plural surface-emission laser diode elements therein are aligned in a first direction with an interval set to a reference value and the number of the plural surface-emission laser diode elements aligned in the first direction is set smaller than the number of the surface-emission laser diode elements aligned in a second direction perpendicular to the first direction, and that the straight lines drawn perpendicularly to a straight line extending in the first direction from the respective centers of the plural surface-emission laser diode elements aligned in the second direction are formed with an equal interval in the first direction. Here, the reference value is set to 28 μm, which is the interval between the surface-emission laser diode elements aligned in the sub-scanning direction used in conventional surface-emission laser array such as DocuColor 1256GA, DocuColor 8000 Digital Press, DocuColor C6550I/C5540I, DocuColor 750I, 650I/550I, CocuColor f1100/a1100/1900, and the like.

In conventional surface-emission laser array, the number of the surface-emission laser diode elements aligned in the main scanning direction is set equal to or smaller than the number of the surface-emission laser diode elements aligned in the sub-scanning direction, while in the surface-emission laser array of the present invention, the number of the surface-emission laser diode elements aligned in the second direction (=main scanning direction) is set larger than the number of the surface-emission laser diode elements aligned in the first direction (=sub-scanning direction), and thus, the interval between the plural straight lines drawn perpendicularly to a line extending in the first direction (=sub-scanning direction) from the respective centers of the surface-emission laser diode elements aligned in the second direction (=main scanning direction) can be set smaller than the interval between the plural straight lines drawn for the case in which the plural surface-emission laser diode elements are aligned in the sub-scanning direction with the interval of 28 μm.

While it has been described in the foregoing explanation that the reference value is 28 μm, the reference value may take any value other than 28 μm in the present invention. Thus, in general case, the reference value is set equal to the interval between the surface-emission laser diode elements aligned in the sub-scanning direction for the case in which the number of the surface-emission laser diode elements aligned in the main scanning direction is set equal to or smaller than the number of the surface-emission laser diode elements aligned I the sub-scanning direction.

Meanwhile, when to attain a certain recording density, there is a need of decreasing the lateral magnification in the sub-scanning direction with increasing pitch in the sub-scanning direction. This corresponds to the situation of decreasing the ratio fi/fo where fo stands for the focal distance at the side of the object (optical source) while fi represents the focal distance at the side of image (scanning surface). In writing optical systems, this corresponds to the process of changing the focal distance between a coupling lens 502 and an anamorphic lens 503.

On the other hand, because of the effect of large optical emission area and divergence angle, it is difficult to change the lateral magnification, and thus, there is a need to fix the coupling lens 502 and change the anamorphic lens 503. Thereby, there is caused decrease of magnification by reducing the focal distance F of the anamorphic lens 503, while this results in increase of NA (numerical aperture), which is given as N sin θ, where N represents the refractive index. This, however, results in excessive focusing of the optical beam and decrease of the focal depth. Associated with this, there arises the problem of increased variation of beam spot size when there is an error in the optical system. In order to deal with this problem, there is a need to adjust the NA by narrowing the aperture, while this approach results in decrease of the available amount of light, and optical source of higher optical power is needed for achieving the same process of optical recording. Thus, this approach is disadvantageous for increasing the writing speed and recording density. In order to solve this problem, a complex optical system is needed, while such complex optical system is characterized by long optical path length and causes the problem of increase in the size of the apparatus. The conventional surface-emission laser array used in the apparatuses such as DocuColor 1256GA, DocuColor 8000, Digital Press, DocuColor C6550I/C5540I, DocuColor 750I/650II/550I, or Docucolor f1100/a1100/a900, and the like, has the construction of 8 rows and 4 columns, and the interval between the surface-emission laser diode elements aligned in the sub-scanning direction is set to 28 μm. Thereby, the interval C between the perpendicularly drawn straight lines is 7μ (see IEICE Electronics Society Meeting, 2004, CS-3-4). With these apparatuses, writing is achieved with 2400 dpi, and an optical system of the magnification of about 1.5 times is used. In order to realize the resolution of 4800 dpi with these apparatuses, there arises a drawback that it is necessary to use the optical system of magnification less than 1, such as 0.75 times.

When C<5 μm, on the contrary, it is possible to realize the high density writing with the resolution of 4800 dpi, which has not been attained heretofore, while using low optical output power, even in the case the optical system has the magnification of 1 or more (about 1.06). Further, in the case of realizing the resolution of 2400 dpi, it is possible to user the optical system having the magnification of about 2.1. In Japanese Laid-Open Patent Application 2005-309301, there is a disclosure about an apparatus that uses a surface-emission laser array in which the surface-emission laser diode elements form an array of 6 rows and 6 columns in which h the interval between the surface-emission laser diode elements is set to 30 μm both in the main scanning direction and in the sub-scanning direction. Contrary to the foregoing, the present invention set the interval in the main scanning direction to be larger than the interval in the sub-scanning direction, and it is possible to reduce the thermal interference even when C is smaller than 5 μm (C<5 μm), and it becomes possible to suppress the drop of output power or decrease of lifetime.

[Embodiment 2]

Figure 13:
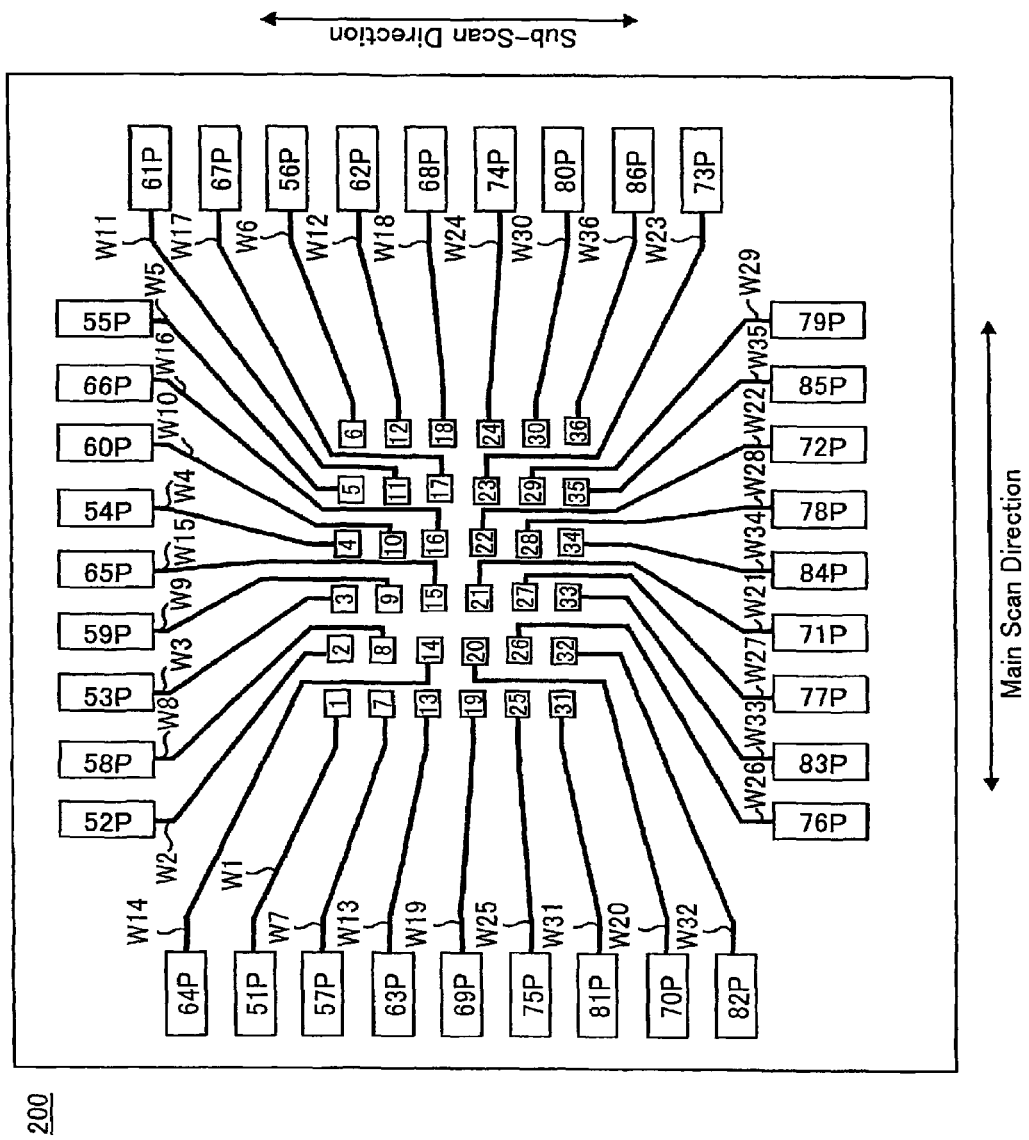
FIG. 13 is a plan view diagram of the surface-emission laser array according to Embodiment 2 of the present invention.

FIG. 13 is another plan view diagram of the surface-emission laser array according to Embodiment 2 of the present invention.

Referring to FIG. 13, a surface-emission laser array 200 according to Embodiment 2 includes the surface-emission laser diode elements 1-36, pads 51P-86P and interconnection patterns W1-W36.

In each of the surface-emission laser array 1-36, the cavity spacer layer 403, the active layer 404, the cavity spacer layer 405, the reflection layer 406 and the selective oxidation layer 407 (see FIG. 2) form a mesa structure. Further, with the surface-emission laser array 200 of Embodiment 2, the mesa structure has a rectangular shape of the size of 16 μm for each edge for each of the surface-emission laser diode elements 1-36.

The surface-emission laser diode elements 1-36 are thereby disposed in the formation of 6 rows and 6 columns similarly to the surface-emission laser array 100 of Embodiment 1. Further, the pads 51P-86P are disposed around the 36 surface-emission laser diode elements 1-36. The interconnection patterns W1-W36 connect the surface-emission laser diode elements 1-36 to the pads 51P-86P respectively. Each of the interconnection patterns W1-W36 has a width of 8 μm.

With Embodiment 2, the surface-emission laser diode elements, 1, 7, 13, 19, 25 and 31, or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, are aligned in the sub-scanning direction with an interval of 24 μm, while the surface-emission laser diode elements, 1-6, or 7-12, or 13-18, or 14-24, or 25-30, or 31-36, are aligned in the main scanning direction with an interval of 36 μm.

In this case, the two surface-emission laser diodes adjacent with each other in the sub-scanning direction are disposed with an interval of 8 μm (=24μ–16 μm), and thus, it is not possible with such a construction to provide the interconnection patterns W1-W36 in the space between two surface-emission laser diode elements adjacent with each other in the sub-scanning direction.

On the other hand, with regard to the main scanning direction, the interval between the two surface-emission laser diodes adjacent with each other becomes 28 μm (=44μ–16 μm), and thus, it is possible with such a construction to provide the interconnection patterns W1-W36 in the space between two surface-emission laser diode elements adjacent with each other in the main scanning direction.

Thus, with the source-emission laser array 200, the interconnection patterns W1-W7, W12, W13, W19, W24, W25, W80-W86 respectively connecting the surface-emission laser diode elements, 1-7, 12, 13, 18, 19, 24, 25 and 30-36, located at the outermost region of the 36 surface-emission laser diode elements forming the array of six rows and six columns, to the pads 51P-57P, 62P, 63P, 68P, 69P, 74P, 75P and 80P-86P, are provided not in the space between two adjacent surface-emission laser diode elements, while the interconnection patterns W8-W11, W14-W17, W20-W23, and W26-W29, respectively connecting the 16 surface-emission laser diode elements, 8-11, 14-17, 20-23 and 26-29, located at the inner region of the array of the 36 surface-emission laser diode elements 1-36, to the pads 58P-61P, 64P-67P, 70P-73P and 76P-79P, are disposed such that one or two of the foregoing interconnection patterns are disposed in the space between two adjacent surface-emission laser diode elements aligned in the main scanning direction.

More specifically, the interconnection patterns W8-W11, W14-W17, W20-W23 and W26-W29, are disposed such that one of the interconnection patterns is provided between the surface-emission laser diode elements 1 and 2, between the surface-emission laser diode elements 2 and 3, between the surface-emission laser diode elements 7 and 8, between the surface-emission laser diode elements 8 and 9, between the surface-emission laser diode elements 13 and 14, between the surface-emission laser diode elements 15 and 16, between the surface-emission laser diode elements 16 and 17, between the surface-emission laser diode elements 17 and 18, between the surface-emission laser diode elements 19 and 20, between the surface-emission laser diode elements 21 and 22, between the surface-emission laser diode elements 22 and 23, between the surface-emission laser diode elements 23 and 24, between the surface-emission laser diode elements 25 and 26, between the surface-emission laser diode elements 26 and 27, between the surface-emission laser diode elements 31 and 32, and between the surface-emission laser diode elements 32 and 33, and such that two of the interconnection patterns are provided between the surface-emission laser diode elements 10 and 11, between the surface-emission laser diode elements 11 and 12, between the surface-emission laser diode elements 27 and 28, between the surface-emission laser diode elements 28 and 29, between the surface-emission laser diode elements 29 and 30, between the surface-emission laser diode elements 33 and 34, between the surface-emission laser diode elements 34 and 35, and between the surface-emission laser diode elements 35 and 36.

Thus, the surface-emission layer array 200 has the feature of disposing the interconnection patterns W1-W36 connecting the 36 surface-emission laser diode elements 1-36 to the respective pads 51P-86P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 1, 7, 13, 19, 25 and 31, or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 100B.

Figure 14:
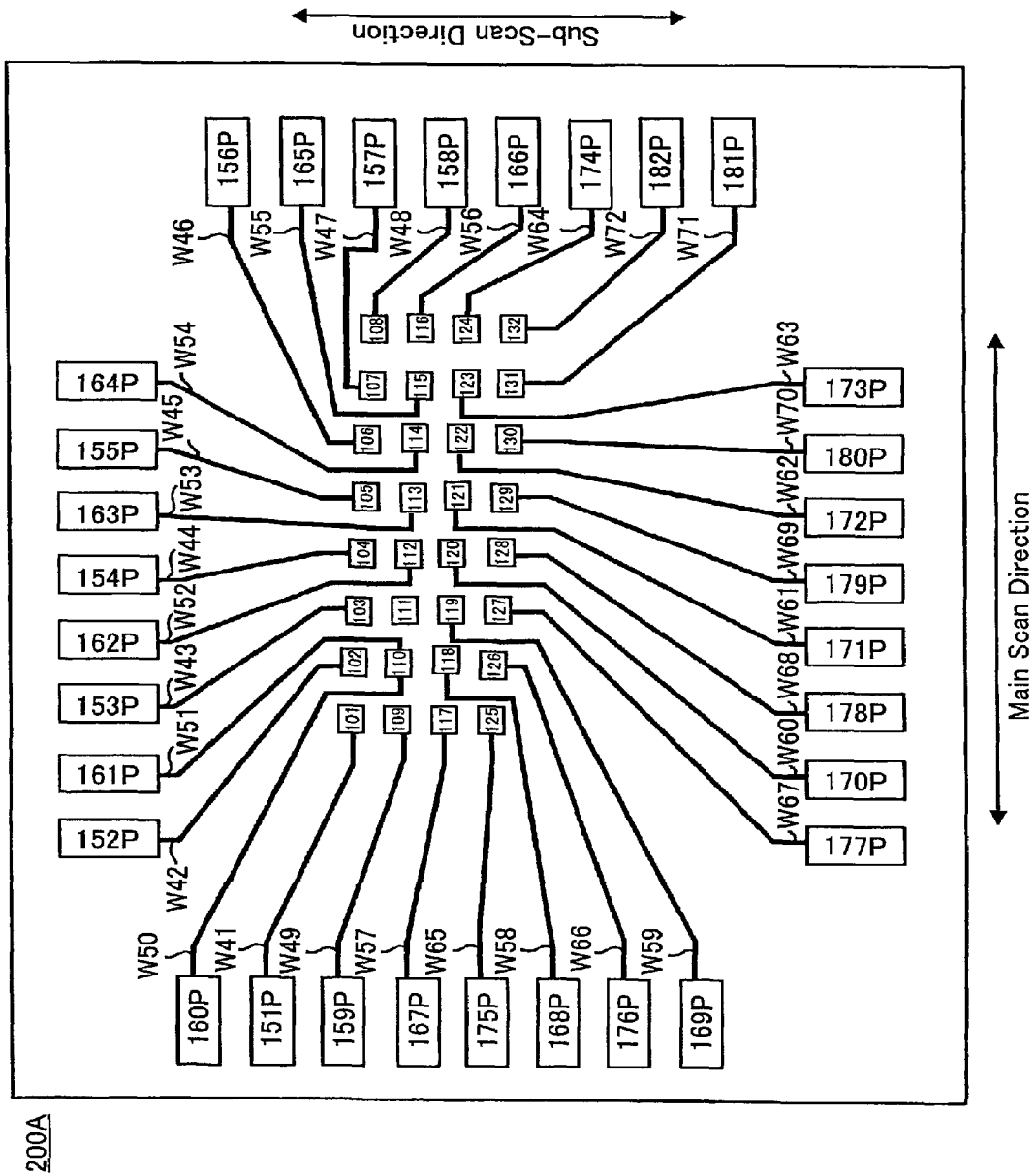
FIG. 14 is another plan view diagram of the surface-emission laser array according to Embodiment 2 of the present invention.

FIG. 14 is another plan view diagram of the surface-emission laser array according to Embodiment 2 of the present invention. Here, the surface-emission laser array of Embodiment 2 may be a surface-emission laser array 200A shown in FIG. 14.

Referring to FIG. 14, the surface-emission laser array 200A according to Embodiment 2 includes the surface-emission laser diode elements 101-132, pads 51P-182P and interconnection patterns W41-W72.

In each of the surface-emission laser array 101-132, the cavity spacer layer 403, the active layer 404, the cavity spacer layer 405, the reflection layer 406 and the selective oxidation layer 407 (see FIG. 2) form a mesa structure. Further, with the surface-emission laser array 200A of Embodiment 2, the mesa structure has a rectangular shape of the size of 16 μm for each edge for each of the surface-emission laser diode elements 101-132.

The surface-emission laser diode elements 101-132 are thereby disposed in the formation of 4 rows and 8 columns similarly to the surface-emission laser array 100A of Embodiment 1. Further, the pads 151P-182P are disposed around the 32 surface-emission laser diode elements 101-132. The interconnection patterns W1-W36 connect the surface-emission laser diode elements 101-132 to the pads 151P-182P respectively. Each of the interconnection patterns W41-W72 has a width of 8 μm.

With Embodiment 2, the surface-emission laser diode elements, 101, 109, 117 and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108, 116, 124 and 132, aligned in the sub-scanning direction are disposed with a separation of 24 μm, while the interval between the surface-emission laser diode elements, 101-108, or 109-116, or 117-124, or 125-132, aligned in the main scanning direction, is set to 30 μm.

In this case, the 2 surface-emission laser diodes adjacent with each other in the sub-scanning direction are disposed with an interval of 8 μm (=24μ–16 μm), and thus, it is not possible with such a construction to provide the interconnection patterns W41-W72 in the space between two surface-emission laser diode elements adjacent with each other in the sub-scanning direction.

On the other hand, with regard to the main scanning direction, the interval between the 2 surface-emission laser diodes adjacent with each other becomes 14 μm (=30μ–16 μm), and thus, it is possible with such a construction to provide one interconnection pattern in the space between two surface-emission laser diode elements adjacent with each other in the main scanning direction.

Thus, with the surface-emission laser array 200A, the interconnection patterns W41-W49, W56, W57, W64, W65-W72, respectively connecting the 20 surface-emission laser diode elements, 101-108, 109, 116, 117, 124 and 125-132, locating at the outermost region of the 32 surface-emission laser diode elements 101-132 forming the array of four rows and eight columns, to the pads 151P-159P, 166P, 167P, 174P, 175P-182P, are provided but not in the region between 2 adjacent surface-emission laser diode elements, while the interconnection patterns W50-W55 and W68-W78, respectively connecting the 12 surface-emission laser diode elements 110-115 located at the inner region of the array of the 32 surface-emission laser diode elements 101-132, to the pads 160P-165P and 168P-173P, are disposed such that one interconnection pattern is provided between two surface-emission laser diode elements adjacent with each other in the main scanning direction.

Thus, the surface-emission layer array 200A has the feature of disposing the interconnection patterns W41-W72 connecting the 32 surface-emission laser diode elements 101-132 to the respective pads 151P-182P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 101, 109, 117, and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108 and 116, 124 and 132, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 200A.

Figure 15:
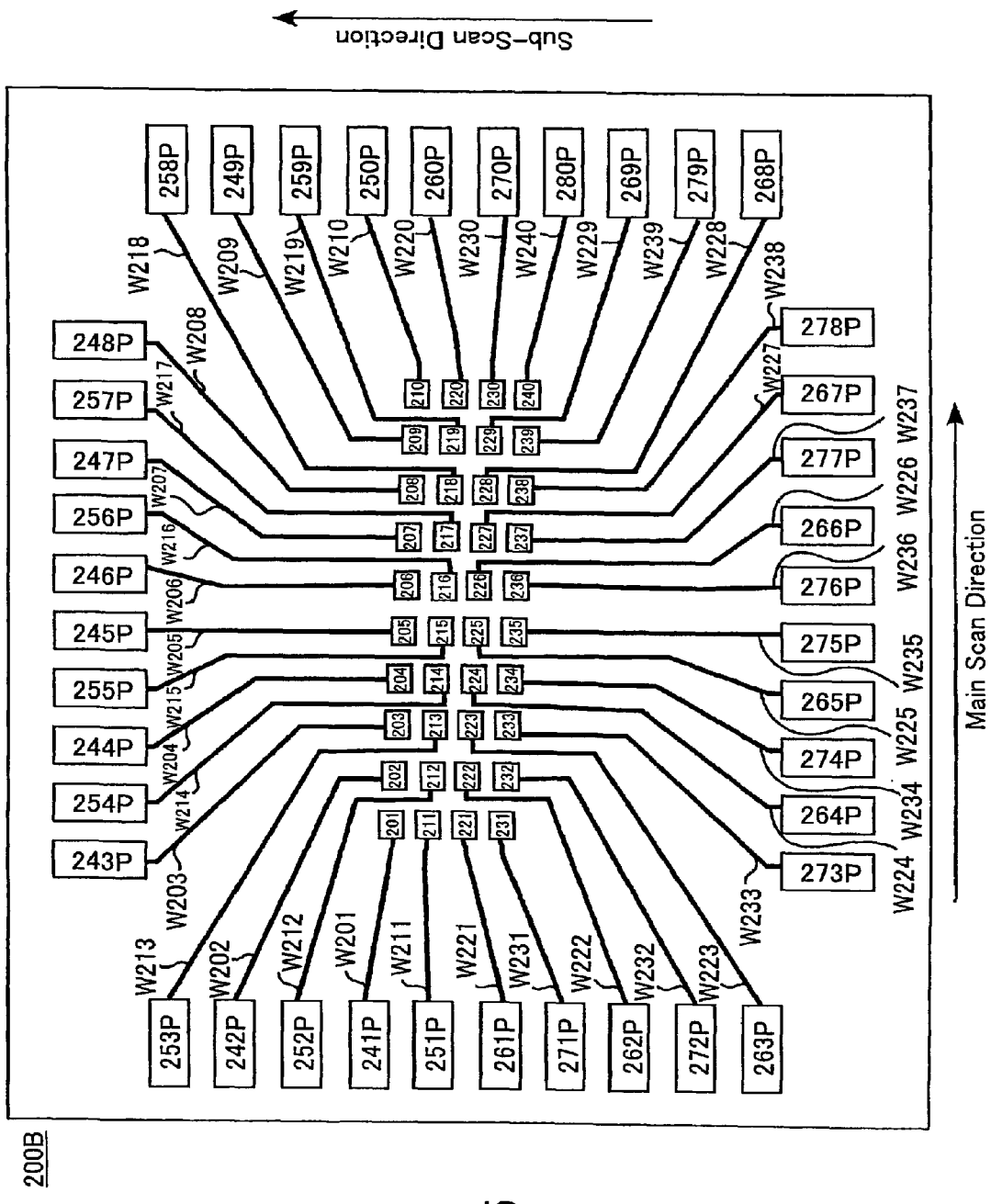
FIG. 15 is another plan view diagram of the surface-emission laser array according to Embodiment 2 of the present invention.

FIG. 15 is yet another plan view diagram of the surface-emission laser array according to Embodiment 2 of the present invention. Here, the surface-emission laser array of Embodiment 2 may be a surface-emission laser array 200B shown in FIG. 15. Referring to FIG. 15, the surface-emission laser array 200B according includes the surface-emission laser diode elements 201-240, pads 241P-280P and interconnection patterns W201-W240.

In each of the surface-emission laser array 201-240, the cavity spacer layer 403, the active layer 404, the cavity spacer layer 405, the reflection layer 406 and the selective oxidation layer 407 (see FIG. 2) form a mesa structure. Further, with the surface-emission laser array 200B of Embodiment 2, the mesa structure has a rectangular shape of the size of 16 μm for each edge for each of the surface-emission laser diode elements 201-240.

The surface-emission laser elements 201-240 are disposed two-dimensionally in the form of array of four rows and ten columns. Further, the pads 241P-280P are disposed around the 40 surface-emission laser diode elements 201-240. The interconnection patterns W201-W240 connect the surface-emission laser diode elements 201-240 to the pads 241P-280P respectively. Each of the interconnection patterns W201-W240 has a width of 8 μm.

With Embodiment 2, the surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, 208, 218, 228 and 238, or 209, 219, 229 and 239, or 210, 220, 230 and 240, are aligned in the sub-scanning direction with an interval of 24 μm, while the surface-emission laser diode elements, 201-210, or 211-220, or 221-230, or 231-240, are aligned in the main scanning direction with an interval of 30 μm.

In this case, the two surface-emission laser diodes adjacent with each other in the sub-scanning direction are disposed with an interval of 8 μm (=24μ−16 μm), and thus, it is not possible with such a construction to provide the interconnection patterns W201-W240 in the space between two surface-emission laser diode elements adjacent with each other in the sub-scanning direction.

On the other hand, with regard to the main scanning direction, the interval between the two surface-emission laser diodes adjacent with each other becomes 14 μm (=30μ−16 μm), and thus, it is possible with such a construction to provide one interconnection pattern in the space between two surface-emission laser diode elements adjacent with each other in the main scanning direction.

Thus, with the surface-emission laser array 200B, the interconnection patterns W201-W211, W220, W221, W230, W231-W240, respectively connecting the surface-emission laser diode elements, 201-211, 220, 221, 230, 231 and 240-240, locating at the outermost region of the 40 surface-emission laser diode elements 201-240 forming the array of four rows and ten columns, to the pads 241P-251P, 260P, 261P, 270P, 271P-280P, are provided but not in the region between two adjacent surface-emission laser diode elements, while the interconnection patterns W212-W219 and W222-W229, respectively connecting the 16 surface-emission laser diode elements 212-219 and 222-229 located at the inner region of the array of the 40 surface-emission laser diode elements 201-240, to the pads 252P-259P and 262P-269P, are disposed such that one interconnection pattern is provided between two surface-emission laser diode elements adjacent with each other in the main scanning direction.

Thus, the surface-emission layer array 200B has the feature of disposing the interconnection patterns W201-W240 connecting the 40 surface-emission laser diode elements 201-240 to the respective pads 241P-280P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208 and 218, 228 and 238, or 209, 219, 229 and 239, or 210, 220, 230 and 240, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 200B.

Figure 16:
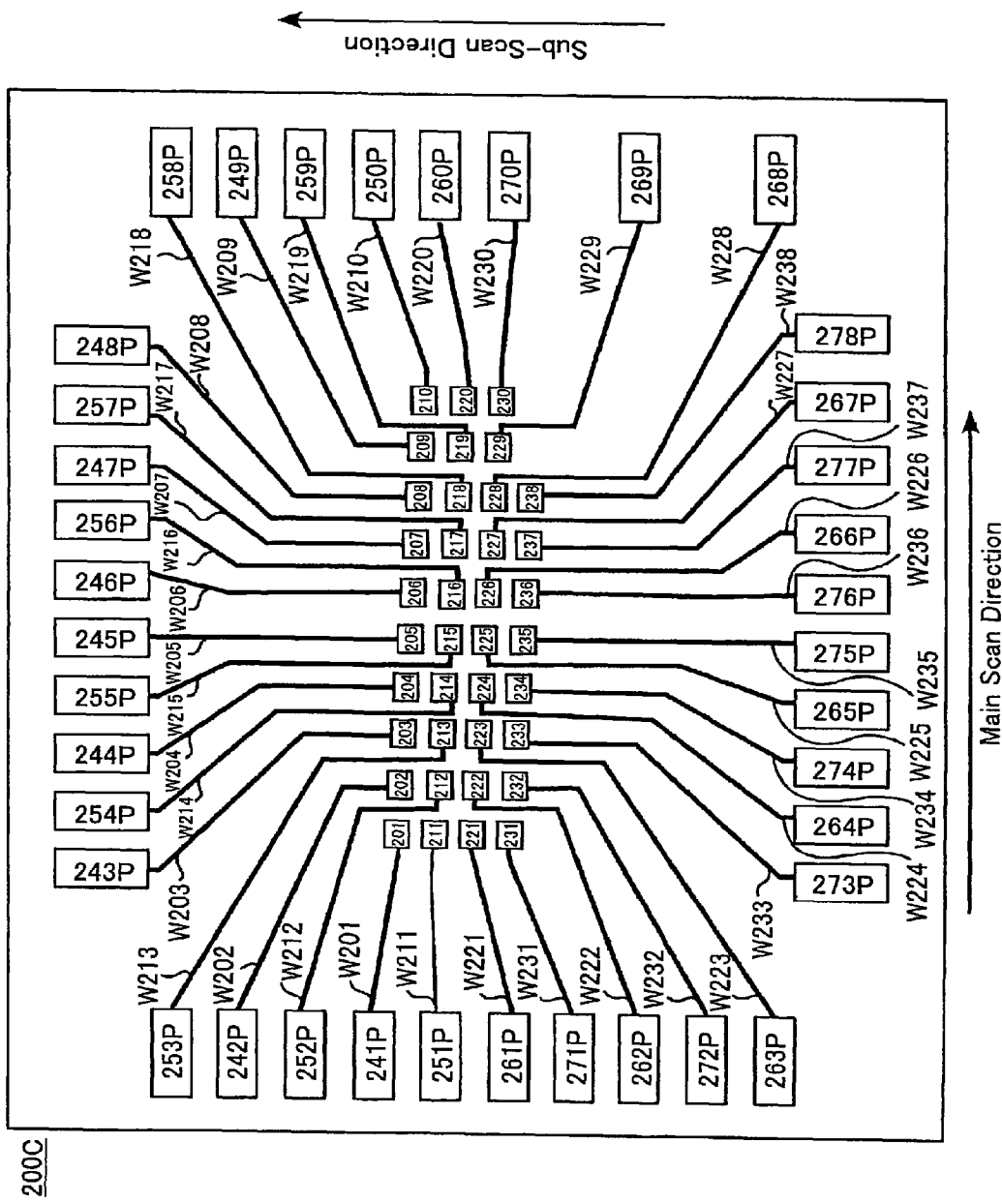
FIG. 16 is another plan view diagram of the surface-emission laser array according to Embodiment 2 of the present invention.

FIG. 16 is yet another plan view diagram of the surface-emission laser array according to Embodiment 2 of the present invention. Here, the surface-emission laser array of Embodiment 2 may be a surface-emission laser array 200C shown in FIG. 16.

Referring to FIG. 16, the surface-emission laser diode array 200C has a construction of eliminating the surface-emission laser diode elements 239 and 240, the pads 279P and 280P and the interconnection patterns W239 and W240 in the surface-emission laser diode array 200B shown in FIG. 15. Otherwise, the surface-emission laser diode array 200C is identical to the surface-emission laser array 200B.

Thus, with the surface-emission laser array 200C, the 39 surface-emission laser diode elements 201-238 are disposed similarly to the case of the surface-emission laser diode elements 201-238 in the surface-emission laser array 100B of Embodiment 1.

Thus, the surface-emission layer array 200C has the feature of disposing the interconnection patterns W201-W228 connecting the 38 surface-emission laser diode elements 200-238 to the respective pads 241P-278P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 201, 211, 221 and 231, or 202, 212, 222 and 232, or 203, 213, 223 and 233, or 204, 214, 224 and 234, or 205, 215, 225 and 235, or 206, 216, 226 and 236, or 207, 217, 227 and 237, or 208 and 218, 228 and 238, or 209, 219, 229 and 239, or 210, 220, 230, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 200C.

Figure 17:
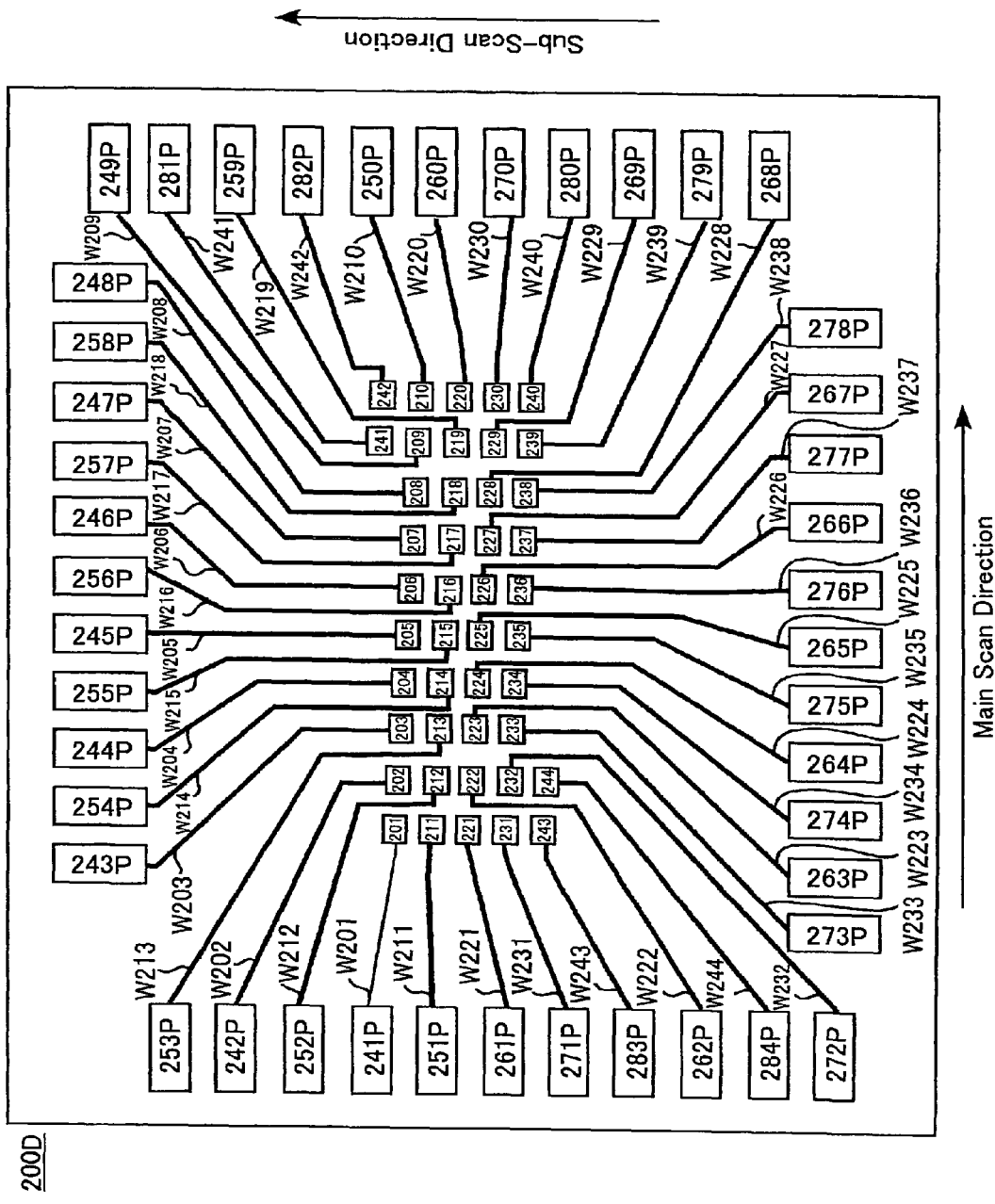
FIG. 17 is another plan view diagram of the surface-emission laser array according to Embodiment 2 of the present invention.

FIG. 17 is yet another plan view diagram of the surface-emission laser array according to Embodiment 2 of the present invention. Here, the surface-emission laser array of Embodiment 2 may be a surface-emission laser array 200D shown in FIG. 17.

Referring to FIG. 17, the surface-emission laser diode array 200D has a construction of eliminating the surface-emission laser diode elements 241-244, the pads 281P-284P and the interconnection patterns W241-W244 in the surface-emission laser diode array 200B shown in FIG. 15. Otherwise, the surface-emission laser diode array 200D is identical to the surface-emission laser array 200B.

The surface-emission laser diode elements 201-244 are disposed similarly to the surface-emission laser diode elements 201-244 in the surface-emission laser array 100c of Embodiment 1. The interconnection patterns W241-W244 connect the surface-emission laser diode elements 241-244 to the pads 281P-284P respectively.

As a result, the interconnection pattern W219 is disposed between the surface-emission laser diode elements 209 and 210 and between the surface-emission laser diode elements 241 and 242 aligned in the main scanning direction, while the interconnection pattern W222 is disposed between the surface-emission laser diode elements 231 and 232 and between the surface-emission laser diode elements 243 and 244 aligned in the main scanning direction Thus, the surface-emission layer array 200D has the feature of disposing the interconnection patterns W201-W244 connecting the 44 surface-emission laser diode elements 201-244 to the respective pads 241P-284P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 201, 211, 221, 231 and 243, or 202, 212, 222, 232 and 244, or 203, 213, 223 and 233, or 204, 214, 224 and 234, or 205, 215, 225 and 235, or 206, 216, 226 and 236, or 207, 217, 227 and 237, or 208, 218, 228 and 228, or 209, 219, 229 and 241, or 210, 220, 230 and 242, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 200D.

Figure 18:
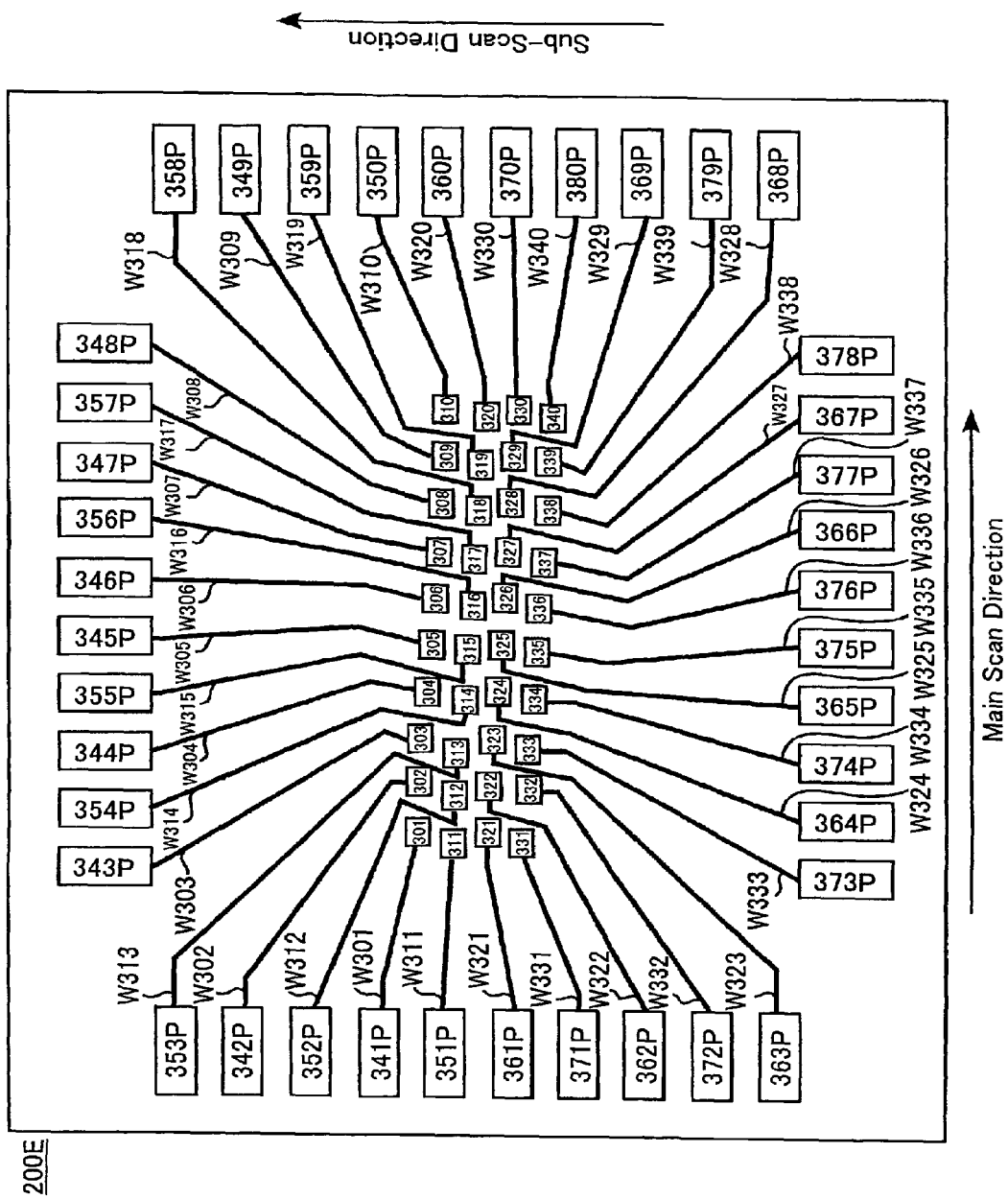
FIG. 18 is another plan view diagram of the surface-emission laser array according to Embodiment 2 of the present invention.

FIG. 18 is yet another plan view diagram of the surface-emission laser array according to Embodiment 2 of the present invention. Here, the surface-emission laser array of Embodiment 2 may be a surface-emission laser array 200E shown in FIG. 18.

Referring to FIG. 18, the surface-emission laser array 200E includes the surface-emission laser diode elements 301-340, pads 341P-380P and interconnection patterns W301-W340.

In each of the surface-emission laser array 301-340, the cavity spacer layer 403, the active layer 404, the cavity spacer layer 405, the reflection layer 406 and the selective oxidation layer 407 (see FIG. 2) form a mesa structure. Further, with the surface-emission laser array 200E of Embodiment 2, the mesa structure has a rectangular shape of the size of 16 μm for each edge for each of the surface-emission laser diode elements 301-340.

The surface-emission laser diode elements 301-340 are thereby disposed in the formation of four rows and ten columns similarly to the surface-emission laser array 100D of Embodiment 1. Further, the pads 241P-280P are disposed around the 40 surface-emission laser diode elements 301-240. The interconnection patterns W201-W240 connect the surface-emission laser diode elements 301-340 to the pads 241P-280P respectively. Each of the interconnection patterns W301-W340 has a width of 8 μm.

With Embodiment 2, the surface-emission laser diode elements, 301, 311, 321 and 331, or 302, 312, 322 and 332, or 303, 313, 323 and 333, or 304, 314, 324 and 334, or 305, 315, 325 and 335, or 306, 316, 326 and 336, or 307, 317, 327 and 337, 308, 318, 328 and 338, or 309, 319, 329 and 339, or 310, 320, 330 and 340, are aligned in the sub-scanning direction with an interval of 24 μm, while the surface-emission laser diode elements, 301-310, or 311-320, or 321-330, or 331-340, are aligned in the main scanning direction with an interval of 30 μm.

In this case, the two surface-emission laser diodes adjacent with each other in the sub-scanning direction are disposed with an interval of 8 μm (=24μ−16 μm), and thus, it is not possible with such a construction to provide the interconnection patterns W301-W340 in the space between two surface-emission laser diode elements adjacent with each other in the sub-scanning direction.

On the other hand, with regard to the main scanning direction, the interval between the two surface-emission laser diodes adjacent with each other becomes 14 μm (=30μ−16 μm), and thus, it is possible with such a construction to provide one interconnection pattern in the space between two surface-emission laser diode elements adjacent with each other in the main scanning direction.

Thus, with the surface-emission laser array 200B, the interconnection patterns W301-W311, W320, W321, W330, W331-W340, respectively connecting the 24 surface-emission laser diode elements, 301-311, 320, 321, 330, 331-340, locating at the outermost region of the 40 surface-emission laser diode elements 301-311, 320, 321, 330 and 331-340, forming the array of four rows and ten columns, to the pads 341P-351P, 360P, 361P, 370P, 371P-380P, are provided but not in the region between two adjacent surface-emission laser diode elements, while the interconnection patterns W312-W319 and W322-W329, respectively connecting the 16 surface-emission laser diode elements 313-319 and 322-329 located at the inner region of the array of the 40 surface-emission laser diode elements 301-340, to the pads 352P-359P and 362P-369P, are disposed such that one interconnection pattern is provided between two surface-emission laser diode elements adjacent with each other in the main scanning direction.

Thus, the surface-emission layer array 200E has the feature of disposing the interconnection patterns W301-W340 connecting the 40 surface-emission laser diode elements 301-340 to the respective pads 341P-380P not in the space between the surface-emission laser diode elements aligned in the sub-scanning direction but in the space between the surface-emission laser diode elements aligned in the main scanning direction.

With this feature, it becomes possible to narrow the interval between the surface-emission laser diode elements, 301, 311, 321 and 331, or 302, 312, 322 and 332, or 303, 313, 323 and 333, or 304, 314, 324 and 334, or 305, 315, 325 and 335, or 306, 316, 326 and 336, or 307, 317, 327 and 337, or 308 and 318, 328 and 338, or 309, 319, 329 and 339, or 310, 320, 330 and 340, aligned in the sub-scanning direction, as compared with the case of providing the interconnection patterns between the surface-emission laser diode elements aligned in the sub-scanning direction. As a result, it becomes possible to achieve high density optical writing while using the surface-emission laser array 200E.

Figure 19:
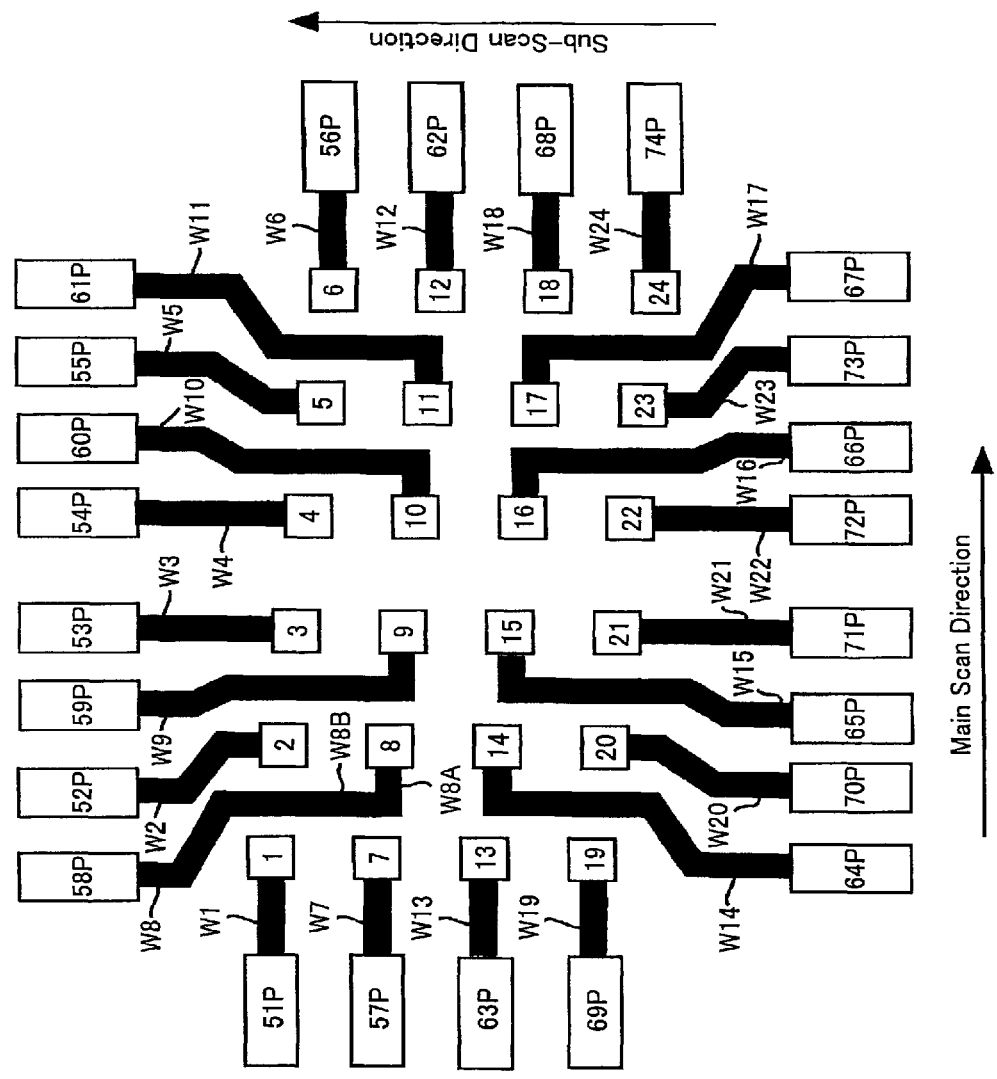
FIG. 19 is a diagram explaining the layout of interconnection pattern in the surface-emission laser diode array of the present invention in detail.

FIG. 19 is a diagram explaining the layout of interconnection pattern in the surface-emission laser diode array of the present invention in detail. In FIG. 19, it should be noted that, among the surface-emission laser diode elements 1-36, the interconnection patterns W1-W36 and the pads 51P-86P, only the surface-emission laser diode elements 1-24, the interconnection patterns W1-S24 and the pads 51P-74P are represented.

Referring to FIG. 19, the interconnection patterns W1-W7, W12, W13, W18-W24 connected respectively to the surface-emission laser diode elements 1-7, 12, 13 and 18-24 located at the peripheral region of the array of the surface-emission laser diode elements 1-24, are not disposed between two surface-emission laser diode elements but are connected respectively to the pads 51P-57P, 62P, 63P and 68P-74P.

On the other hand, the interconnection patterns W8-W11 and W14-W17 connected respectively to the surface-emission laser diode elements 8-11 and 14-27 in the inner region of the array, are connected to the pads 58P-61P and 64P-69P by being disposed between two surface-emission laser diode elements aligned in the main scanning direction. In this case, the interconnection pattern W8 includes the interconnection patterns W8A and W8B, wherein the interconnection pattern W8A is connected to the surface-emission laser diode element 8 by extending in the main scanning direction, while the interconnection pattern W8B is connected to the interconnection pattern W8A by extending in the main scanning direction.

Thus, the interconnection pattern W8 first extends out in the main scanning direction from the surface-emission laser diode element 8 and then extends toward the pad 58P in the sub-scanning direction perpendicular to the main scanning direction by passing the region between two surface-emission laser diode elements aligned in the main scanning direction. Each of the interconnection patterns W9-W11 and W14-W17, is provided similarly to the interconnection pattern W8.

Thus, each of the interconnection patterns W8-W11 and W14-W17 is disposed so as to pass the region between the surface-emission laser diode elements aligned in the main scanning direction.

Figure 20A:
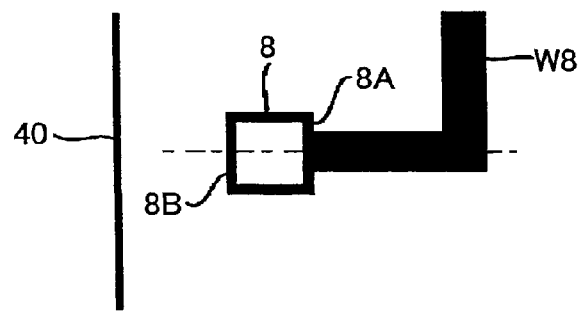
FIGS. 20A-20C are diagrams explaining the layout of interconnection pattern in the surface-emission laser diode array of the present invention in detail.
Figure 20B:
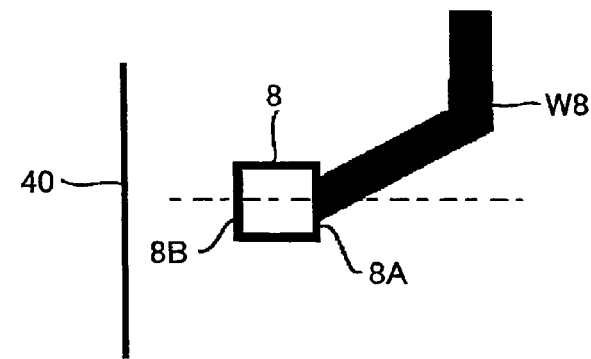
Figure 20C:
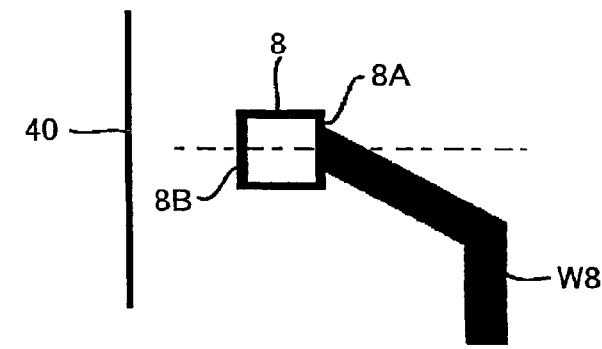

FIGS. 20A-20C are diagrams explaining the layout of interconnection pattern in the surface-emission laser diode array of the present invention in detail.

Referring to FIGS. 20A-20C, the interconnection pattern W8 may be provided, in the case the mesa structure of the surface-emission laser diode array 8 has a rectangular shape, so as to extend out from an edge 8A of the surface-emission laser diode element 8 parallel to the straight line 40 extending in the sub-scanning direction. Thus, the interconnection pattern W8 may be connected to the surface-emission laser diode element 8 from any direction as long as it is connected to the edge 8A of the element 8. Further, the interconnection pattern W8 may be disposed so as to be connected to an edge 8B parallel to the straight line extending in the sub-scanning direction.

Figure 21A:
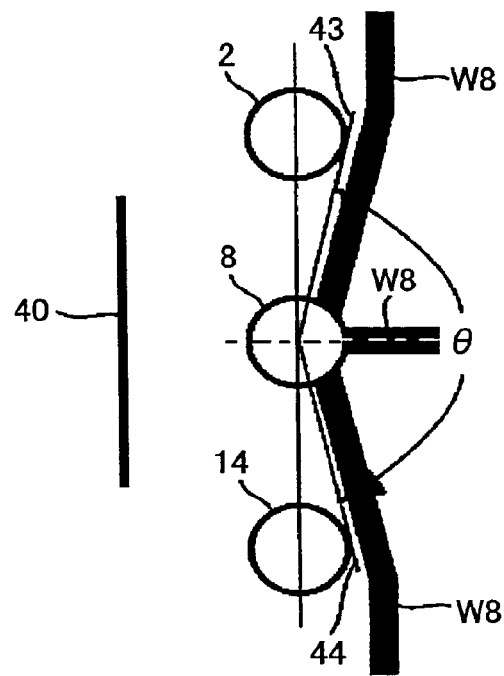
FIGS. 21A and 21B are diagrams explaining the layout of interconnection pattern in the surface-emission laser diode array of the present invention in detail.
Figure 21B:
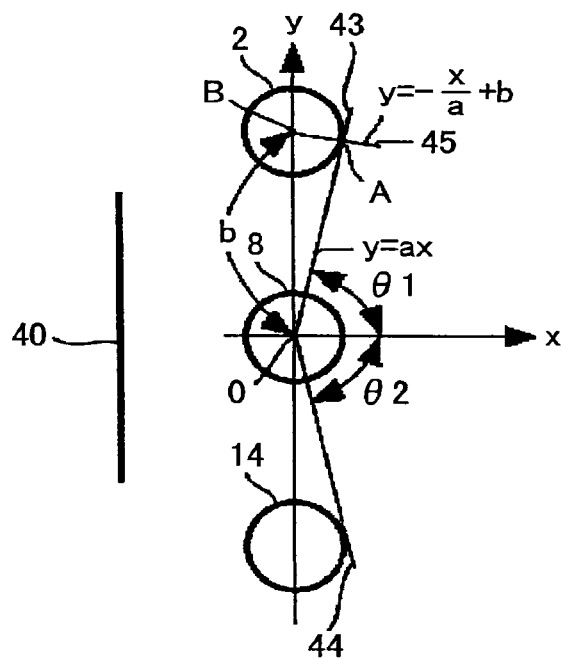

FIGS. 21A and 21B are diagrams explaining the layout of interconnection pattern in the surface-emission laser diode array of the present invention in detail.

Hereinafter, the layout of the interconnection pattern will be explained with reference to FIGS. 21A and 12B for the case the surface-emission laser diode elements 1-24 shown in FIG. 19 have a structure of circular shape.

In the case the surface-emission laser diode elements 2, 8 and 14 are disposed along a straight line extending in the sub-scanning direction, the interconnection pattern W8 is disposed such that the interconnection pattern W8 is connected to the surface-emission laser diode element 8 from a direction between two straight lines 43 and 44. See FIG. 21A.

In the x-y orthogonal coordinate system having the x-axis parallel to the main scanning direction and y-axis parallel to the sub-scanning direction, the surface-emission laser diode element 8 is disposed at the origin of the coordinate system and the surface-emission laser diode elements 2 and 14 are disposed at a location offset from the surface-emission laser diode element 8 by a distance b on the y-axis.

In this case, the straight line 43 passing through the center of the surface-emission laser diode element 8 and tangential to the surface-emission laser diode element 2 is represented as y=ax, while the straight line 45 crossing perpendicularly to the straight line 43 is represented as y=−x/a+b.

In this case, the coordinate of the intersection point A of the straight line 43 and the straight line 45 is given as $[ab/(a^2+1), a^2b/(a^2+1)]$.

As noted above, the interval between the surface-emission laser diode elements 2 and 8 and the interval between the surface-emission laser diode elements 8 and 14 are set to 24 μm, and because the diameter of the surface-emission laser diode elements 2, 8 and 14 is set to 16 μm, there holds b=24 μm and the distance between the points A and B is given as 8 μm. By using the relationship b=24 μm, the parameter a that provides the distance of 8 μm between the points A and B is given as $a=2(2)^{1/2}$.

As a result, the angle $\theta_1$ between the straight line 43 and the x-axis becomes about 70 degrees. Because the straight line 44 is disposed in symmetry to the straight line 43 about the x-axis, the angle $\theta_2$ formed by the straight line 44 with regard to the x-axis takes the value of also about 70 degrees. Thus, defining the positive direction of the x-axis as 0 degree, the interconnection pattern W8 may be connected to the surface-emission laser diode element 8 such that the entirety of the interconnection pattern W8 is disposed within the range of −70 degrees to +70 degrees, by taking into consideration the line width of the interconnection pattern W8. Further, the interconnection pattern W8 may be connected to the surface-emission laser diode element 8 such that the entirety of the interconnection pattern W8 is disposed within the range of 110 degrees to 250 degrees, by taking into consideration of the line width of the interconnection pattern W8.

Figure 22A:
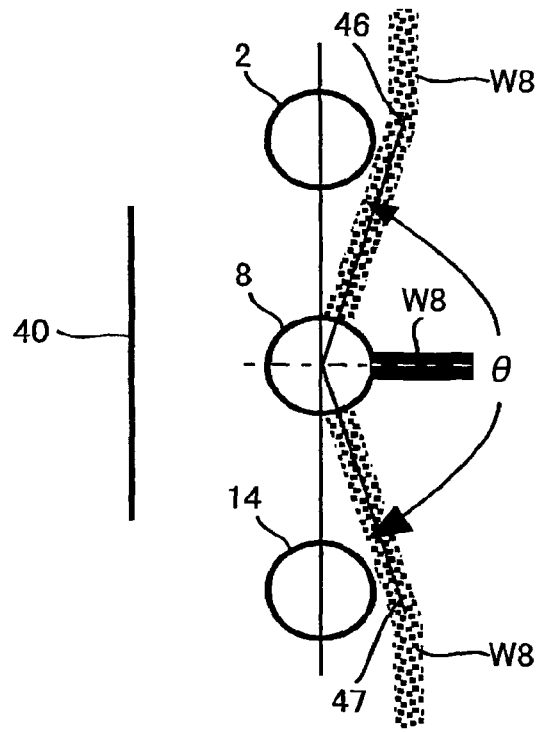
FIGS. 22A and 22B are diagrams for explaining the layout of interconnection pattern in the surface-emission laser diode array of the present invention in detail.
Figure 22B:
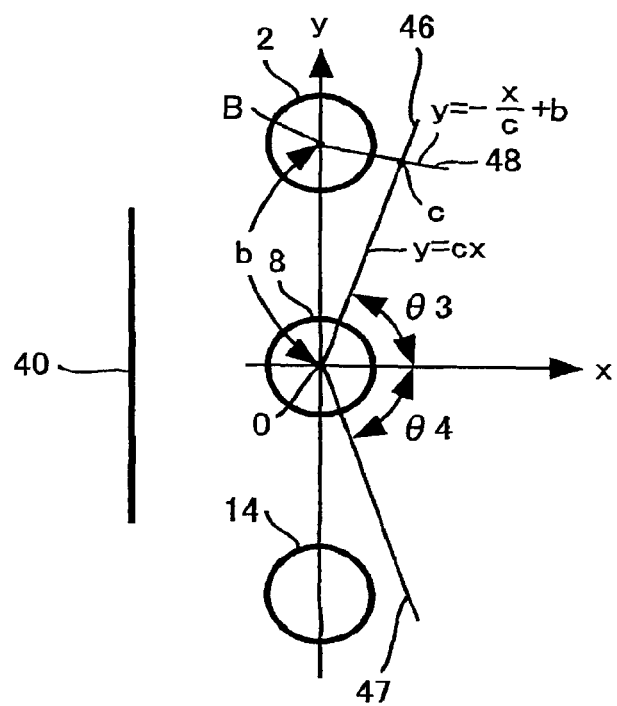

FIGS. 22A and 22B are further diagrams explaining the layout of the interconnection pattern in the surface-emission laser diode array of the present invention in more detail.

Hereinafter, the layout of the interconnection pattern will be explained with reference to FIGS. 22A and 22B for the case the surface-emission laser diode elements 1-24 shown in FIG. 19 have a structure of circular shape.

In the case the surface-emission laser diode elements 2, 8 and 14 are disposed along a straight line extending in the sub-scanning direction, the interconnection pattern W8 is disposed such that the interconnection pattern W8 is connected to the surface-emission laser diode element 8 from a direction between two straight lines 46 and 47. See FIG. 22A. Here, the straight lines 46 and 47 are the lines extending out from the center of the surface-emission laser diode element 8 and passes through the central part of the interconnection pattern W8 in the line-width direction.

The surface-emission laser diode elements 2, 8 and 14 are disposed similarly to the case of FIGS. 21A and 21B and define the x-y orthogonal coordinate system similarly to the case of FIGS. 21A and 21B.

In this case, the straight line 46 is represented as y=cx, while the straight line 48 crossing the straight line 46 perpendicularly is represented as y=−x/c+b. As a result, the coordinate of the intersection point C of the straight line 46 and the straight line 48 is given as [cb/(c²+1), c²b/(c²+1)].

As noted above, the interval between the surface-emission laser diode elements 2 and 8 and the interval between the surface-emission laser diode elements 8 and 14 are set to 24 μm, and because the diameter of the surface-emission laser diode elements 2, 8 and 14 is set to 16 μm, and because the line width of the interconnection pattern W8 is set to 8 μm, there holds b=24 μm and the distance between the points B and C becomes 8 μm. By using the relationship c=24 μm, the parameter c that provides the distance of 12 μm between the points B and C is given as a=3(2)$^{1/2}$.

As a result, the angle $θ_3$ between the straight line 46 and the x-axis becomes about 60 degrees. Because the straight line 47 is disposed in symmetry to the straight line 46 about the x-axis, the angle $θ_4$ formed by the straight line 47 with regard to the x-axis takes the value of also about 60 degrees. Thus, by defining the positive direction of the x-axis as 0 degree, the interconnection pattern W8 may be connected to the surface-emission laser diode element 8 from the direction forming an angle of −60 degrees to +60 degrees. Further, it should be noted that the interconnection pattern W8 may be connected to the surface-emission laser diode element 8 in the direction that forms the angle in the range of 120-240 degrees.

Each of the interconnection patterns W9-W11 and W14-W17, is provided similarly to the interconnection pattern W8 explained above.

In the case that the interval between the surface-emission laser diode elements aligned in the sub-scanning direction has the value other than 24 μm, the diameter of the mesa structure of the surface-emission laser diode elements 1-24 has the value other than 16 μm and that the line width of the interconnection patterns W1-W24 has the value other than 8 μm, the layout of the interconnection patterns W8-W11 and W14-W17 connected to the surface-emission laser diode elements 8-11 and 14-17 is determined similarly to the process explained above.

Further, while the foregoing explanation has been made for the case of disposing one or tow interconnection patterns between the surface-emission laser diode elements aligned in the main scanning direction without disposing the interconnection pattern between the surface-emission laser diode elements aligned in the sub-scanning direction, the present invention is also applicable to the case of disposing three or more interconnection patterns between the surface-emission laser diode elements aligned in the main scanning direction while not disposing an interconnection pattern between the surface-emission laser diode elements aligned in the sub-scanning direction. Further, the number of the interconnection patterns disposed between the surface-emission laser diode elements aligned in the main scanning direction is determined based on the size of the surface-emission laser array in the main scanning direction.

Further, in the case of disposing a single interconnection pattern between the surface-emission laser diode elements aligned in the main scanning direction in an array of plural surface-emission laser diode elements of m rows and n columns, m falls in the range of 2-4. Further, in the case of m=2 and n=3, there exists one surface-emission layer diode element in the inner region of the array, and the one interconnection pattern is provided between the two surface-emission laser diode elements adjacent with each other in the main scanning direction. Thus, in the case there exists an array of surface-emission laser diode elements of m rows and n columns with m being in the range of 2-4, at least one interconnection pattern is disposed between two surface-emission laser diode elements adjacent with each other in the main scanning direction.

In the foregoing, explanation has been made about the layout method of the interconnection patterns in the surface-emission laser array 100, 100A, 100B, 100C, 100D and 100E of Embodiment 1 enabling high density arrangement for the surface-emission laser diode elements by utilizing the array of the plural surface-emission laser diode elements. Thus, with the present embodiment, explanation has been made for the method of disposing plural interconnection patterns respectively connecting plural surface-emission laser diode elements to respective, corresponding pads in an array of plural surface-emission laser diode elements, by setting the interval of the surface-emission laser diode elements aligned in the sub-scanning direction to be narrower than the interval of the surface-emission laser diode elements aligned in the main scanning direction, by setting the number of the surface-emission laser diode elements aligned in the main scanning direction to be smaller than the number of the surface-emission laser diode elements aligned in the main scanning direction, such that plural straight lines drawn perpendicularly to the straight line extending in the sub-scanning direction from the respective centers of the plural surface-emission laser diode elements aligned in the main scanning direction, are formed with uniform interval in the sub-scanning direction.

However, the surface-emission laser array of Embodiment 2 is not limited to such a specific embodiment but also encompasses any surface-emission laser diode array that forms a high density array of surface-emission laser diode elements in which the interconnection pattern is not provided between the surface-emission laser diode elements aligned din the sub-scanning direction but is provided between the surface-emission laser diode elements aligned in the main scanning direction. In this case, the plural surface-emission laser diode elements are disposed such that the plural straight lines drawn perpendicularly to a straight line extending in the sub-scanning direction from respective centers of the plural surface-emission laser diode elements aligned in the main scanning direction are formed with uniform interval in the sub-scanning direction.

[Application]

FIG. 23 is a schematic diagram showing the construction of an optical scanning apparatus that uses the surface-emission laser array shown in FIG. 8.

Referring to FIG. 23, an optical scanning 500 includes an optical source 501, a coupling lens 502, an aperture 504, an anamorphic lens 503, a polygonal mirror 505, a deflector-side scanning lens 506, an image-side scanning lens 607, a glass dust cover 508, an image surface glass plate 508, an image surface 509, a sound proof glass 501, and a dummy mirror 511.

The optical source 501 comprises the surface-emission laser array 100B shown in FIG. 8. Thus, the optical source 501 produces 36 optical beams in the form of an optical beam bundle, wherein the optical beams thus formed are incident to the coupling lens 502 and converted therein to slightly divergent beams. The optical beams are then passed through an aperture and are incident to the anamorphic lens 503.

Each optical beam thus incident to the anamorphic lens 503 is then converted in the anamorphic lens to a parallel beam in the horizontal scanning direction, while with regard to the sub-scanning direction the anamorphic lens focuses the optical beam to the region in the vicinity of the polygonal mirror 505. Thereafter, the optical beams are indecent to the polygonal mirror 505 via the aperture 504, the dummy mirror 511 and the sound proof glass 510.

Further, the optical beams are deflected by the polygonal mirror are focused to the image surface 509 by the deflector-side scanning lens 506 and the image-side scanning lens 507 via the sound proof glass 508.

The optical source 501 and the coupling lens 502 are fixed upon the same member formed of aluminum.

Because the optical source 501 is formed of the surface-emission laser array 100B including therein the 10 surface-emission laser diode elements, 201-210, 211-220, 221-230, 231-240, such that the straight lines L15-L24 drawn perpendicularly to the straight line 42 from the respective centers of the 10 surface-emission laser diode elements, are formed with an equal interval in the sub-scanning direction, it becomes possible to realize a construction equivalent of the case in which the optical sources are aligned on the photosensitive body with an equal interval in the sub-scanning direction, by suitably adjusting the timing of turn-on for the 40 surface-emission laser diode elements 201-240.

Further, it is possible to adjust the interval of the recording dots in the sub-scanning direction by adjusting the interval C1 of the surface-emission laser diode elements 201-240 and the magnification of the optical system. Thus, in the case of using the surface-emission laser array 100B of 40 channels for the optical source 501, in which the device interval C2 is fixed to 2.4 μm as noted before, it is possible to attain the high-density writing of 4800 dpi (dot/inch) by setting the magnification of the optical system to about 2.2. Further higher wiring density is also possible by increasing the number of the surface-emission laser diode elements in the main scanning direction or by further decreasing the interval d between the adjacent surface-emission laser diode elements aligned in the sub-scanning direction and reducing the interval C2 further, or by lowering the magnification of the optical system. Thereby, higher printing quality is attained. In this case, the interval of writing in the main scanning direction can be easily controlled by adjusting the timing of turn-on of the optical source 501.

Thus, with the optical scanning apparatus 500, it is possible to write 40 dots at the same time, and with this, it becomes possible to achieve high-speed printing. Further, by increasing the number of the surface-emission laser diode elements in the surface-emission laser array 100B further, higher printing speed can be attained.

Further, by using the surface-emission laser diode element 1A in the surface-emission laser array 100B, the lifetime of the surface-emission laser array 100B is improved significantly, and it becomes possible to reuse the writing unit or optical source unit.

Further, with the optical scanning apparatus 500, it is possible to construct the optical source 501 by the surface-emission laser diode array 100A shown in FIG. 7. In this case, the surface-emission laser diode elements, 101, 109, 117 and 125, or 102, 110, 118 and 126, or 103, 111, 119 and 127, or 104, 112, 120 and 128, or 105, 113, 121 and 129, or 106, 114, 122 and 130, or 107, 115, 123 and 131, or 108, 116, 124 and 132, aligned in the sub-scanning direction are disposed with a separation of 18.4 μm, while the interval between the surface-emission laser diode elements, 101-108, or 109-116, or 117-124, or 125-132, aligned in the main scanning direction, is set to 30 μm. Further, in each of the surface-emission laser diode elements 101-132, the diameter of the optical emission region is set to 4 μm.

The date of the optical system used in the optical scanning apparatus 500 will presented below.

The both surfaces of the coupling lens 502 are represented by the equation below.

$$X = (h^2/R) \; [1 + \{1 - (1+K) \; (h/R)^2\}] + \qquad (1)$$
$$A4 \cdot h^4 + A6 \cdot h^6 + A8 \; h^8 + A10 \cdot h^{10}$$

In equation (1), it should be noted that x represents the X-coordinate (optical axis direction) of the lens surface, while h represents the distance from the optical axis (coordinate in the main scanning direction), and R represents a near axis curvature, K is a conic constant, and A4, A6, A8 and A10 are higher order coefficients.

In the first surface of the coupling lens 502, there holds the relationship: R=98.97 mm; K=−18.9; A4=−2.748510×10$^{-6}$; A6=7.513797×10$^{-7}$; A8=−5.817478×10$^{-8}$; and A10=−2.475370×10$^{-9}$.

In the second surface of the coupling lens 502, there holds the relationship: R=−31.07 mm; K=−0.35; A4=−1.210×10$^{-6}$; A6=6.782×10$^{-7}$; A8=2.523×10$^{-8}$; and A10=−4.670×10$^{-9}$.

Further, the coupling lens 502 has a refractive index of 1.5119. Here, d1 becomes 42.39 mm (d1=42.39 mm), and a cover glass having a refractive index of 1.5112 and a thickness of 0.3 mm is inserted therebetween Further, d2 is 3.8 mm (d2=3.8 mm).

The anamorphic lens 503 has a cylindrical surface having power in the sub-scanning direction for the first surface and a cylindrical surface having power in the main scanning direction for the second surface. The first surface has a radius of curvature of 55 mm in the sub-scanning direction and a radius of curvature of −500 mm in the main scanning direction. Here, d3 is 117.2 mm and d4 is 3 mm (d3=117.2 mm; d4=3 mm).

The aperture 504 is disposed at the location offset from the second surface of the anamorphic lens 503 in the side of the deflector-side scanning lens 506 by a distance of 58.2 mm and at the same time closer to the deflection-side scanning lens 506 as compared with the rear focal point of the coupling lens 502. Further, d5 is 120.2 mm (d5=120.2 mm).

Between the anamorphic lens 504 and the polygonal mirror 505, and between the polygonal mirro 505 and the deflector-side scanning lens 506, there is disposed a sound proof glass 510 of the thickness of 1.9 mm and the refractive index of 1.5112.

The polygonal mirror 505 is a four-face mirror having a radius of 7 mm for the inscribed circle. Further, there holds the relationship d6=36.7 mm; d7=101.9 mm; d9=3 mm; and d10=138.2 mm.

The dust proof glass 508 has a refractive index of 1.5112 and thickness of 1.9 mm.

Table 2 shows the radius of curvature, distance between optical elements, and refractive index, for various components constituting the optical system of the optical scanning apparatus 500.

TABLE 2

| | Rm | Rs | D | n |
|---|---|---|---|---|
| Optical Deflector (rotational axis) | — | — | 36.7 | — |
| Scanning lens 406 (first surface) | −110.142 | −472.788 | 8 | −1.524 |

TABLE 2-continued

|  | Rm | Rs | D | n |
|---|---|---|---|---|
| Scanning lens 406 (second surface) | −57.939 | −500. | 101.9 |  |
| Scanning lens 407 (first surface) | −5000. | 93.8 | 3 | 1.524 |
| Scanning lens 407 (second surface) | 724.16 | −60.71 | 138.2 |  |
| Scanning surface | — | — | — | — |

In Table 2, it should be noted that $R_m$ represents the near axis radius of curvature in the main scanning direction, $R_s$ represents the near axis radius of curvature in the sub-scanning direction, D represents the distance between optical elements, all represented in terms of millimeters.

In each of the deflector-side scanning lens 506 and the image-side scanning lens 507, the surfaces are formed of a non-spherical surface of the shape of non-circular arc defined by equation (1) in the main scanning direction, wherein it should be noted that the surfaces are the surface of special form that changes the radius of curvature according to equation (2) below within the sub-scanning cross-sectional plane (a hypothetical cross-section taken parallel to the optical axis and further to the sub-scanning direction.

The equation that represents the change of the radius of curvature $C_s(Y)$ (Y being the coordinate in the main scanning direction as measured from the origin set to the optical axis) in the main scanning direction within the sub-scanning cross-sectional plane, wherein the equation includes the radius of curvature $R_s(0)$ defined for the sub-scanning cross-sectional plane that includes the optical axis and further the coefficients B1-B3.

$$C_s(Y)=1/R_s(0)+B_1 \cdot Y+B_2 \cdot Y^2+B_3 \cdot Y^3+B_4 \cdot Y^4+B_5 \cdot Y^5+B_6 \cdot Y^6+ \quad (2)$$

Table 3 shows the coefficients for the incident-side surface of the deflector-side scanning lens 506.

TABLE 3

| Coefficient (main scanning direction) |  | Coefficient (sub-scanning direction) |  |
|---|---|---|---|
| K | 0.000000+00 | $B_1$ | 0 |
| $A_4$ | −3.87482 × 10⁻⁷ | $B_2$ | 0 |
| $A_6$ | 6.88714 × 10⁻¹⁰ | $B_3$ | 0 |
| $A_8$ | −3.02912 × 10⁻¹³ | $B_4$ | 0 |
| $A_{10}$ | −1.381964 × 10⁻¹⁶ | $B_5$ | 0 |
| $A_{12}$ | 4.973160 × 10⁻²⁰ | $B_6$ | 0 |
|  |  | $B_7$ | 0 |
|  |  | $B_8$ | 0 |

Table 4 shows the coefficients for the exit-side surface of the deflector-side scanning lens 506.

TABLE 4

| Coefficient (main scanning direction) |  | Coefficient (sub-scanning direction) |  |
|---|---|---|---|
| K | 0.000000+00 | $B_1$ | 6.44465 × 10⁻⁶ |
| $A_4$ | 1.46716 × 10⁻⁷ | $B_2$ | −2.76702 × 10⁻⁶ |

TABLE 4-continued

| Coefficient (main scanning direction) |  | Coefficient (sub-scanning direction) |  |
|---|---|---|---|
| $A_6$ | 2.24364 × 10⁻¹⁰ | $B_3$ | −1.17939 × 10⁻⁸ |
| $A_6$ | −1.24578 × 10⁻¹⁴ | $B_4$ | −7.27004 × 10⁻⁹ |
| $A_{10}$ | 5.54989 × 10⁻¹⁸ | $B_5$ | 3.88316 × 10⁻¹¹ |
| $A_{12}$ | −8.15818 × 10⁻²⁰ | $B_6$ | −5.12653 × 10⁻¹² |
|  |  | $B_7$ | −3.86625 × 10⁻¹⁴ |
|  |  | $B_8$ | 1.12285 × 10⁻¹⁴ |

Table 5 shows the coefficients for the incident-side surface of the image-side scanning lens 507.

TABLE 5

| Coefficient (main scanning direction) |  | Coefficient (sub-scanning direction) |  |
|---|---|---|---|
| K | 0.000000+00 | $B_1$ | 4.98759 × 10⁻⁷ |
| $A_4$ | 9.47700 × 10⁻⁸ | $B_2$ | −9.40784 × 10⁻⁷ |
| $A_6$ | −7.06270 × 10⁻¹² | $B_3$ | 5.11005 × 10⁻¹¹ |
| $A_8$ | 1.70056 × 10⁻¹⁶ | $B_4$ | 7.50683 × 10⁻¹¹ |
| $A_{10}$ | −6.11408 × 10⁻²⁰ | $B_5$ | −5.15221 × 10⁻¹⁵ |
| $A_{12}$ | 3.00776 × 10⁻²⁴ | $B_6$ | −4.81012 × 10⁻¹⁵ |
|  |  | $B_7$ | −1.46189 × 10⁻¹⁹ |
|  |  | $B_8$ | 7.21434 × 10⁻¹⁹ |
|  |  | $B_{10}$ | −2.53749 × 10⁻²³ |

Further, Table 6 shows the coefficients for the exit-side surface of the image-side scanning lens 507.

TABLE 6

| Coefficient (main scanning direction) |  | Coefficient (sub-scanning direction) |  |
|---|---|---|---|
| K | 0.000000+00 | $B_1$ | 0 |
| $A_4$ | −5.56255 × 10⁻⁸ | $B_2$ | 2.09875 × 10⁻⁷ |
| $A_6$ | 5.42541 × 10⁻¹² | $B_3$ | 0 |
| $A_8$ | −6.15064 × 10⁻¹⁶ | $B_4$ | 0 |
| $A_{10}$ | −2.44542 × 10⁻²⁰ | $B_5$ | 0 |
| $A_{12}$ | 1.76451 × 10⁻²⁴ | $B_6$ | 0 |
|  |  | $B_7$ | 0 |
|  |  | $B_8$ | 0 |

Here, it is assumed that the aperture 504 has a rectangular shape having the size of 5.5 mm in the main scanning direction and 1.18 mm in the sub-scanning direction.

Table 7 shows the beam spot size.

TABLE 7

| Image height (mm) | Main scan (μm) | Sub-scan (μm) |
|---|---|---|
| −161.5 | 54.12 | 56.48 |
| −150 | 53.49 | 55.90 |
| −100 | 53.54 | 55.65 |
| −50 | 52.80 | 54.71 |
| 0 | 52.33 | 54.08 |
| 50 | 52.86 | 54.73 |
| 100 | 53.51 | 55.67 |
| 150 | 53.38 | 55.88 |
| 161.5 | 54.24 | 56.46 |

The aberrations are corrected satisfactorily, and it can be seen from the results of Table 7 indicating that the beam spot is corrected satisfactorily.

In this case, there holds |βm|=4.9 and |βs|=2.3 when the lateral magnification in the main scanning direction is designated as βm and the lateral magnification in the sub-scanning direction is designated as βs between the optical source (=surface-emission laser array 100B) and the scanning surface, and there holds the relationship |βm|>|βs|.

Thus, it is possible to attain the scanning line interval of 4800 dpi on the scanning surface.

Thus, by using the surface-emission laser array 100B of the present invention for the optical source 502, it is possible to achieve high scanning density for the scanning lines.

Further, with the optical scanning apparatus 500, the optical source 501 may be formed of any of the surface-emission laser arrays 100, 100A, 100C, 100D, 100E, 200, 200A, 200B, 200C, 200D and 200E, in place of the surface-emission laser array 100B.

Figure 24:
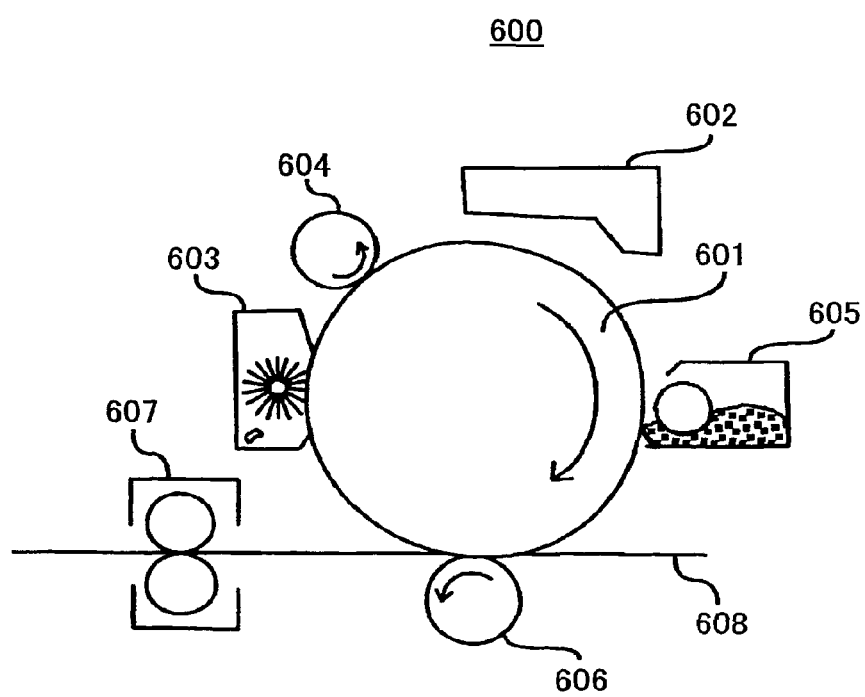
FIG. 24 is a schematic diagram showing a laser printer.

FIG. 24 is a schematic diagram showing a laser printer.

Referring to FIG. 24, a laser printer 600 comprises a photosensitive drum 601, an optical scanning apparatus 602, a charging unit 604, a developing unit 605, a transfer unit 606 and a fixing unit 607.

Thereby, the optical scanning unit 602, the cleaning unit 603, the charging unit 604, the developing unit 605, the transfer unit 606 and the fixing unit 607 are disposed around the photosensitive drum 601.

The optical scanning apparatus 602 comprises the optical scanning apparatus 500 shown in FIG. 23 and forms a latent image on the photosensitive drum 601 by using plural laser beams according to the process explained before. The cleaning unit 603 removes the toners remaining on the photosensitive drum 601.

The charging unit 604 charges the surface of the photosensitive drum 601. The developing unit 605 provides the toners on the surface of the photosensitive drum 601 and causes toner developing of the latent image formed thereon by the optical scanning apparatus 602.

The transfer unit 606 transfers the toner image. The fixing unit 607 fixes the transferred toner image.

When a series of operations is started with the laser printer 600, the charging unit 604 charges the surface of the photosensitive drum 601 and forms a latent image on the photosensitive drum by using the plural laser beams. Further, the developing unit 605 applies the toner developing to the latent image formed by the optical scanning apparatus 602, while the transfer unit 606 transfers the toner image thus developed. Further the fixing unit 607 fixes the transferred toner image. With this, the toner image is transferred upon a recording sheet 608, wherein the toner image is thermally fixed upon the recording sheet 608 by the fixing unit 607, and with this formation of an electrophotographic image is completed.

On the other hand, there is provided a discharging unit (not shown) for erasing the latent image on the photosensitive drum 601, and the cleaning unit 603 removes the toners remaining on the photosensitive drum 601. With this, a series of operations are completed, while it is possible to provide a large number of electrophotographic images continuously and at high speed by repeating the foregoing processes.

It should be noted that the laser printer 60 constitutes "image forming apparatus".

Figure 25:
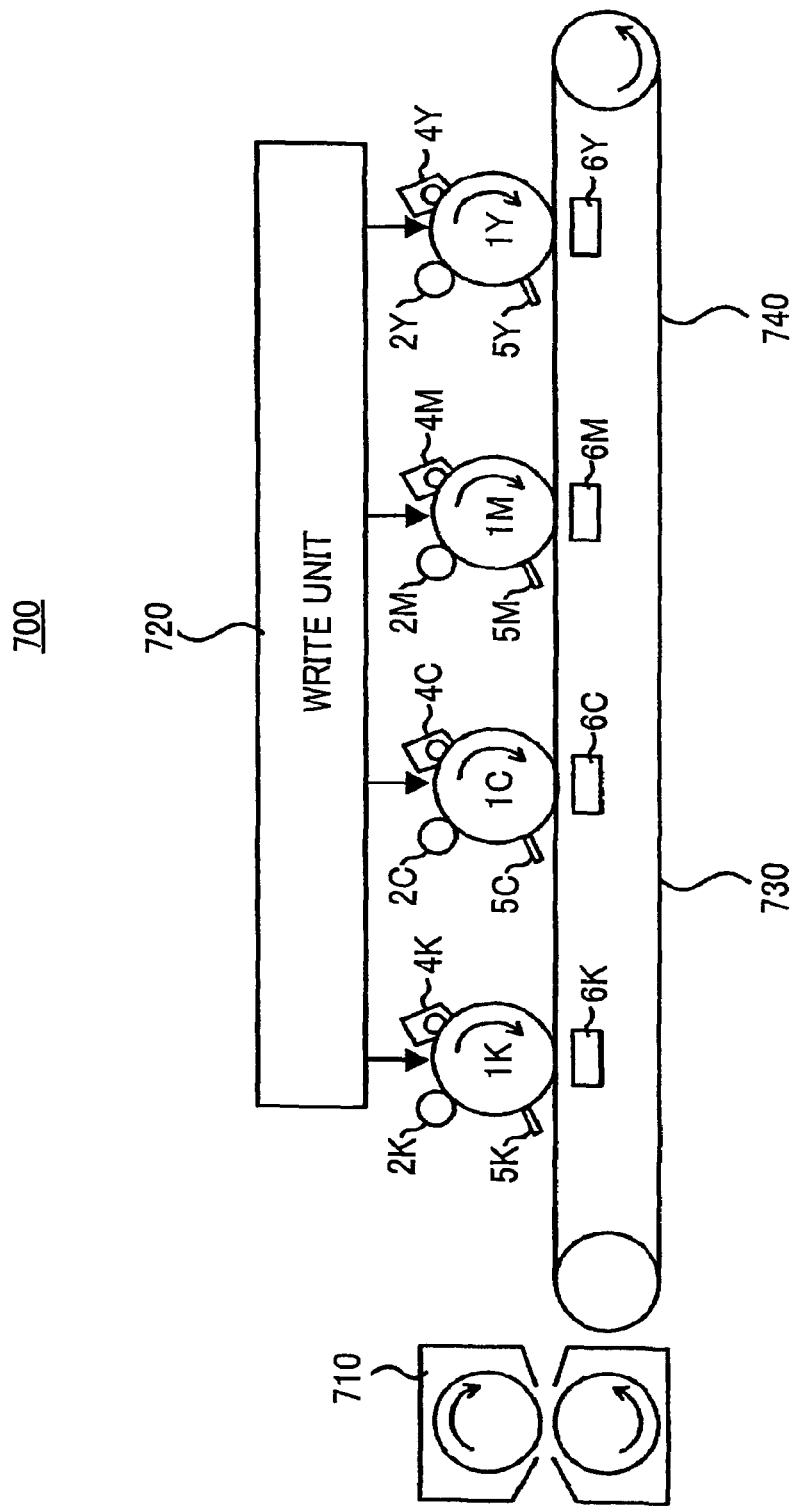
FIG. 25 is a schematic diagram of an image forming apparatus.

FIG. 25 is a schematic diagram of an image forming apparatus.

Referring to FIG. 25, an image forming apparatus 700 comprises photosensitive bodies 1Y, 1M, 1C and 1K, charging units 2Y, 2M, 2C and 2K, developing units 4Y, 4M, 4C and 4K, cleaning units 5Y, 5M, 5C and 5K, transfer charging units 6Y, 6M, 6C and 6K, a fixing unit 710, a wiring unit 720 and a transfer belt 730. Here, Y represents yellow, M represents magenta, C represents cyan, and K represents black.

The photosensitive bodies 1Y, 1M, 1C and 1K are rotated respectively in the direction of respective arrows, and there are provided the charging units 2Y, 2M, 2C and 2K, the developing units 4Y, 4M, 4C and 4K, the transfer charging units 6Y, 6M, 6C and 6K, and the cleaning units 5Y, 5M, 5C and 5K, respectively in the direction of rotation.

The charging units 2Y, 2M, 2C and 2K are charging members respectively charging the surfaces of the photosensitive bodies 1Y, 1M, 1C and 1K uniformly. Thereby, electrostatic images are formed on the respective surfaces of the photosensitive bodies 1Y, 1M, 1C and 1K for the parts thereof located respectively between the charging units 2Y, 2M, 2C and 2K and the developing units 4Y, 4M, 4C and 4K by the writing unit 720 (=Optical scanning apparatus 500). Further, the developing units 4Y, 4M, 4C and 4K form a toner image on the surface of the photosensitive bodies 1Y, 1M, 1C and 1K based on the electrostatic images. Further, the transfer charging units 6Y, 6M, 6C and 6K cause transfer of the toner images of the respective colors to the recording sheet 740, and the color toner images thus transferred are finally fixed upon the recording sheet 740 by the fixing unit 710.

While there can be cases in which the color images are not properly aligned because of mechanical error, or the like, the image forming apparatus 700, being capable of forming high-density images, can easily attend to such a problem of color misalignment by changing the order of turning on the plurality of surface-emission laser diode elements in the surface-emission laser array used for the writing unit 720.

[Embodiment 3]

Figure 26:
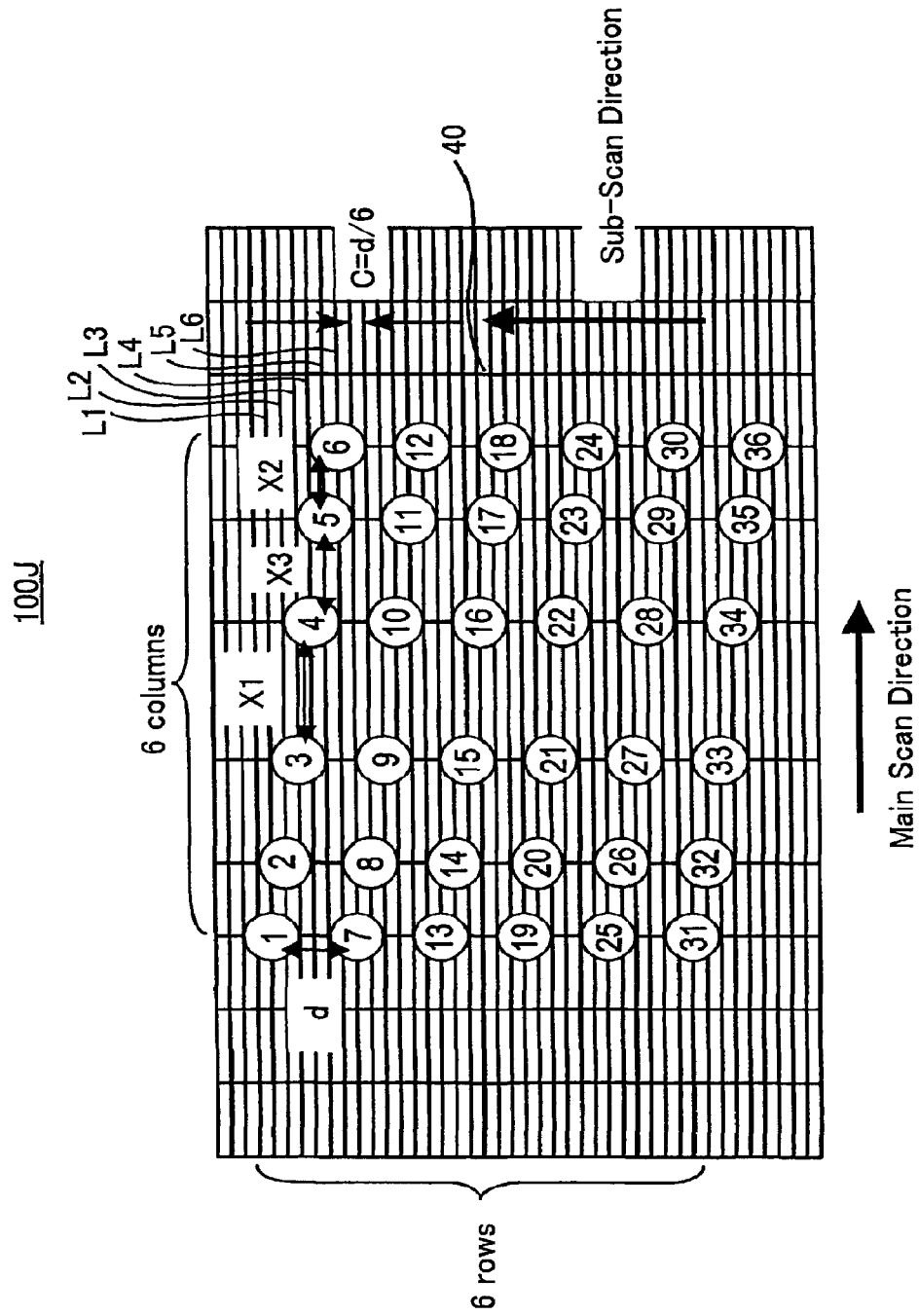
FIG. 26 is a plan view diagram of a surface-emission laser array according to Embodiment 3 of the present invention.

FIG. 26 is a plan view diagram of a surface-emission laser array 100J according to Embodiment 3 of the present invention.

Referring to FIG. 26, the surface-emission laser array 100J comprises the surface-emission laser diode elements 1-36 each formed of the surface-emission laser diode elopement 1 explained with reference to FIGS. 2 and 3 or the surface-emission laser diode element 1A explained with reference to FIGS. 5 and 6, of the previous embodiment.

Similarly to the surface-emission laser diode array 100 of the preceding embodiment, the surface-emission laser diode elements 1-36 are disposed two-dimensionally in the form of six rows and six columns. Thereby, the six surface-emission laser diode elements, 1, 7, 13, 19, 25 and 31, or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, are aligned in the sub-scanning direction, while the six of the surface-emission laser diode elements, 1-6, or 7-12, or 13-18, or 14-24, or 25-30, or 31-36, are aligned in the main scanning direction.

Thereby, it should be noted that the six surface-emission laser diode elements, 1-6, or 7-12, or 13-18, or 14-24, or 25-30, or 31-36, aligned in the main scanning direction, are disposed with stepwise displacement in the sub-scanning direction. As a result, 36 laser beams are emitted from the 36 surface-emission laser diode elements 1-36 without causing overlapping.

Further, it should be noted that the six surface-emission laser diode elements, 1-6, or 7-12, or 13-18, or 14-24, or 25-30, or 31-36, are aligned in the main scanning direction with an interval X1 for two adjacent surface-emission laser diode elements in the central part of the surface-emission laser array 100, while the interval between two mutually adjacent surface-emission laser diode elements is set to X2 (<X1) in the peripheral part of the surface-emission laser array 100. Thus, the interval between the surface-emission layer diode elements 3 and 4, or 9 and 10, or 15 and 16, or 21 and 22, or 27 and 28, or 33 and 34, disposed in the central part of the surface-emission laser array 100J, is set to the interval X1, while the interval between the surface-emission laser diode elements 1 and 2, or 5 and 6, or 7 and 8, or 11 and 12, or 13 and 14, or 17 and 18, or 19 and 20, or 23 and 24, or and 26, or 29 and 30, or 31 and 32, or 35 and 36, disposed in the peripheral part of the surface-emission laser array 100 is set to the interval X2. Further, the interval between the surface-emission laser diode elements 2 and 3, or 4 and 5, or 8 and 9, or 10 and 11, or 14 and 15, or 16 and 17, or 20 and 21, or 22 and 23, or 26 and 27, or 28 and or 29, or 32 and 33, or 34 and 35, is set to an interval X3 intermediate of the interval X1 and the interval X2.

In this case, the interval X1 is set larger than the interval in which the 36 surface-emission laser diode elements are aligned with equal interval in the sub-scanning direction and in the main scanning direction, while the interval X2 is set smaller than the interval in which the 36 surface-emission laser diode elements are aligned with equal interval in the sub-scanning direction and in the main scanning direction. Further, the interval X1 is set for example to 50 μm, while the interval X2 is set for example to 25 μm, and the interval X3 is set for example to 35 μm.

Further, with the six surface-emission laser diode elements, 1, 7, 13, 19, 25 and 31, or 2, 8, 14, 20, 26 and 32, or 3, 9, 15, 21, 27 and 33, or 4 10, 16, 22, 28 and 34, or 5, 11, 17, 23, 29 and 35, or 6, 12, 18, 24, 30 and 36, aligned in the sub-scanning direction, the interval between two adjacent surface-emission laser diode elements is set constant and to the interval d. Here, d may be set for example to 30 μm (d=30 μm).

With this construction, it should be noted that six straight lines L1-L6 drawn perpendicularly to the straight line 40 extending in the sub-scanning direction from respective centers of the six surface-emission laser diode elements 1-6, which are aligned in the main scanning direction, are formed with an equal interval C in the sub-scanning direction, wherein the interval C is determined as C=d/6. In the example shown in FIG. 26, C=30/6=5 μm.

Likewise, the sixth straight lines drawn perpendicularly to the straight line 40 from the respective centers of the six surface-emission laser diode elements, 7-12, or 13-18, or 19-24, or 25-30, and 31-36, which are aligned in the main-scanning direction, are formed with an equal interval equal to the interval C in the sub-scanning direction.

Thus, with the surface-emission laser array 100J, the six surface-emission laser diode elements 1, 7, 13, 19, 25 and 31, or 2, 8, 14, 20 and 26, or 3, 9, 15, 21, 27 and 33, or 4, 10, 16, 22, 28 or 34, or 5, 11, 17, 23, 29 or 35, or 6, 12, 18, 24, 30 and 36, are disposed with equal interval d, while the six surface-emission laser diode elements 1-6, or 7-12, or 13-18, or 14-24, or 25-30, or 31-36, are disposed such that the interval between the two adjacent surface-emission laser diode elements increases from the peripheral part to the central part of the surface-emission laser array 100.

Thus, with the surface-emission laser array 100J, the interval between two surface-emission laser diode elements of the 6 surface-emission laser diode elements aligned in the main scanning direction changes depending on the location on the main scanning direction and takes a large value at the central part of the surface-emission laser array 100 as compared with the peripheral part thereof.

In one example, the interval between the surface-emission laser diode elements 13-14 (peripheral part) is narrower than the interval between the surface-emission laser diode elements 15-16 (central part). Further, the interval between the surface-emission laser diode elements 26 and 31 (peripheral part) is narrower than the interval between the surface-emission laser diode elements 16-21 (central part).

As a result, the thermal effect caused in the surface-emission laser diode elements disposed in the central part of the surface-emission laser array 100J by the surface-emission laser diode elements disposed in the peripheral part is reduced, and the temperature distribution in the surface-emission laser array 100 at the time the 36 surface-emission laser diode elements 1-36 are operated simultaneously in the surface-emission laser array 100J is made more uniform as compared with the case of disposing the 36 surface-emission laser diode elements with the same interval in the sub-scanning direction and in the main scanning direction. With this, it becomes possible to make the output characteristics of the 36 surface-emission laser diode elements uniform. Further, it becomes possible to lower the temperature of the surface-emission laser diode elements 15, 16, 21 and 22, which tend to experience severest temperature rise in the surface-emission laser array 100, and it becomes possible to extend the lifetime of the surface-emission laser array 100.

Further, because the interval X1 is set larger than the interval between the surface-emission laser diode elements for the case in which the 36 surface-emission laser diode elements are aligned in the sub-scanning direction and in the main-scanning direction with equal interval and because the interval X2 is set narrower than the interval for the case in which the 36 surface-emission laser diode elements are aligned in the sub-scanning direction and in the main-scanning direction with equal interval, it becomes possible with the present embodiment to reduce the area occupied by the surface-emission laser diode elements 1-36 as compared with the case in which the 36 surface-emission laser diode elements are aligned in the sub-scanning direction and in the main-scanning direction the equal interval. As a result, it becomes possible to reduce the aberration of the optical system such as collimate lens, in the case when the surface-emission laser diode array 100J is used for the optical source of optical writing, as compared with the case in which the 36 surface-emission laser diode elements are provided in the sub-scanning direction and in the main scanning direction with equal interval. Further, because it is possible to suppress the temperature rise of the surface-emission laser diode elements 15, 16, 21 and 22 at the central part of the surface-emission laser array 100J while reducing the area thereof, it becomes possible to suppress the effect of aberration of the optical system such as lenses, and clear images are formed by using the surface-emission laser diode array 100J for the image forming apparatus. Further, the lifetime of the surface-emission laser array 100J is extended, while this enables reuse of the optical unit used for the optical writing, and it becomes possible to reduce the environment load.

In the main scanning direction, the interval between two adjacent surface-emission laser diode elements changes depending on the location on the main scanning direction with the present embodiment, while the interval is constant for those surface-emission laser diode elements aligned in the sub-scanning direction. Thus, the six surface-emission laser diode elements 1-6, or 7-12, or 13-18, or 19-24, or 25-30, or 31-36, are aligned generally in the main scanning direction along an S-shaped curve.

[Embodiment 4]

Figure 27:
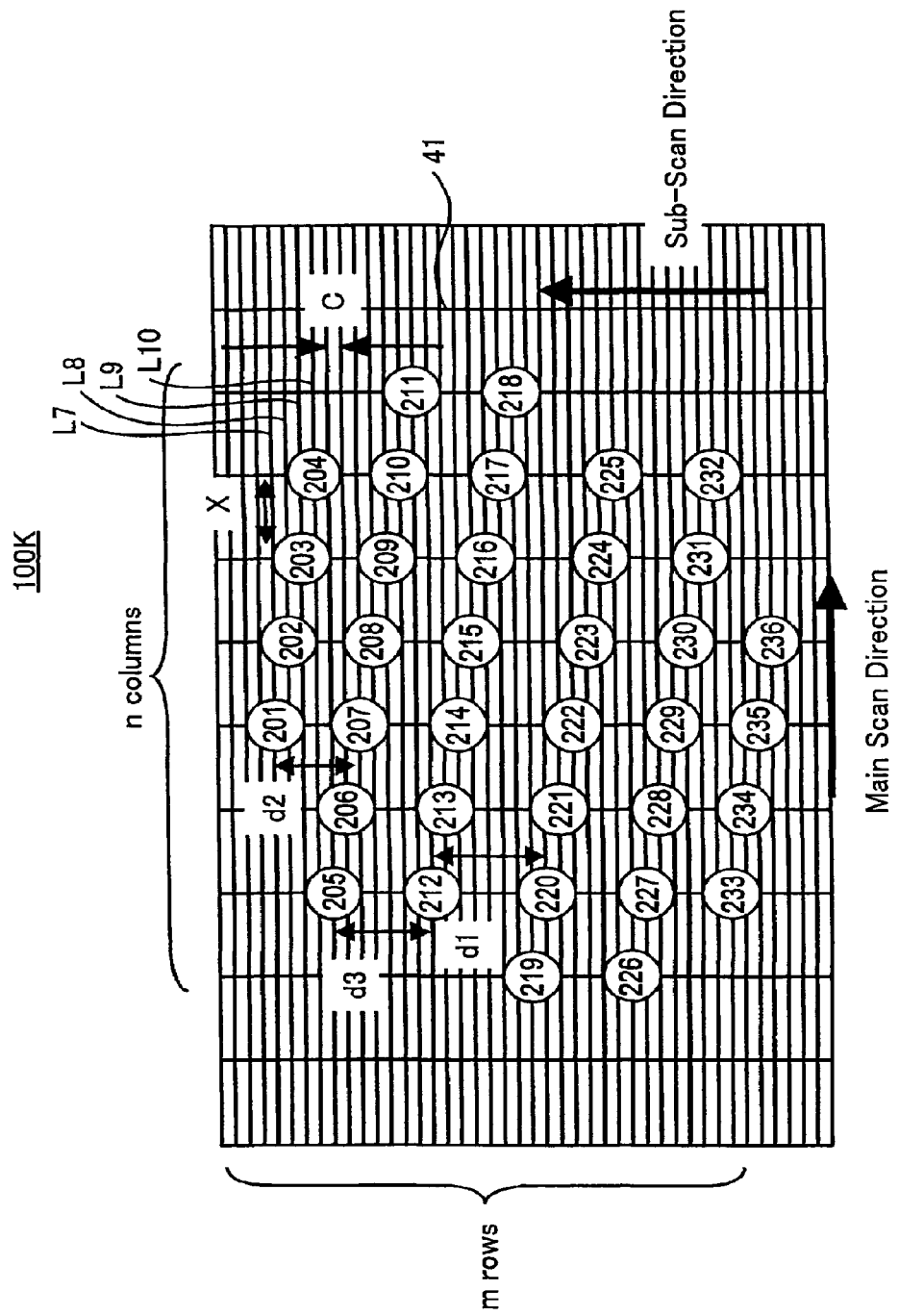
FIG. 27 is a plan view diagram of the surface-emission laser array according to Embodiment 4 of the present invention.

FIG. 27 is a plan view diagram of the surface-emission laser array 100K according to Embodiment 4 of the present invention.

Referring to FIG. 27, the surface-emission laser array 100K comprises surface-emission laser diode elements 201-236 of the construction identical to those of the surface-emission laser diode 1 of FIGS. 2 and 3 or the surface-emission laser diode 1A of FIGS. 5 and 6.

Therein, the two surface-emission laser diode elements, 219 and 226, or 211 and 218, or the five surface-emission laser diode elements 203, 209, 216, 224 and 231, or 204, 210, 217, 225 and 232, or 205, 212, 220, 227 and 233, or the six surface-emission laser diode elements 201, 207, 214, 222, 229 and 235, or 202, 208, 215, 223, 230 and 236, are aligned in the sub-scanning direction, and the four surface-emission laser diode elements, 201-204, 233-236, or the seven surface-emission laser diode elements, 205-211, 212-218, 219-225, and 226-232, are aligned in the main scanning direction.

Thereby, it should be noted that the four surface-emission laser diode elements, 201-204, or 233-236, and the seven surface-emission laser diode elements, 205-211, 212-218, 219-225 and 226-232, aligned in the main scanning direction, are disposed with stepwise displacement in the sub-scanning direction. As a result, 36 laser beams are emitted from the 36 surface-emission laser diode elements 201-236 without causing overlapping.

The interval between the four surface-emission laser diode elements 201-204 or 233-236, or the interval between the seven surface-emission laser diode elements, 205-211, or 212-218, or 219-225, or 226-232, is set to the equal interval X in the main scanning direction. Here, the interval X may be set for example to 30 μm.

Further, in the two surface-emission laser diode elements, 219 and 226, or 211 and 218, or in the five surface-emission laser diode elements 203, 209, 216, 224 and 231, or 204, 210, 217, 225 and 232, or 205, 212, 220, 227 and 232, or in the six surface-emission laser diode elements 201, 208, 214, 222, 229 and 235, or 202, 208, 215, 223, 230 and 236, the interval between two adjacent surface-emission laser diode elements is set to an interval d1 in the central part of the surface-emission laser array 100K, while in the peripheral part, the interval is set to an interval d2. Thus, the interval between the surface-emission layer diode elements 212 and 220, or 213 and 221, or 214 and 222, or 215 and 223, or 216 and 224, or 217 and 225, disposed in the central part of the surface-emission laser array 100K, is set to the interval d1, while the interval between the surface-emission laser diode elements 201 and 207, or 202 and 208, or 203 and 209, or 204 and 210, or 227 and 233, or 228 and 234, or 229 and 235, or 230 and 236, disposed in the peripheral part of the surface-emission laser array 100K is set to the interval d2. Further, the interval between the surface-emission laser diode elements 205 and 212, or 206 and 213, or 207 and 214, or 208 and 215, or 209 and 216, or 210 and 217, or 211 and 218, or 219 and 226, or 220 and 227, or 221 and or 228, or 222 and 229, or 223 and 230, or 224 and 231, or 225 and 232, is set to an interval d3 intermediate of the interval d1 and the interval d2.

In this case, the interval d1 is set larger than the interval in which the 36 surface-emission laser diode elements are aligned with equal interval in the sub-scanning direction and in the main scanning direction, while the interval d2 is set smaller than the interval in which the 36 surface-emission laser diode elements are aligned the equal interval in the sub-scanning direction and in the main scanning direction. Further, the interval d1 is set for example to 40 μm, while the interval d2 is set for example to 30 μm, and the interval X3 is set for example to 35 μm.

With this construction, it should be noted that four straight lines L7-L10 drawn perpendicularly to the straight line 41 extending in the sub-scanning direction from respective centers of the four surface-emission laser diode elements 201-204, which are aligned in the main scanning direction, are formed with an equal interval C in the sub-scanning direction.

Likewise, the seven straight lines drawn perpendicularly to the straight line 41 from the respective centers of the seven surface-emission laser diode elements, 205-211, 212-218, or 219-225, or 226-232, also aligned in the main-scanning direction, are formed with an equal interval equal to the interval C in the sub-scanning direction.

Likewise, the four straight lines, drawn perpendicularly to the straight line 41 from the respective centers of the four surface-emission laser diode elements, 233-236, also aligned in the main-scanning direction, are formed with an equal interval equal to the interval C in the sub-scanning direction.

With the surface-emission laser diode array 100K, in which plural surface-emission laser diode elements are aligned in the main scanning direction to form eight columns, the interval C is determined as d1/8=40/8=5 μm.

Further, with the surface-emission laser array K, the number of the surface-emission laser diode elements aligned in the main scanning direction changes depending on the location in the sub-scanning direction.

Thus, with the surface-emission laser array 100K, the four surface-emission laser diode elements, 201-204 or 233-236, and the seven surface-emission laser diode elements, 205-211, or 212-218, or 219-225, or 226-232, aligned in the main scanning direction, are disposed the equal interval X, while in the array of two surface-emission laser diode elements, 219 and 226, or 211 and 218, or in the array of five surface-emission laser diode elements 203, 209, 216, 224 and 231, or 204, 210, 217, 225 and 232, or 205, 212, 220 and 227 and 233, or in the array of six surface-emission laser diode elements, 201, 207, 214, 222, 229 and 235, or 202, 208, 215, 223, 230 and 236, the surface-emission laser diode elements are aligned in the sub-scanning direction such that the interval between two adjacent surface-emission laser diode elements increases from the peripheral part to the central part of the surface-emission laser array 100K.

Thus, with the surface emission laser diode array K, the interval between the surface-emission laser diode elements in the array of two surface-emission laser diode elements, 219 and 226, or 211 and 218, or in the array of five surface-emission laser diode elements, 203, 209, 216, 224 and 231, or 204, 210, 217, 225 and 232, or 205, 212, 220, 227 and 232, or in the array of six surface-emission laser diode elements, 201, 208, 214, 222, 229 and 235, or 202, 208, 215, 223, 230 and 236, is set such that that the interval is large in the central part of the surface-emission laser diode array 100A as compared with the peripheral part thereof.

In one example, the interval between the surface-emission laser diode elements 213-214 (peripheral part) is narrower than the interval between the surface-emission laser diode elements 215-221 (central part).

As a result, the thermal effect caused in the surface-emission laser diode elements disposed in the central part of the surface-emission laser array 100K by the surface-emission laser diode elements disposed in the peripheral part is reduced, and the temperature distribution in the surface-emission laser array at the time the 36 surface-emission laser diode elements 201-236 are operated simultaneously in the surface-emission laser array 100K is made more uniform as compared with the case of disposing the 36 surface-emission laser diode elements with the same interval in the sub-scanning direction and in the main scanning direction. With this, it becomes possible to make the output characteristics of the 36 surface-emission laser diode elements uniform. Further, it becomes possible to lower the temperature of the surface-emission laser diode elements 214, 215, 222 and 223, which tend to experience severest temperature rise in the surface-emission laser array 100K, and it becomes possible to extend the lifetime of the surface-emission laser array 100K.

Further, because the interval d1 is set larger than the interval for the case in which the 36 surface-emission laser diode elements are aligned in the sub-scanning direction and in the main-scanning direction with equal interval and because the interval X2 is set narrower than the interval for the case in which the 36 surface-emission laser diode elements are aligned in the sub-scanning direction and in the main-scanning direction the equal interval, it becomes possible with the present embodiment to reduce the area occupied by the surface-emission laser diode elements 201-236 as compared with the case in which the 36 surface-emission laser diode elements are aligned in the sub-scanning direction and in the main-scanning direction with equal interval. As a result, it becomes possible to reduce the aberration of the optical system such as collimate lens, in the case when the surface-emission laser diode array 100K is used for the optical source of optical writing, as compared with the case in which the 36 surface-emission laser diode elements are provided in the sub-scanning direction and in the main scanning direction with equal interval. Further, because it is possible to suppress the temperature rise of the surface-emission laser diode elements 214, 215, 222 and 223 at the central part of the surface-emission laser array 100K while reducing the area thereof, it becomes possible to suppress the effect of aberration of the optical system such as lenses, and clear images are formed by using the surface-emission laser diode array 100K for the image forming apparatus. Further, the lifetime of the surface-emission laser array 100K is extended, while this enables reuse of the optical unit used for the optical writing, and it becomes possible to reduce the environment load.

Figure 28:
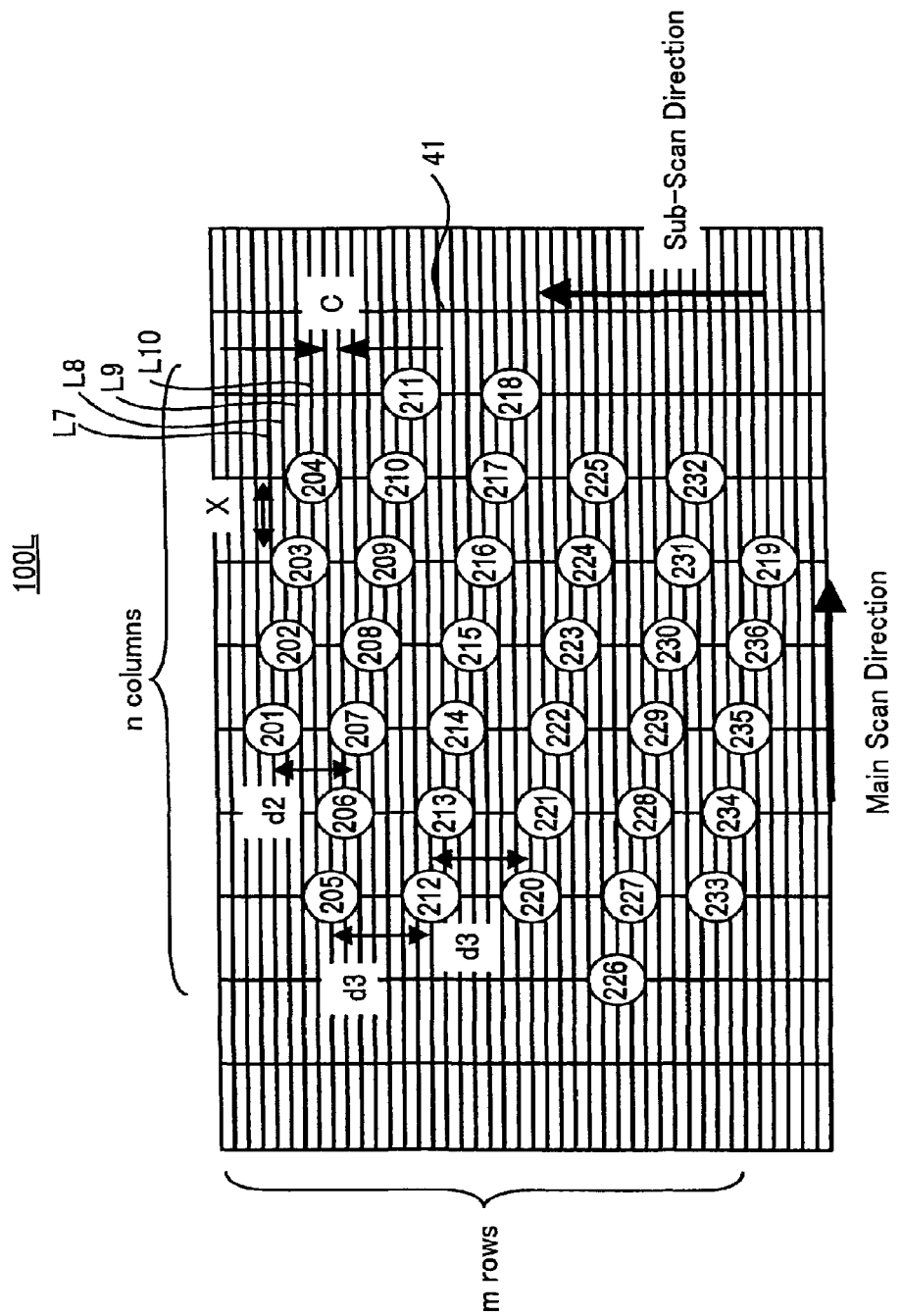
FIG. 28 is another plan view diagram of the surface-emission laser array according to Embodiment 4 of the present invention.

FIG. 28 is another plan view diagram of the surface-emission laser array according to Embodiment 4 of the present invention. Here, the surface-emission laser array of Embodiment 4 may be a surface-emission laser array 100L shown in FIG. 28.

Referring to FIG. 28, the surface-emission laser array 100L has a construction similar to that of the surface-emission laser array 100K, except that the surface-emission laser diode element 219 of the surface-emission laser array 100K shown in FIG. 27 is moved to underside of the surface-emission laser diode element 231 in the plane of the drawing and the interval between the surface-emission laser diode elements 212 and 220, or 213 and 221, or 214 and 222, or 215 and 223, or 216 and 224, or 217 and 225, to the interval d3. With the surface-emission laser array 100L, too, the same effect as the surface-emission laser array 100J is attained.

Each of the surface-emission laser diode elements 201-236 shown in FIGS. 27 and 28 is formed of the surface-emission laser diode element 1 shown in FIGS. 2 and 3 or the surface-emission laser diode element 1A shown in FIGS. 5 and 6.

Otherwise, the present embodiment is identical to Embodiment 4.

[Embodiment 5]

Figure 29:
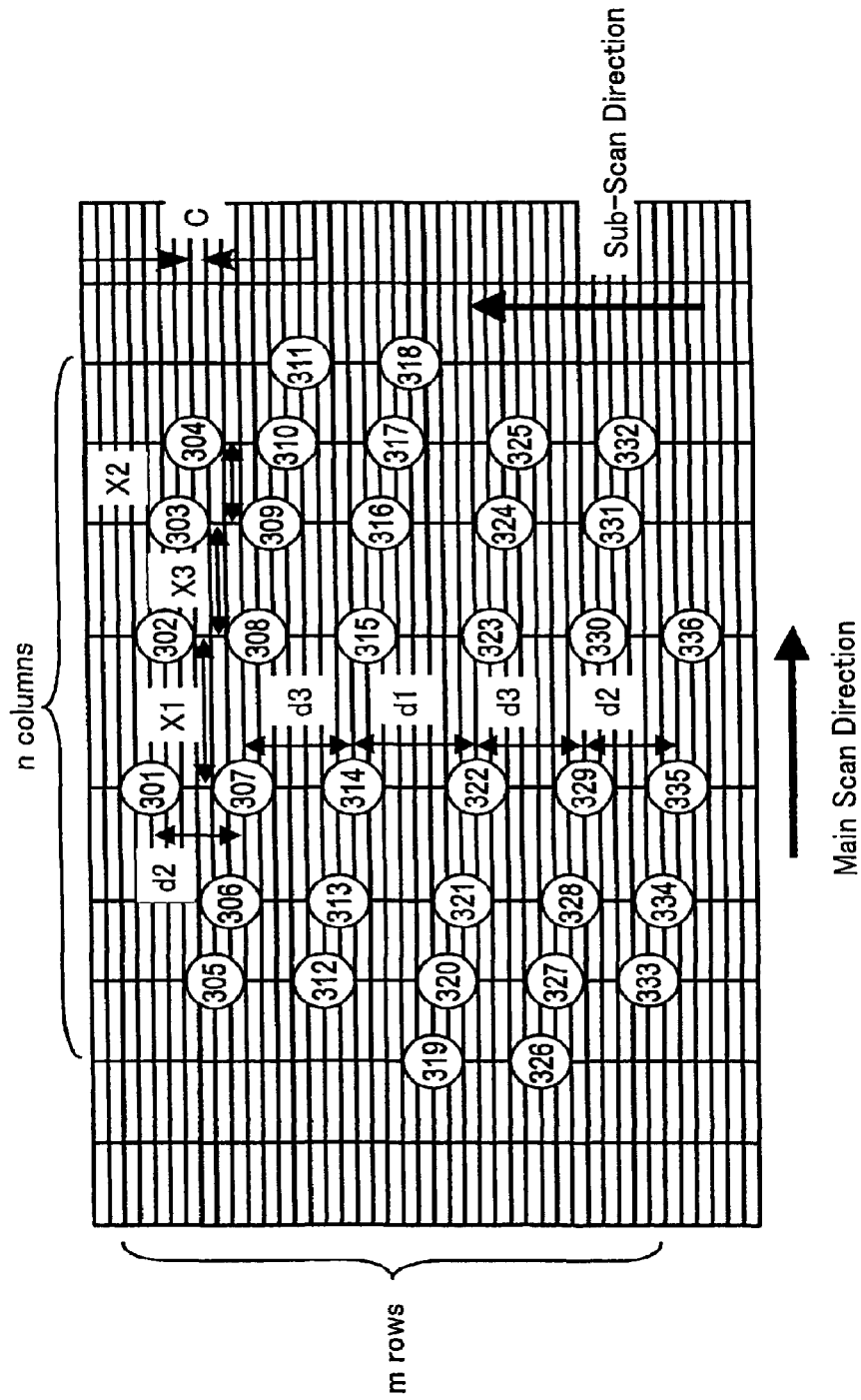
FIG. 29 is a plan view diagram of the surface-emission laser array according to Embodiment 5 of the present invention.

FIG. 29 is a plan view diagram of the surface-emission laser array 100M according to Embodiment 5 of the present invention.

Referring to FIG. 29, the surface-emission laser array 100M of Embodiment 5 includes surface-emission laser diode elements 301-336.

It should be noted that the surface-emission laser array 100M has a construction similar to that of the surface-emission laser diode array 100K (see FIG. 27) except that the interval between the surface-emission laser diode elements in the main scanning direction of the surface-emission laser array 100K is set to the interval X1 in the central part thereof and to the interval X2 in the peripheral part of the surface-emission laser array 100K.

Thus, with the surface-emission laser array 100M, the number of the surface-emission laser diode elements aligned in the main scanning direction changes depending on the location on the sub-scanning direction, while the number of the surface-emission laser diode elements aligned in the sub-scanning direction changes depending on the location on the main scanning direction.

Thus, with the surface-emission laser array 100M, the interval between the surface-emission laser diode elements in the plane direction disposed in the central part becomes larger than the interval between the surface-emission laser diode elements in the plane direction disposed in the peripheral par for both of the main scanning direction and sub-scanning direction.

As a result, the thermal effect of the surface-emission laser diode elements disposed in the peripheral part exerted on the surface-emission laser diode elements disposed at the central part can be reduced as compared with any of the surface-emission laser arrays 100J and 100K. With this, uniformity in the characteristics of the 36 surface-emission laser diode elements 301-336 is improved further. Further, because the temperature of the surface-emission laser diode elements 314, 315, 322 and 323, which tend to experience severest temperature rise in the surface-emission laser array 100M, is decreased with the present embodiment, it becomes possible to extend the lifetime of the surface-emission laser array 100M. Further, because it is possible to suppress the temperature rise of the surface-emission laser diode elements 314, 315, 322 and 323 at the central part of the surface-emission laser array 100L while reducing the area thereof, it becomes possible to suppress the effect of aberration of the optical system such as lenses, and clear images can be formed by using the surface-emission laser diode array 100M for the image forming apparatus. Further, the lifetime of the surface-emission laser array 100M is extended, while this enables reuse of the optical unit used for the optical writing, and it becomes possible to reduce the environment load.

Figure 30:
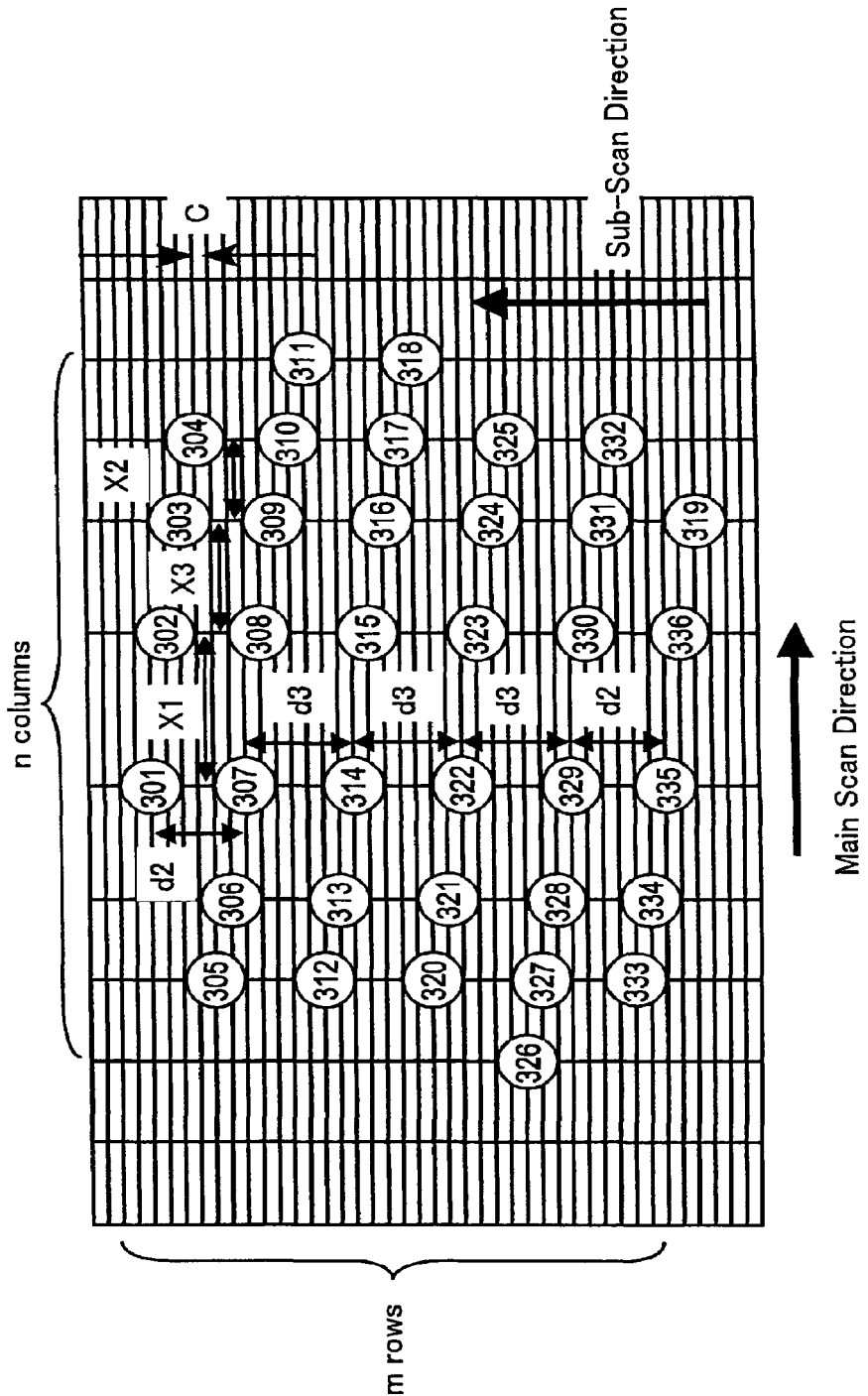
FIG. 30 is another plan view diagram of the surface-emission laser array according to Embodiment 5 of the present invention.

FIG. 30 is a plan view diagram showing another construction of the surface-emission laser array 100M according to Embodiment 5 of the present invention.

Here, the surface-emission laser array of Embodiment 5 may be a surface-emission laser array 100N shown in FIG. 30.

Referring to FIG. 30, the surface-emission laser array 100N has a construction similar to that of the surface-emission laser array 100M, except that the surface-emission laser diode element 319 of the surface-emission laser array 100M shown in FIG. 29 is moved to underside of the surface-emission laser diode element 331 in the plane of the drawing and the interval between the surface-emission laser diode elements 312 and 320, or 313 and 321, or 314 and 322, or 315 and 323, or 316 and 324, or 317 and 325, is set to the interval d3. With the surface-emission laser array 100N, too, the same effect as the surface-emission laser array 100M is attained.

Each of the surface-emission laser diode elements 301-336 shown in FIGS. 29 and 30 may be formed of the surface-emission laser diode element 1 shown in FIGS. 2 and 3 or the surface-emission laser diode element 1A shown in FIGS. 5 and 6.

Otherwise, the present embodiment is identical to Embodiment 3.

[Embodiment 6]

Figure 31:
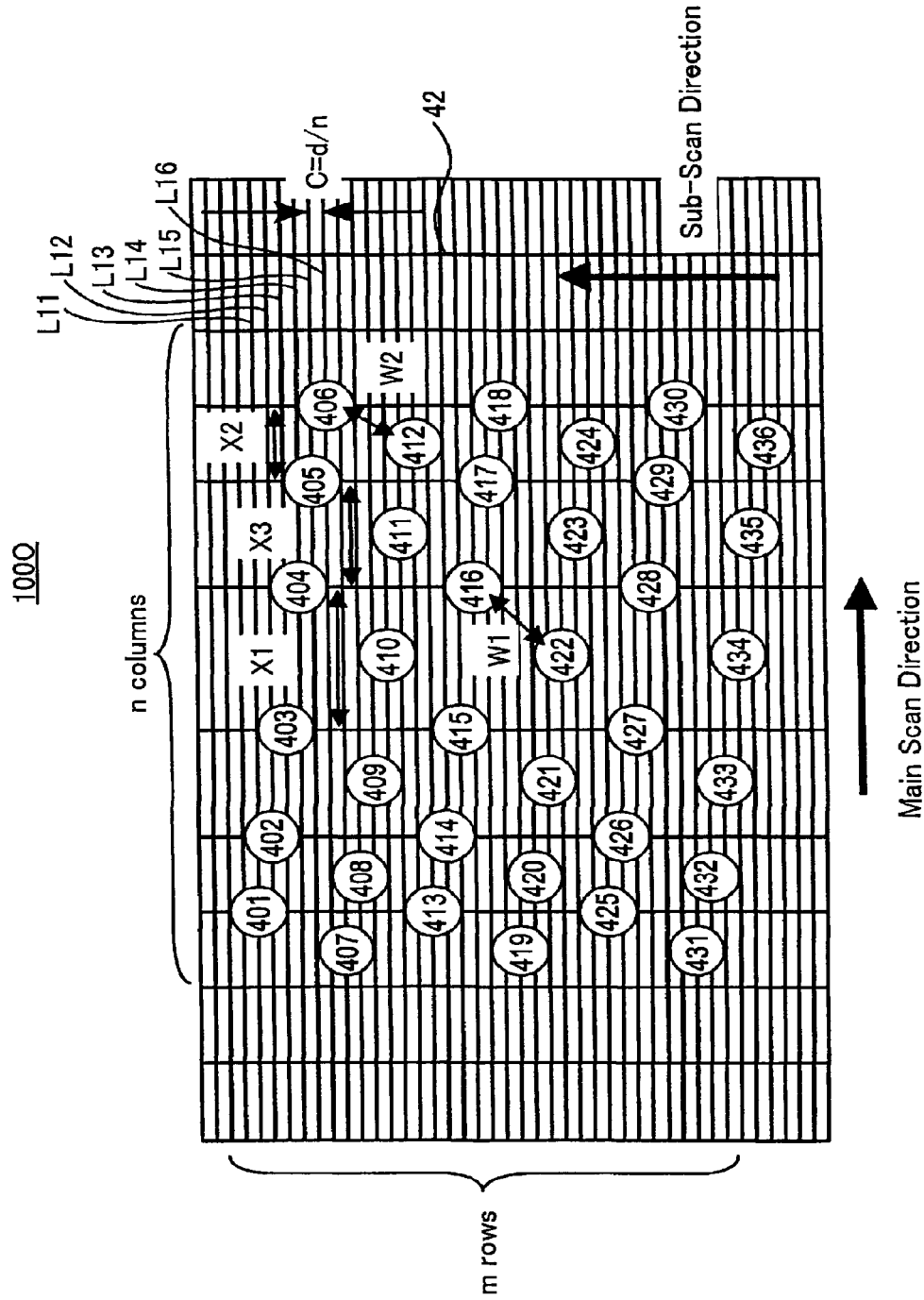
FIG. 31 is a plan view diagram of the surface-emission laser array according to Embodiment 6 of the present invention.

FIG. 31 is a plan view diagram of the surface-emission laser array 100O according to Embodiment 6 of the present invention.

Referring to FIG. 31, the surface-emission laser array 100O of Embodiment 6 includes surface-emission laser diode elements 401-436.

The surface-emission laser elements 401-436 are disposed two-dimensionally in the form of array of six rows and six columns Thereby, the six surface-emission laser diode elements, 401, 407, 413 and 419, 425 and 431, or 402, 408, 414, 420, 426 and 432, or 403, 409, 415 and 421, 427 and 433, or 404, 410, 416, 422, 428 and 434, or 405, 411, 417, 423, 429 or 435, or 406, 412, 418, 424, 430 and 436, are aligned in the sub-scanning direction but with a zigzag pattern, while the six of the surface-emission laser diode elements, 401-406, or 407-412, or 413-418, or 414-424, or 425-430, or 431-436, are aligned in the main scanning direction.

Thereby, it should be noted that the six surface-emission laser diode elements, 401-406, or 407-412, or 413-418, or 414-424, or 425-430, or 431-436, aligned in the main scanning direction, are disposed with stepwise displacement in the sub-scanning direction. As a result, 36 laser beams are emitted from the 36 surface-emission laser diode elements 401-436 without causing overlapping.

Further, it should be noted that the six surface-emission laser diode elements, 401-406, or 407-412, or 413-418, or 414-424, or 425-430, or 431-436, are aligned in the main scanning direction with an interval X1 for two adjacent surface-emission laser diode elements in the central part of the surface-emission laser array 100O, while the interval between two mutually adjacent surface-emission laser diode elements is set to X2 in the peripheral part of the surface-emission laser array 100O. Thus, the interval between the surface-emission layer diode elements 403 and 404, or 409 and 410, or 415 and 416, or 421 and 422, or 427 and 428, or 433 and 434, disposed in the central part of the surface-emission laser array 100O, is set to the interval X1, while the interval between the surface-emission laser diode elements 401 and 402, or 405 and 406, or 407 and 408, or 411 and 412, or 413 and 414, or 417 and 418, or 419 and 420, or 423 and 424, or 425 and 426, or 429 and 430, or 431 and 432, or 435 and 436, disposed in the peripheral part of the surface-emission laser array 100O is set to the interval X2. Further, the interval between the surface-emission laser diode elements 402 and 403, or 404 and 405, or 408 and 409, or 410 and 411, or 414 and 415, or 416 and 417, or 420 and 421, or 422 and 423, or 426 and 427, or 428 and or 429, or 432 and 433, or 434 and 435, is set to an interval X3 intermediate of the interval X1 and the interval X2.

With this construction, it should be noted that six straight lines L1-L6 drawn perpendicularly to the straight line 42 extending in the sub-scanning direction from respective centers of the six surface-emission laser diode elements 401-406, which are aligned in the main scanning direction, are formed with an equal interval C in the sub-scanning direction, wherein the interval C is determined as C=d/6.

Likewise, the sixth straight lines drawn perpendicularly to the straight line 42 from the respective centers of the six surface-emission laser diode elements, 407-412, or 413-418, or 419-424, or 425-430, and 431-436, which are aligned in the main-scanning direction, are formed with an equal interval equal to the interval C in the sub-scanning direction.

Each of the six surface-emission laser diode elements 401-406 aligned in the main scanning direction in the first row is disposed between two adjacent surface-emission laser diode elements of the six surface-emission laser diode elements 407-412 aligned in the main scanning direction in the second row.

More specifically, the surface-emission laser diode elements 401 is disposed between the surface-emission laser diode elements 407 and 408, the surface-emission laser diode elements 402 is disposed between the surface-emission laser diode elements 408 and 409, the surface-emission laser diode elements 403 is disposed between the surface-emission laser diode elements 409 and 410, the surface-emission laser diode elements 404 is disposed between the surface-emission laser diode elements 410 and 411, and the surface-emission laser diode elements 405 is disposed between the surface-emission laser diode elements 411 and 412.

Similarly, the six surface-emission laser diode elements 407-412, or 413-418, or 419-424, or 425-430, or 431-436, disposed in the main scanning direction in other rows are disposed similarly to the six surface-emission laser diode elements.

Thus, with the surface-emission laser diode array 100O, each of the plural surface-emission laser diode elements disposed in the main scanning direction in the first position of the sub-scanning direction is disposed between the two surface-emission laser diode elements of the plural surface-emission laser diode elements aligned in the main scanning direction at the second position adjacent to the first position of the sub-scanning direction.

Further, it should be noted that the surface-emission laser array 100O has a construction corresponding to the one in which the six surface-emission laser diode elements disposed in the second row, fourth row and sixth row in the surface-emission laser array 100J (see FIG. 26) are displaced in the right direction on the plane of the drawing.

As a result, with the surface-emission laser array 100O, the interval W1 between the two surface-emission laser diode elements disposed in the central part is wider than the interval W2 between the two surface-emission laser diode elements disposed in the peripheral part.

Thus, with the surface-emission laser array 100M, the interval between the surface-emission laser diode elements in the plane direction disposed in the central part becomes larger than the interval between the surface-emission laser diode elements in the plane direction disposed in the peripheral par for both of the main scanning direction and sub-scanning direction.

As a result, the thermal effect of the surface-emission laser diode elements disposed in the peripheral part exerted on the surface-emission laser diode elements disposed at the central part can be reduced as compared with any of the surface-emission laser arrays 100J and 100K. With this, uniformity in the characteristics of the 36 surface-emission laser diode elements 401-436 is improved further. Further, it becomes possible to lower the temperature of the surface-emission laser diode elements 415, 416, 422, which tend to experience severest temperature rise in the surface-emission laser array 100O, and it becomes possible to extend the lifetime of the surface-emission laser array 100O. Further, because it is possible to suppress the temperature rise of the surface-emission laser diode elements 415, 416, 422 at the central part of the surface-emission laser array 100O while reducing the area thereof, it becomes possible to suppress the effect of aberration of the optical system such as lenses, and clear image is formed by using the surface-emission laser diode array 100O for the image forming apparatus. Further, the lifetime of the surface-emission laser array 100O is extended, while this enables reuse of the optical unit used for the optical writing, and it becomes possible to reduce the environment load.

In the foregoing, while explanation has been made to displace the six surface-emission laser diode elements disposed in the first row, the third row and the fifth row or the six surface-emission laser diode elements disposed on the second row, fourth row and the sixth row, the present invention is not limited to such a specific construction but the six surface-emission laser diode elements in each row may be displaced in different directions depending on the row.

Otherwise, the present embodiment is identical to Embodiment 3.

[Embodiment 7]

Figure 32:
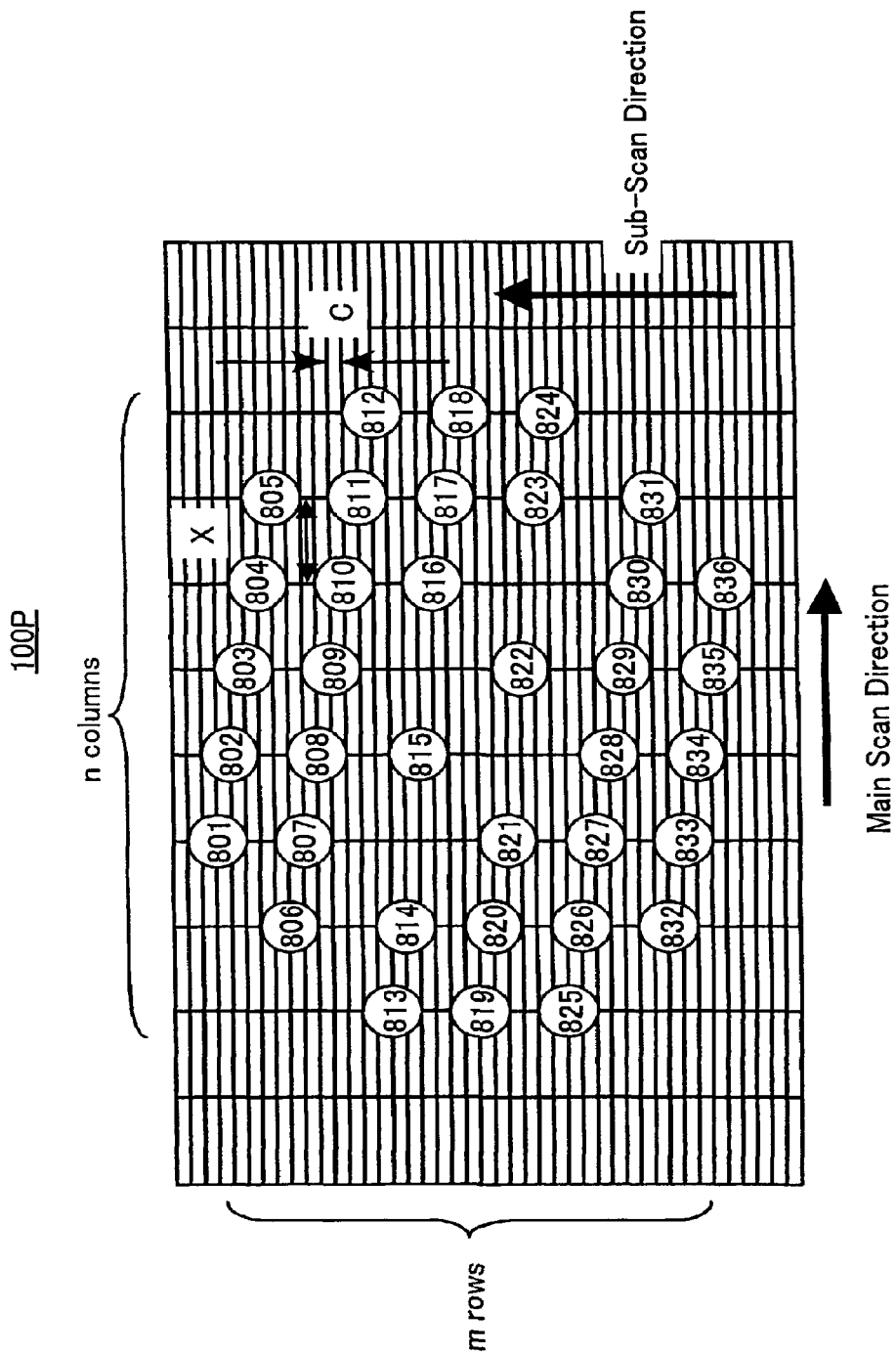
FIG. 32 is a plan view diagram of the surface-emission laser array according to Embodiment 7 of the present invention.

FIG. 32 is a plan view diagram of the surface-emission laser array 100P according to Embodiment 7 of the present invention.

Referring to FIG. 32, the surface-emission laser array 100P of Embodiment 7 includes surface-emission laser diode elements 801-836.

Therein, three surface-emission laser diode elements 813, 819 and 825, or 812, 818 and 824, and five surface-emission laser diode elements 801, 807, 821 and 833, or 802, 808, 815, 828 and 834, or 803, 809, 822, 829 and 835, or 804, 810, 816, 830 and 836, or 805, 811, 817, 823 and 831, or 806, 814, 820, 826 and 832, are aligned in the sub-scanning direction, while the five of the surface-emission laser diode elements 801-805 or 832 and 836, the six of the surface-emission laser diode elements 813-818 or 819-824, and the seven of the surface-emission laser diode elements 806-812 or 825-831, are aligned in the main scanning direction.

Thereby, it should be noted that the five surface-emission laser diode elements, 801-805, the six surface-emission laser diode elements 813-818 or 819-824, and the seven surface-emission laser diode elements, 806-812 or 825-831, aligned in the main scanning direction, are disposed with stepwise displacement in the sub-scanning direction. As a result, 36 laser beams are emitted from the 36 surface-emission laser diode elements 801-836 without causing overlapping.

The surface-emission laser diode elements 801-814, 816-821 and 823-836, disposed in the peripheral part of the surface-emission laser array 100P, are formed with an equal interval X.

Further, at the central part of the surface-emission laser array 100p, it should be noted that the interval between the two adjacent surface-emission laser diode elements in the plane direction is set wider than the interval of the two adjacent surface-emission laser diode elements of the peripheral part in the plane direction.

In one example, the interval between the surface-emission laser diodes elements 803-804 (peripheral part) is narrower than the interval between the surface-emission laser diode elements 815-816 (central part).

Thus, the surface-emission laser array 100P corresponds to the surface-emission laser array in which plural surface-emission laser diode elements are aligned in the main scanning direction with the equal interval X, wherein a part of the surface-emission laser diode elements located at the central part are moved to the peripheral part.

More specifically, the surface-emission laser array 100P corresponds to the surface-emission laser array in which the surface-emission laser diode element existing between the surface-emission laser diode elements 814 and 815, the surface-emission laser diode element existing between the surface-emission laser diode elements 815 and 816 aligned in the main scanning direction, the surface-emission laser diode element existing between the surface-emission laser diode elements 821 and 822 aligned in the main scanning direction, and the surface-emission laser diode element existing between the surface-emission laser diode elements 822 and 823 aligned in the main scanning direction, are displaced to the peripheral region of the surface-emission laser array.

Thus, with the surface-emission laser array 100P, the interval between the surface-emission laser diode elements in the plane direction disposed in the central part becomes larger than the interval between the surface-emission laser diode elements in the plane direction disposed in the peripheral par for both of the main scanning direction and sub-scanning direction.

In other words, with such a construction, the surface-emission laser diode elements are sparse in the central part of the surface-emission laser array as compared with the peripheral part thereof.

As a result, the thermal effect of the surface-emission laser diode elements disposed in the peripheral part exerted on the surface-emission laser diode elements disposed at the central part can be reduced as compared with any of the surface-emission laser arrays 100J and 100K. With this, uniformity in the characteristics of the 36 surface-emission laser diode elements 801-836 is improved further. Further, it becomes possible to lower the temperature of the surface-emission laser diode elements 815, 816, 822, which tend to experience severest temperature rise in the surface-emission laser array 100P, and it becomes possible to extend the lifetime of the surface-emission laser array 100P. Further, because it is possible to suppress the temperature rise of the surface-emission laser diode elements 815, 816 and 822 at the central part of the surface-emission laser array 100P while reducing the area thereof, it becomes possible to suppress the effect of aberration of the optical system such as lenses, and clear image is formed by using the surface-emission laser diode array 100O for the image forming apparatus. Further, the lifetime of the surface-emission laser array 100P is extended, while this enables reuse of the optical unit used for the optical writing, and it becomes possible to reduce the environment load.

While explanation has been made in the foregoing Embodiments 3-7 for the case of the surface-emission laser array including therein 36 surface-emission laser diode elements, the present invention is not limited to such a specific example and the surface-emission laser array may include the surface-emission laser diode elements exceeding 37. Further, the surface-emission laser diode elements may be disposed as desired as long as the interval therebetween falls in the scope of Embodiments 3-7.

[Embodiment 8]

Next, a surface-emission laser array 100Q according to Embodiment 8 will be described with reference to FIGS. 33-37.

The surface-emission laser array 100Q includes 40 surface-emission laser diode elements in such a manner that there are provided plural columns of the surface-emission diode elements each extending in a direction corresponding to the sub-scanning direction (designated hereinafter simply as S-direction) and including therein plural surface-emission laser diode elements, and in such a manner that the eight such columns are provided in a direction corresponding to the main scanning direction designated hereinafter simply as M-direction to form a row and column formation.

In the S-direction, the 40 surface-emission laser diode elements are provided with the equal interval C.

Here, it should be noted that the columns of the surface-emission diode elements are designated as first column L1, second column L2, third column L3, fourth column L4, fifth column L5, sixth column L6, seventh column L7 and eighth column L8 from the left to the right of each drawing (FIGS. 33-37) for the purpose of distinguishing the plural columns from each other. This is merely for convenience.

In the M-direction, the interval between the first column L1 and the second column L2 is set to X4, the interval between the second column L2 and the third column L3 is set to X3, the interval between the third column L3 and the fourth column L4 is set to X2, the interval between the fourth column L4 and the fifth column L5 is set to X1, the interval between the fifth column L5 and the sixth column L6 is set to X2, the interval between the sixth column L6 and the seventh column L7 is set to X3, and the interval between the seventh column L7 and the eight column L8 is set to X4, wherein there holds the relationship X1>X2>X3>X4. Thus, the interval between two, mutually adjacent columns of the surface-emission laser diode elements located at the central part of the array is set larger than the interval between two, mutually adjacent columns located at the edge side of array of the surface-emission laser diode elements.

Figure 33:
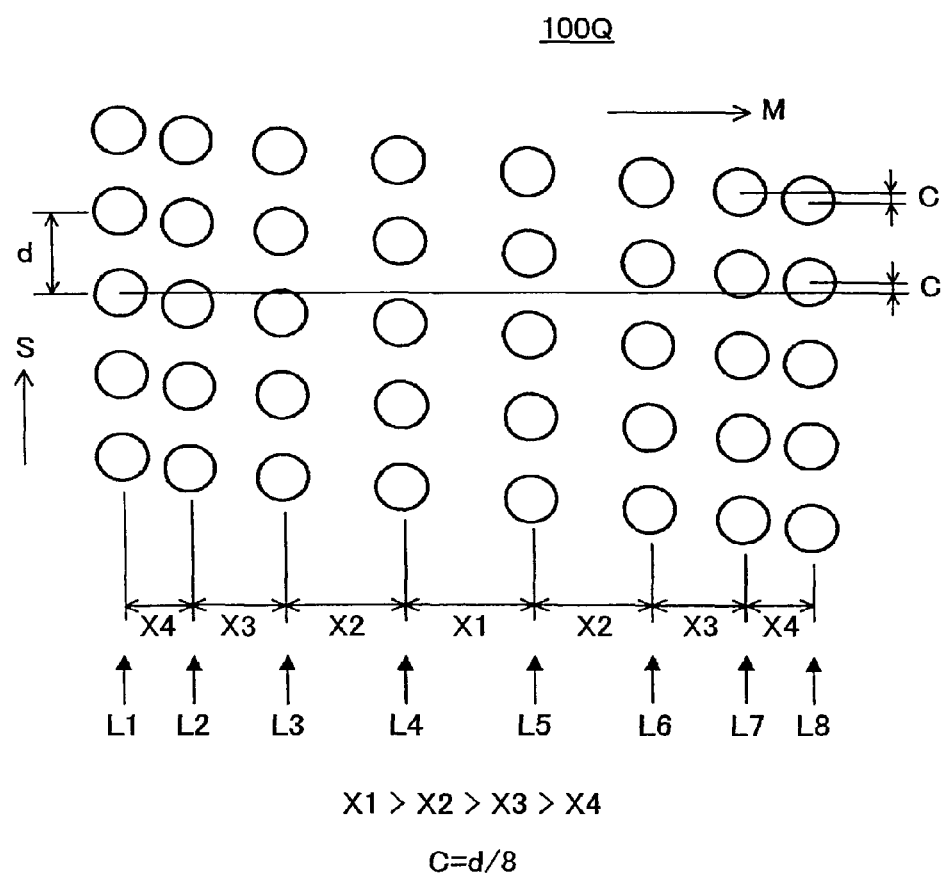
FIG. 33 is a plan view diagram of the surface-emission laser array according to Embodiment 8 of the present invention.

FIG. 33 is a plan view diagram of the surface-emission laser array 100Q according to Embodiment 8 of the present invention.

With the surface-emission laser array 100Q, it can be seen that there are provided eight columns of surface-emission laser diode elements in the M-direction, wherein each column includes therein five surface-emission laser diode elements aligned in the S-direction with the interval d. Thus, the number of the columns is larger than the number of the surface-emission laser diode elements constituting one column.

Further, the interval between two nearest surface-emission laser diode elements is set to C in two, mutually adjacent columns.

More specifically, X1=56 μm, X2=46 μm, X3=36 μm, X4=26 μm, d=35.6 μm, and C=4.4 μm. The interval d is set smaller than the interval X1.

While the interval d is larger than the interval X4, the present invention is not limited to such a relationship. With such a construction, thermal interference, and hence temperature rise, is smaller in the peripheral part of the surface-emission laser array as compared with the central part, it is possible to set the interval d smaller than the interval X1.

Figure 34:
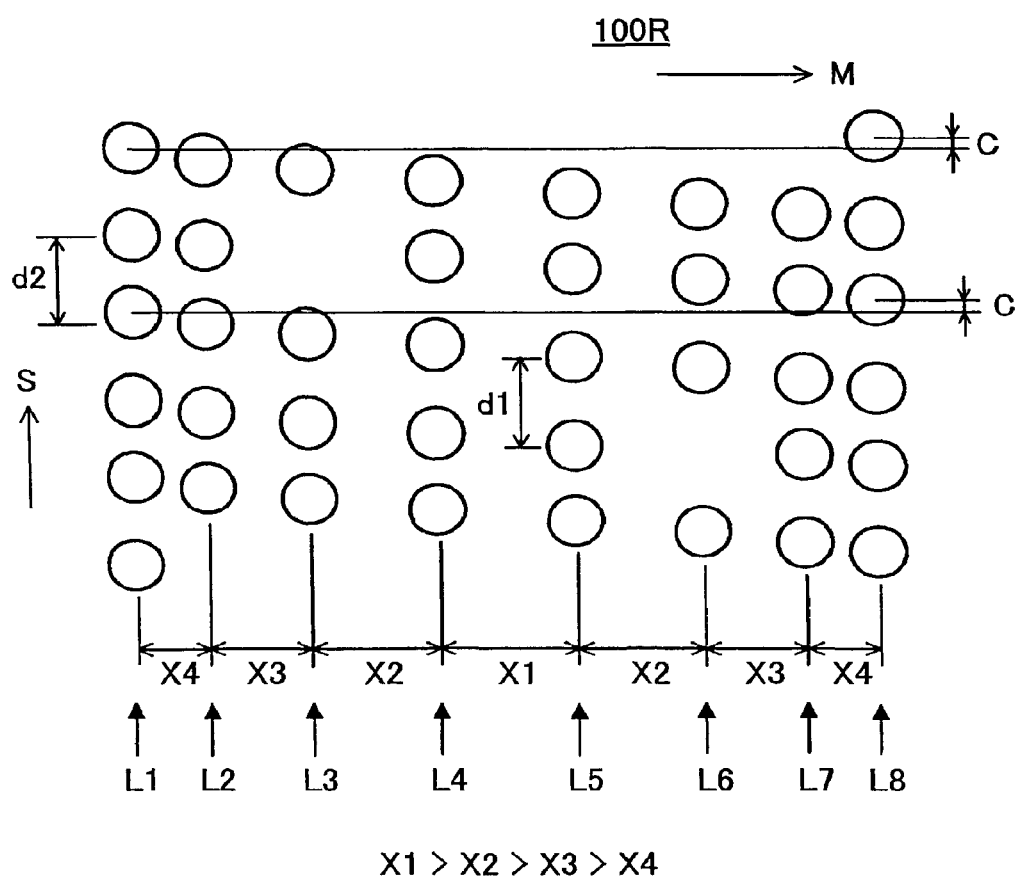
FIG. 34 is another plan view diagram of the surface-emission laser array according to Embodiment 8 of the present invention.

FIG. 34 is a plan view diagram of the surface-emission laser array 100Q according to Embodiment 8 of the present invention.

With this example, the first column L1 is formed of six surface-emission laser diode elements, the second column L2 is formed of five surface-emission laser diode elements, the third column L3 is formed of four surface-emission laser diode elements, the fourth column L4 is formed of five surface-emission laser diode elements, the fifth column L5 is formed of five surface-emission laser diode elements, the sixth column L6 is formed of four surface-emission laser diode elements, the seventh column L7 is formed of five surface-emission laser diode elements, and the eighth column L8 is formed of six surface-emission laser diode elements.

Further, the interval between two nearest surface-emission laser diode elements is set to C in two, mutually adjacent columns.

Further, the interval between plural surface-emission laser diodes may not be equal in each of the columns.

More specifically, the intervals X1, X2, X3, X4 and C are set to X1=50 μm, X2=45.5 μm, X3=38.5 μm, X4=26 μm, and C=4.4 μm.

With the surface-emission laser array 100R, it is possible to reduce the device temperature (particularly the temperature of the active layer) of the elements located in the central part of the array when the surface-emission laser diodes forming the array are operated.

Figure 35:
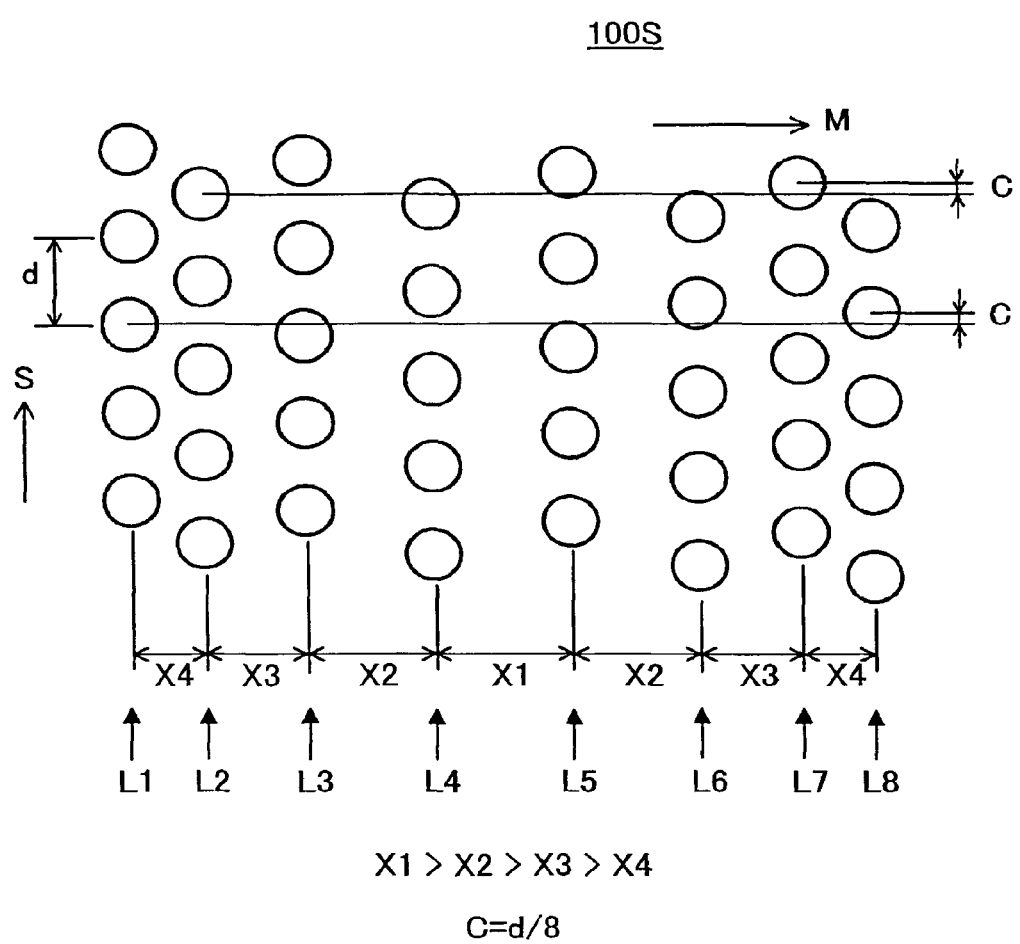
FIG. 35 is another plan view diagram of the surface-emission laser array according to Embodiment 8 of the present invention.

FIG. 35 is a plan view diagram of the surface-emission laser array 100Q according to Embodiment 8 of the present invention.

With the surface-emission laser array 100S, it can be seen that there are provided eight columns of surface-emission laser diode elements in the M-direction, wherein each column includes therein five surface-emission laser diode elements aligned in the S-direction with the interval d. Thus, the number of the columns is larger than the number of the surface-emission laser diode elements constituting one column.

Further, the interval between two nearest surface-emission laser diode elements is set larger than C in two, mutually adjacent columns. Thus, with the surface-emission laser array 100S, the surface-emission laser diode elements are disposed in a checkered pattern.

Figure 36:
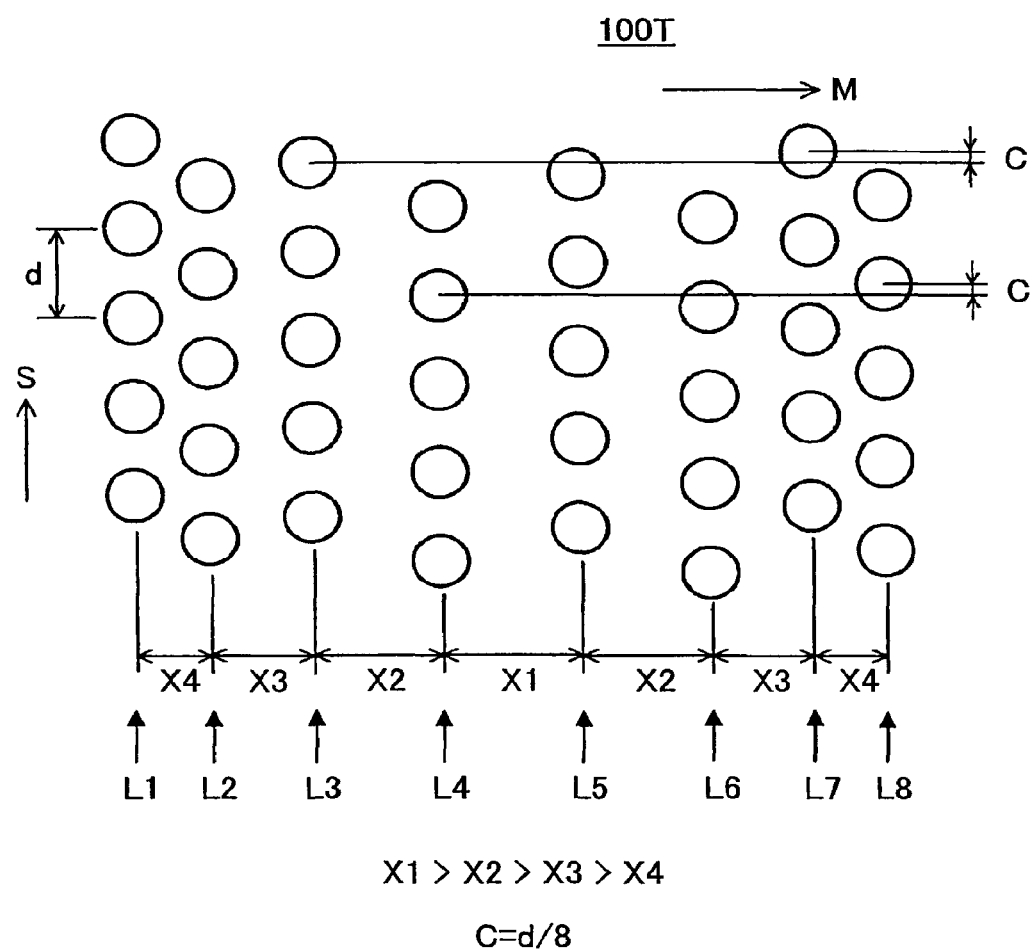
FIG. 36 is another plan view diagram of the surface-emission laser array according to Embodiment 9 of the present invention.

In the surface-emission laser array 100S, it should further be noted that the location of the surface-emission laser diode element located closest to the +S side in each column is displaced in the −S side with the order of: first column L1→third column L3→fifth column L5→seventh column L7→second column L2→fourth column L4→sixth column L6→eighth column L8, while the present invention is not limited to such an arrangement and it is also possible to displace the location of the surface-emission laser diode element located closest to the +S side in each column in the −S direction with the order of: first column L1→seventh column L7→third column L3→fifth column L5→second column L2→eighth column L8→fourth column L4→sixth column L6 as in the case of the surface-emission laser array 100T shown in FIG. 36. This means that the order of displacement may be random.

With the surface-emission laser array 100S and the surface-emission laser array 100T, it becomes possible to dispose the plural surface-emission laser diode elements in the area larger than the case of the surface-emission laser array 100Q or 100R, and thus, it is possible to suppress the temperature rise further.

As explained heretofore, with Embodiment 8, the 40 surface-emission laser diode elements are disposed two-dimensionally, in which there are disposed eight columns of surface-emission laser diode elements each including therein at least two surface-emission laser diode elements aligned in the S-direction, such that the eight columns are disposed in the M-direction perpendicular to the S-direction, wherein the interval between two adjacent columns located at the central part of the array formed of the eighth columns is set larger than the interval between the two columns adjacent with each other at the edge part of the array formed of the eight columns.

With this, the influence of heat generated by the surface-emission laser diode elements disposed in the peripheral part of the surface-emission laser array upon the surface-emission laser diode elements in the central part is reduced even when the plural surface-emission laser diode elements are driven at the same time, and the temperature rise of the surface-emission laser diode elements at the central part of the surface-emission laser array is suppressed as compared with the case in which the plural surface-emission laser diode elements are disposed in a uniform interval in the M-direction and in the S-direction. Thus, it becomes possible to make the output characteristics of the each surface-emission laser diode element uniform. Further, it becomes possible to increase the lifetime of the surface-emission laser array because of lowering of the temperature of the surface-emission laser diode elements that experience severest temperature rise in the surface-emission laser array.

Further, it should be noted that the 40 surface-emission laser diode elements are disposed with the equal interval in the S-direction, and the number of the columns is larger than the number of the surface-emission diode elements constituting one column. Further, the interval between the surface-emission laser diode elements in the S-direction in a column is smaller than the maximum interval of the plural surface-emission laser diode elements in the M-direction.

With this, it becomes possible to increase the writing density while reducing the effect of thermal interference between the surface-emission laser diode elements and securing necessary space for providing the interconnection pattern for each surface-emission laser diode element.

In the case there are formed five columns of surface-emission laser diode elements in the M-direction such that each column includes therein eight surface-emission laser diode elements aligned in the S-direction with the equal interval d, there holds the relationship C=35.2/5=7.04 µm when d is set equal to 35.2 µm. Thus, the interval C becomes larger than the interval C in the surface-emission laser array of Embodiment 8.

Next, the result of simulation conducted for predicting the temperature rise in the surface-emission laser array will be explained.

In the case the surface-emission laser diode elements were driven individually with the constant current of 4.26 mA (voltage 2.55V), an optical output of 1.7 mW was attained. Further, in the experiment of driving the respective surface-emission laser diode elements uniformly at room temperature, it was evaluated, from the observed shift of oscillation wavelength, that the temperature of the active layer has elevated by about 78° C. in the surface-emission laser diodes located at the central part of the array where there occurs severest thermal interference.

Thus, simulation has been made, based on the assumption that the 40 surface-emission laser diode elements generate the same amount of heat, about the temperature distribution of the active layer for the surface-emission laser diode elements, by making a correction such that the temperature of the active layer becomes the observed temperature for those surface-emission laser diode elements located in the central part of the array and experiences severest thermal interference and temperature rise.

Figure 37:
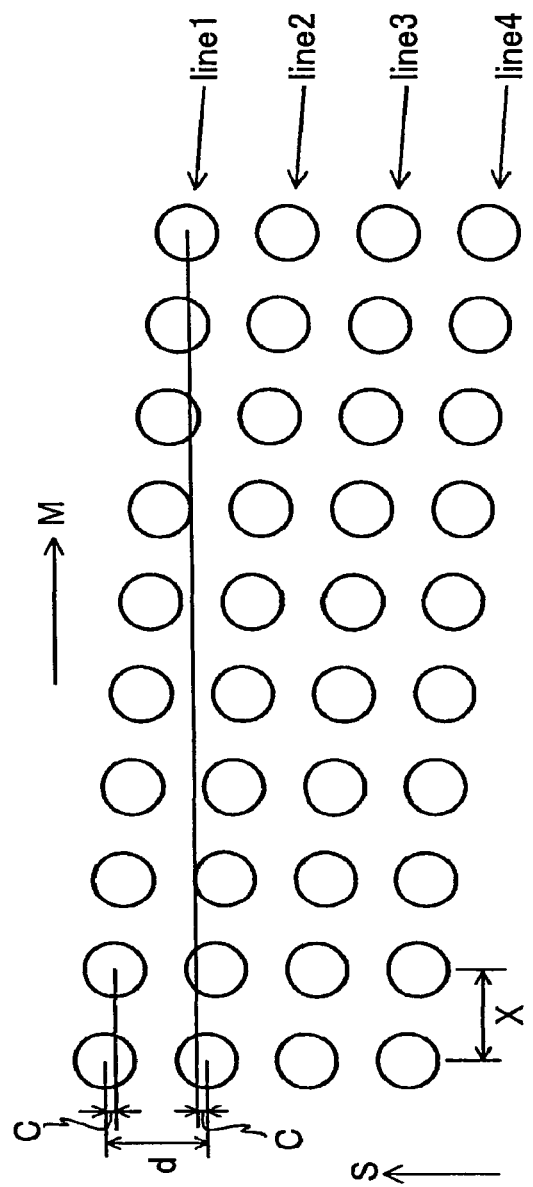
FIG. 37 is a diagram for explaining a surface-emission laser array (conventional example) used for simulation.

(1) The case in which ten columns of surface-emission laser diode elements, each including therein four surface-emission laser diode elements aligned in the S-direction with equal interval d, are disposed in the M-direction with equal interval (see FIG. 37)

Here, the interval d is set to 44 µm while the interval X is set to 30 µm. Thus, C becomes 4.4 µm.

Figure 38:
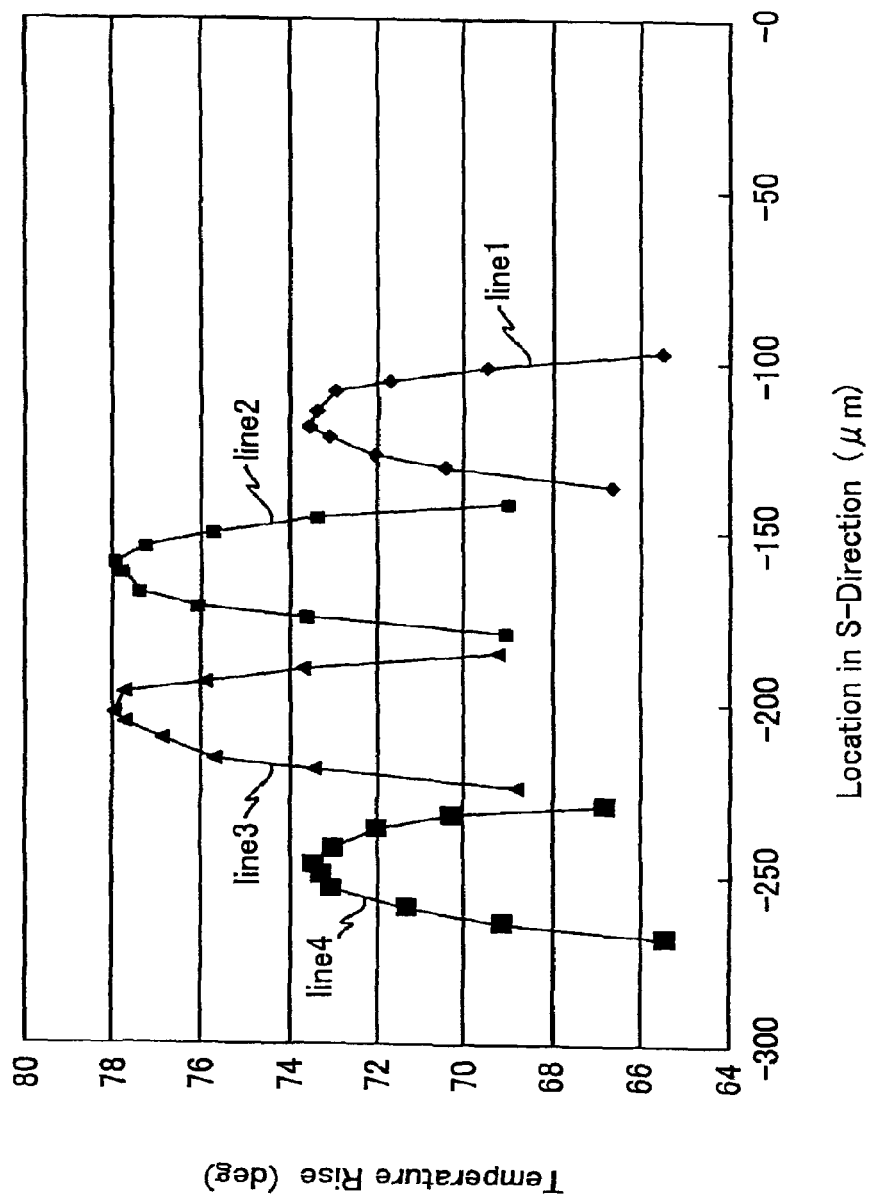
FIG. 38 is a diagram for explaining the result of simulation in the surface-emission laser array of FIG. 37.

FIG. 38 shows the result for this case. Referring to FIG. 38, it can be seen that there exists a difference of about 13° C. for the temperature rise between the 40 surface-emission laser diode elements and that the temperature rise severest in the surface-emission laser diode elements located at the central part of the array.

Figure 39:
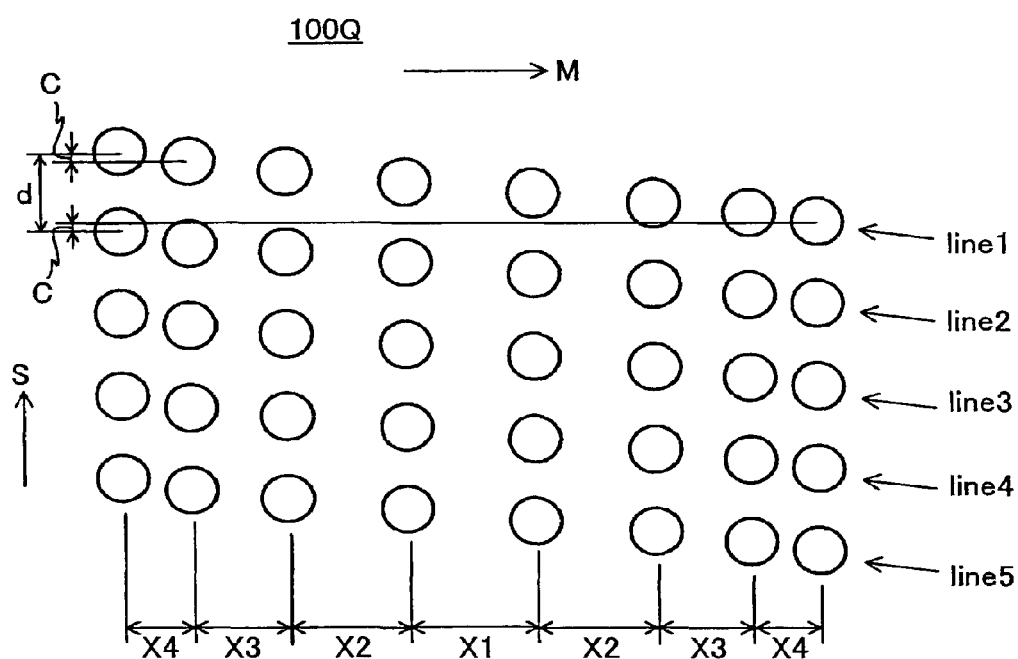
FIG. 39 is a first diagram for explaining a surface-emission laser array used for simulation.

(2) The case of the surface-emission laser array 100Q (see FIG. 39).

In this case, d is set to 35.2 µm, X1 is set to 50 µm, X2 is set to 46 µm, X3 is set to 38 µm, and X4 is set to 26 µm. Thus, C becomes 4.4 µm.

Figure 40:
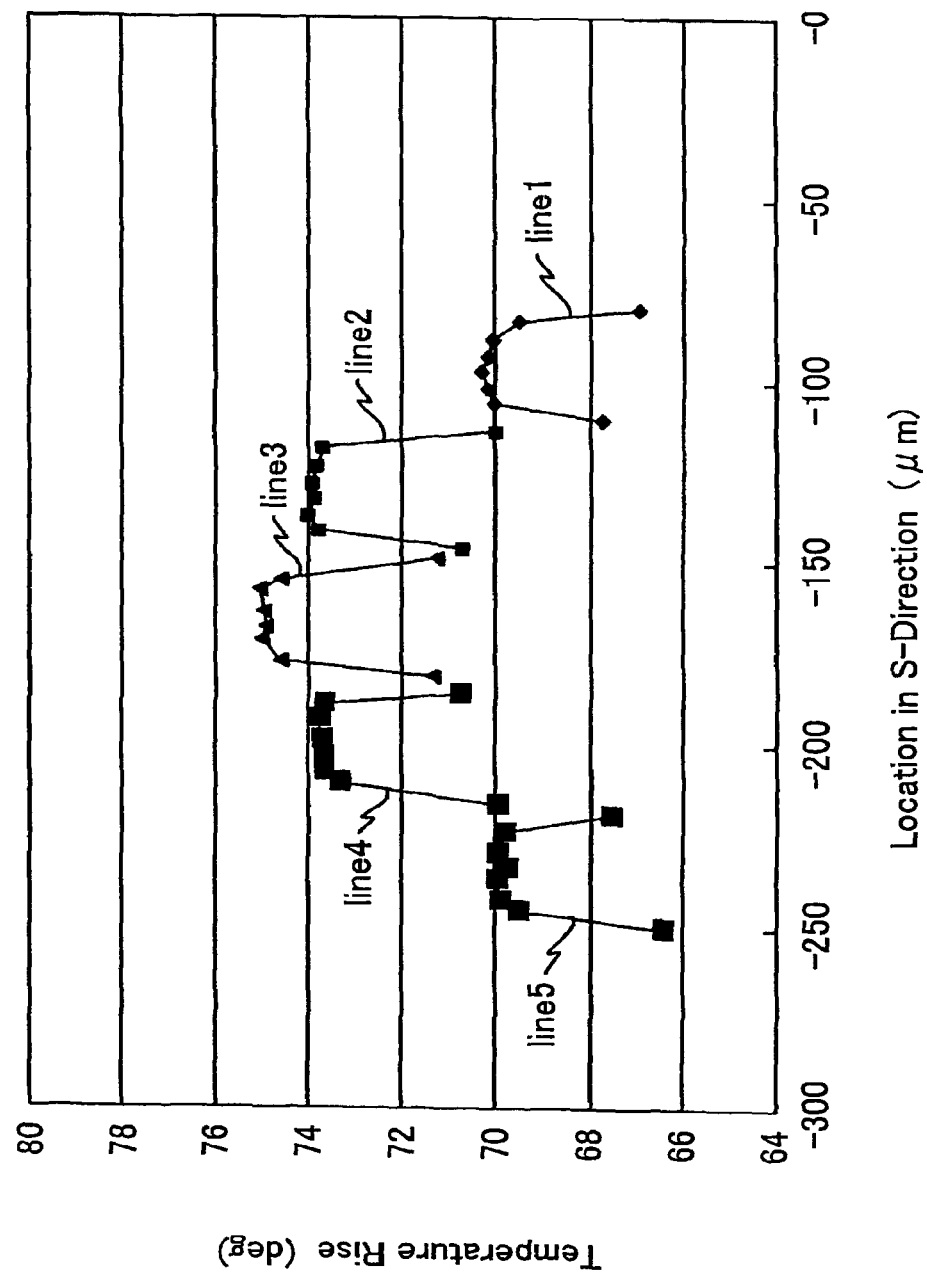
FIG. 40 is a diagram for explaining the result of simulation in the surface-emission laser array of FIG. 39.

FIG. 40 shows the result for this case. Referring to FIG. 40, it can be seen that the severest temperature rise is 75.1° C., while this is lower than the case (1).

In the case there are formed eight columns of surface-emission laser diode elements in the M-direction with equal interval such that each column includes four surface-emission laser diode elements aligned in the S-direction with the equal interval d, it should be noted that the maximum temperature rise was 77.6° C. This indicates that the construction of the present embodiment of disposing the columns of surface-emission laser diode elements non-uniformly is effective for lowering the maximum temperature of the surface-emission laser array.

Figure 41:
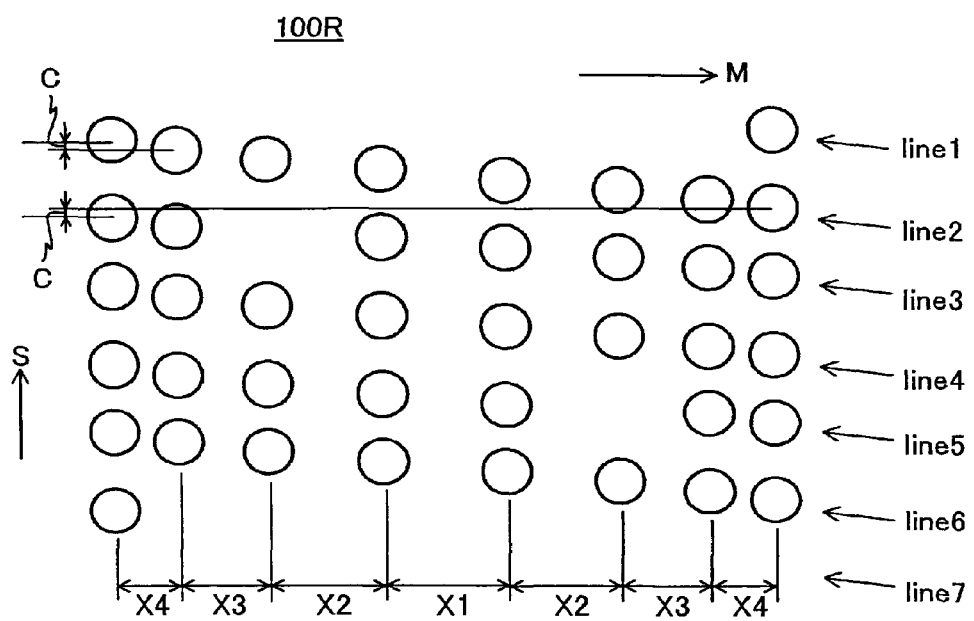
FIG. 41 is a second diagram for explaining a surface-emission laser array used for simulation.

(3) The case of the surface-emission laser array 100R (see FIG. 41).

In this case, the intervals X1, X2, X3, X4 and C are set that X1=50 µm, X2=45.5 µm, X3=38.5 µm, X4=26 µm, and C=4.4 µm.

Figure 42:
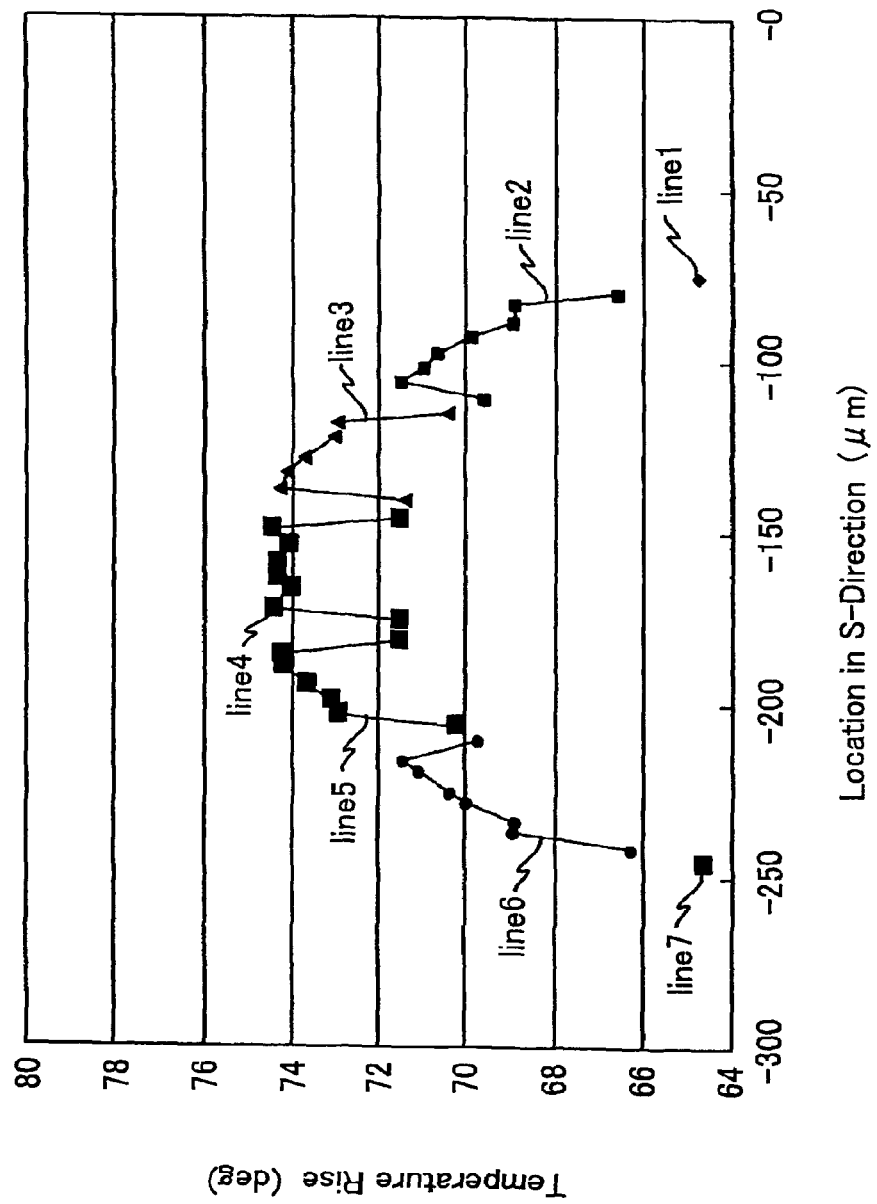
FIG. 42 is a diagram for explaining the result of simulation in the surface-emission laser array of FIG. 41.

FIG. 42 shows the result for this case. Referring to FIG. 40, it can be seen that the severest temperature rise is 74.5° C., while this is lower than the case (2).

Generally, the lifetime of surface-emission layer diode element increases by twice when the temperature is lowered by 10° C. Thus, with the decrease of temperature of 3.5° C., increase of lifetime of about 30% is expected.

It should be noted that the amount (W) of heat generation can be roughly calculated by the relation ship of:

heat generation($W$)=drive voltage($V$)×current($I$)−optical output($W$).

While the present simulation has been made under the condition that the entire surface-emission laser diode elements are driven under the same condition and that each surface-emission laser diode elements generates the same amount of heat, it should be noted that the optical output decreases with increasing degree of thermal interference in the actual surface-emission laser array. Thus, it is expected that the amount of heat generation increases in the surface-emission laser diode elements at the central part, and thus, the temperature distribution should increase further as compared with the result of calculation. Thus, the degree of lowering of temperature attained by the present embodiment by improving the arrangement of the surface-emission laser diode elements in the surface-emission layer array should be much larger than the calculated value, and thus, the effect of increasing the lifetime of the surface-emission laser array should be much larger than the calculated results.

While the present embodiment has been explained heretofore for the case in which each mesa part of the surface-emission laser array has a circular shape, the present invention is by no means limited to such a specific construction and the mesa part may have any of elliptic shape, square shape, rectangular shape, polygonal shape other than rectangular shape, or the like.

Further, while explanation has been made with the foregoing embodiment with regard to the case in which the surface-emission laser diode elements are aligned to form a column in the S-direction, the present invention is not limited to such a construction and includes also the case in which at least one element in the column is displaced with regard to other elements in the column.

[Application]

Figure 43:
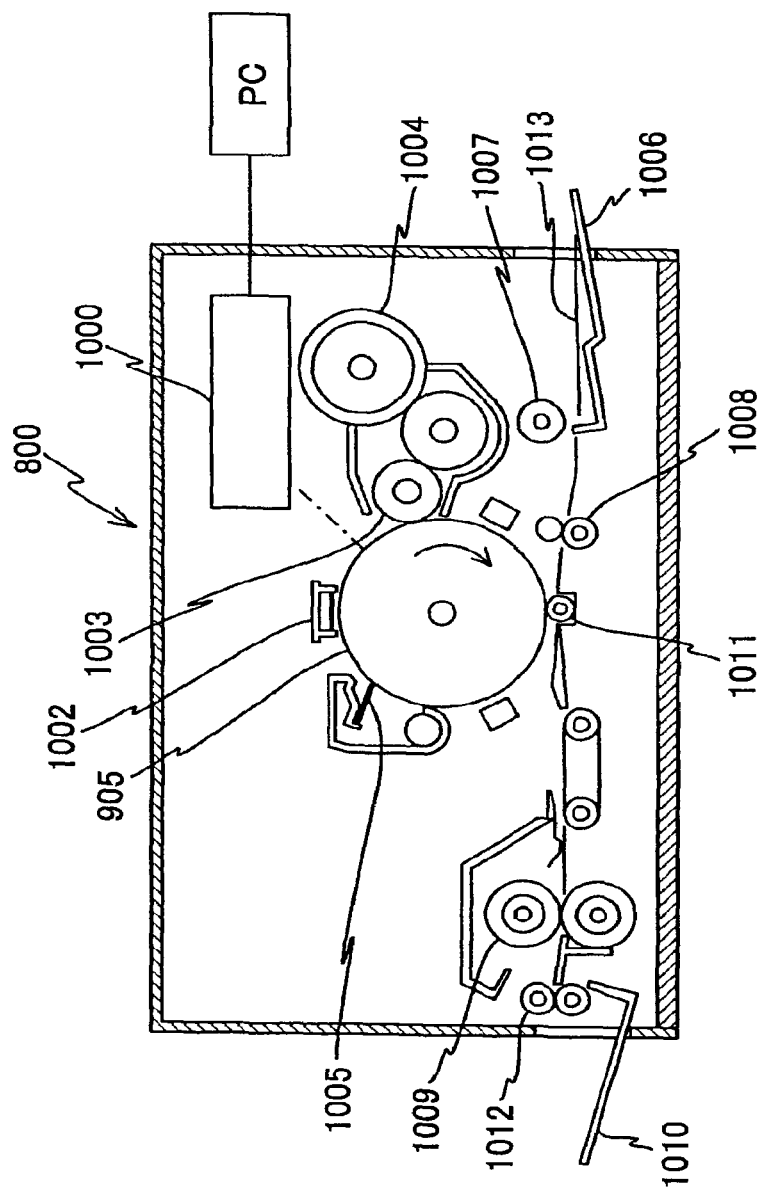
FIG. 43 is a diagram for explaining the schematic construction of a laser printer according to the embodiment of the present invention.

FIG. 43 shows a schematic construction of a laser printer 800 according to an embodiment of the present invention.

The laser printer 800 comprises an optical scanning apparatus 1000, a photosensitive drum 905, an electrostatic charger 1002, a developing roller 1003, a toner cartridge 1004, a cleaning blade 1005, a sheet feed tray 1006, a sheet feed roller 1007, resist roller pairs 1008, a transfer charger 1011, a fixing roller 1009, sheet discharging roller 1012, sheet discharging roller 1010, and the like.

The photosensitive drum 905 carries thereon a photosensitive layer. Thus, the surface of the photosensitive drum 905 provides the scanning surface. Here, it is assumed that the photosensitive drum 905 rotates it the direction of arrow shown in

FIG. 25.

The electrostatic charger 1002, the developing roller 1003, the transfer charger 1011 and the cleaning blade 1005 are disposed in the vicinity of the photosensitive drum 1005.

Thereby, the electrostatic charger 1002, the developing roller 1003, the transfer charger 1011 and the cleaning blade 1005 are disposed in the order of: electrostatic charger 1002→developing roller 1003→transfer charger 1011→cleaning blade 1005, along the rotating direction of the photosensitive drum 1005.

The electrostatic charger 1002 charges the surface of the photosensitive drum 1005 uniformly.

The optical scanning apparatus irradiates a modulated beam upon the surface of the photosensitive drum 905 charged with the electric charger 1002 with modulation based upon the image information from upper hierarchy apparatus such as personal computer. With this, the electric charges are eliminated on the surface of the photosensitive drum 905 where the optical irradiation has been made, and there is formed a latent image on the surface of the photosensitive drum 905 in correspondence to the image information. The latent image thus formed is moved in the direction of the developing roller 1003 with rotation of the photosensitive drum 905. The construction of this optical scanning apparatus 1000 will be explained later.

The toner cartridge 1004 holds toners, and the toners are supplied therefrom to the developing roller 1003. The amount of toner in the toner cartridge is checked upon turning on of the power or end of the print operation and message urging replacement of the toner cartridge is displayed in a display part not illustrated in the event the remaining amount of toners is not sufficient.

With rotation of the developing roller 1003, the surface of the developing roller 1003 is adhered with the toners supplied from the toner cartridge 1004 uniformly and there is formed a thin layer of toner. Further, with this developing roller 1003, there is applied a voltage such that mutually reverse electric fields are formed in the charged part of the photosensitive drum 1005 (the part not irradiated with the optical beam) and the discharged part (the part irradiated with the optical beam). With this voltage, the toners adhered to the surface of the developing roller 1003 are transferred only to the part of the photosensitive drum 1005 where the optical irradiation has been made. Thus, the developing roller 1003 causes the toners to adhere to the latent image formed on the surface of the photosensitive drum 1005, and with this, development of the image information is attained. The latent image adhered with toners or "toner image" is moved toward the transfer charger 1011 with rotation of the photosensitive drum 1005.

The sheet feed tray 1006 accommodates therein recording sheets 1013. Further, there is disposed a sheet feed roller 1007 in the vicinity of the sheet feed tray 1006, and the sheet feed roller 1007 picks up the recording sheet 1013 one by one from the sheet feed tray 1006 and supplies the same to the resist roller pair 1008. The resist roller pair 1008 is disposed in the vicinity of the transfer roller 1011 and holds the recording sheet 1013 picked up by the sheet feed roller 1007 temporarily and supplies the recording sheet to the gas between the photosensitive drum 905 and the transfer charger 1011 in synchronization with the rotation of the photosensitive drum 905.

Thereby, the transfer charger 1011 is applied with a voltage of reverse polarity to the toners for attracting the toners on the surface of the photosensitive drum 905 to the recording sheet 1013 electrically. With this voltage, the toner image on the surface of the photosensitive drum 905 is transferred to the recording sheet 1013. The recording sheet 1013 thus transferred with the toner image is then forwarded to the fixing roller 1009.

With this fixing roller 1009, heat and pressure is applied to the recording sheet 1013 and the toner image is fixed upon the recording sheet 1013. The recording sheet 1013 thus fixed with the toner image is forwarded to the sheet discharge tray 100 via the sheet discharging roller 1012 and is staked upon the sheet discharge tray 1010 one by one.

The cleaning blade 1005 removes the toner (residual toner) remaining on the surface of the photosensitive drum 1005. The residual toner thus removed are used again. After removal of the residual toner, the photosensitive drum 1005 returns to the position of the electrostatic charger 1002.

Next, the construction of the optical scanning apparatus 1000 will be described.

Figure 44:
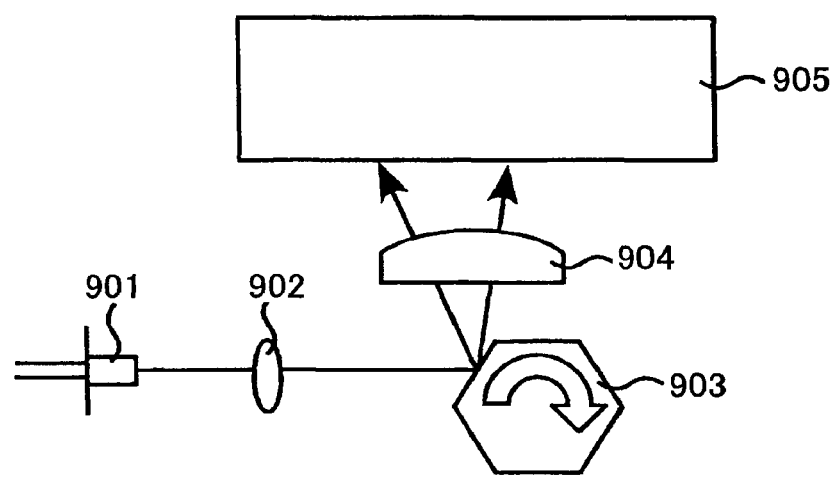
FIG. 44 is a schematic diagram showing the optical scanning apparatus of FIG. 43.

Referring to FIG. 44, the optical scanning apparatus 1000 comprises an optical source unit 901, a cylindrical lens 902, a polygonal mirror 903, a scanning lens 904, and the like.

The optical source unit 901 has a surface-emission laser array similar to any of the surface-emission laser array 100J-100T explained before.

The cylindrical lens 902 focuses the light from the optical source unit 901 in the sub-scanning direction to the region in the vicinity of the deflection mirror surface of the polygonal mirror 903.

The polygonal mirror 903 has six mirror surfaces each functioning as the deflection mirror surface. The polygonal mirror 903 is rotated about a rotational axis parallel to the sub-scanning direction at a constant speed.

The scanning lens 904 focuses the light deflected by the polygonal mirror 903 to the surface of the photosensitive drum 905.

In the case of using the surface-emission laser array 100G, for example, it is possible to attain the high-density writing of 4800 dpi (dot/inch) when the interval C is set to 4.4 μm and the magnification of the optical system is set to about 1.2 times. It should be noted that the resolution of 4800 dpi (dot/inch) can be attained even in the construction in which the 40 surface-emission laser diode elements are disposed with the same interval, when the interval C is set to 7.04 μm and the magnification of the optical system is set to about 0.75 times. However, this construction is not preferable because of the use of small magnification for the optical system, which requires large amount of light.

Further, in each of the surface-emission laser arrays 100J-100T, the straight lines drawn perpendicularly to the straight line extending in the sub-scanning direction from the respective centers of the plural surface-emission laser diode elements, are formed with an equal interval, and because of this, it is possible to realize the situation on the photosensitive body 905 as if the optical sources are aligned in the sub-scanning direction with the equal interval C, by suitably adjusting the timing of turning on of the plural surface-emission laser diode elements. With this, it becomes possible to adjust the interval of the recording dots in the sub-scanning direction by adjusting the interval C of the surface-emission laser diode elements and the magnification of the optical system.

In the case of using the surface-emission laser array 100J, for example, it is possible to attain the high-density writing of 2400 dpi (dot/inch) when the interval C is set to 5 μm and the magnification of the optical system is set to about 2.1 times. Further, it becomes possible to increase the recording density and improve the printing quality, by increasing the number of the surface-emission laser diode elements further, or decreasing the interval C, or decreasing the magnification further. It should be note that the writing interval in the main scanning direction can be easily controlled by adjusting the timing of turn-on of the optical sources.

The optical source unit 901 has a surface-emission laser array similar to any of the surface-emission laser arrays 100J-

100T explained before, and it becomes possible to attain higher output power. As a result, the laser printer 800 that uses the optical scanning apparatus 1000 can perform image formation with higher speed.

As explained before, according to the optical scanning apparatus 1000 of the present embodiment, in which the optical scanning unit 901 includes any of the surface-emission laser diode arrays 100J-100T, it is possible to achieve stable scanning of the scanning surface with the optical beams. Further, it is possible to extend the lifetime of the optical source unit 901.

Further, according to the laser printer 800 of the present invention that uses the optical scanning apparatus 1000 attaining stable scanning the surface, it is possible to form high-quality images at high speed.

Further, in the case the speed of image formation is not a critical factor and conventional speed of image formation is acceptable, it is possible with the present invention to reduce the number of the surface-emission laser diode elements constituting the surface-emission laser array, and the production yield of surface-emission laser array is improved significantly. Further, the cost of the surface-emission laser array can be reduced.

Further, with the present invention, it becomes possible to carry out printing without sacrificing the printing speed even in the case the writing dot density is increased.

Further, by reducing the area occupied by the plural surface-emission laser diode elements, it becomes possible with the present invention to suppress the temperature rise in the central part of the surface-emission laser array, and it becomes possible to suppress effect of aberration of the optical system and it is possible to improve the image quality.

Further, because of long lifetime of the surface-emission laser array, it is possible to reuse the optical source unit.

Meanwhile, in the case of using surface-emission laser array for the writing optical unit, the writing optical unit is treated as a disposable unit particularly in the case the lifetime of the surface-emission laser elements is short. However, the surface-emission laser array of the construction equivalent to any of the surface-emission laser arrays 100J-100T has the feature of long lifetime, and it becomes possible to reuse the writing optical unit when such a surface-emission laser array equivalent of any of the surface-emission laser arrays 100J-100T is used therein. Thereby, conservation of resources is attained together with reduction of environment load. This applied also to other apparatuses that use the surface-emission laser array of the present invention.

Further, while the foregoing embodiment has been explained for the case of laser printer 800, the present invention is by no means limited to this specific application. Thus, any image forming apparatuses can perform formation of high-quality images with high speed as long as the image forming apparatus uses the optical scanning apparatus 1000.

Further, even in the case of image forming apparatuses that form multicolor images, it is possible to carry out formation of high quality images at high speed by using optical scanning apparatus adapted to color images.

Figure 45:
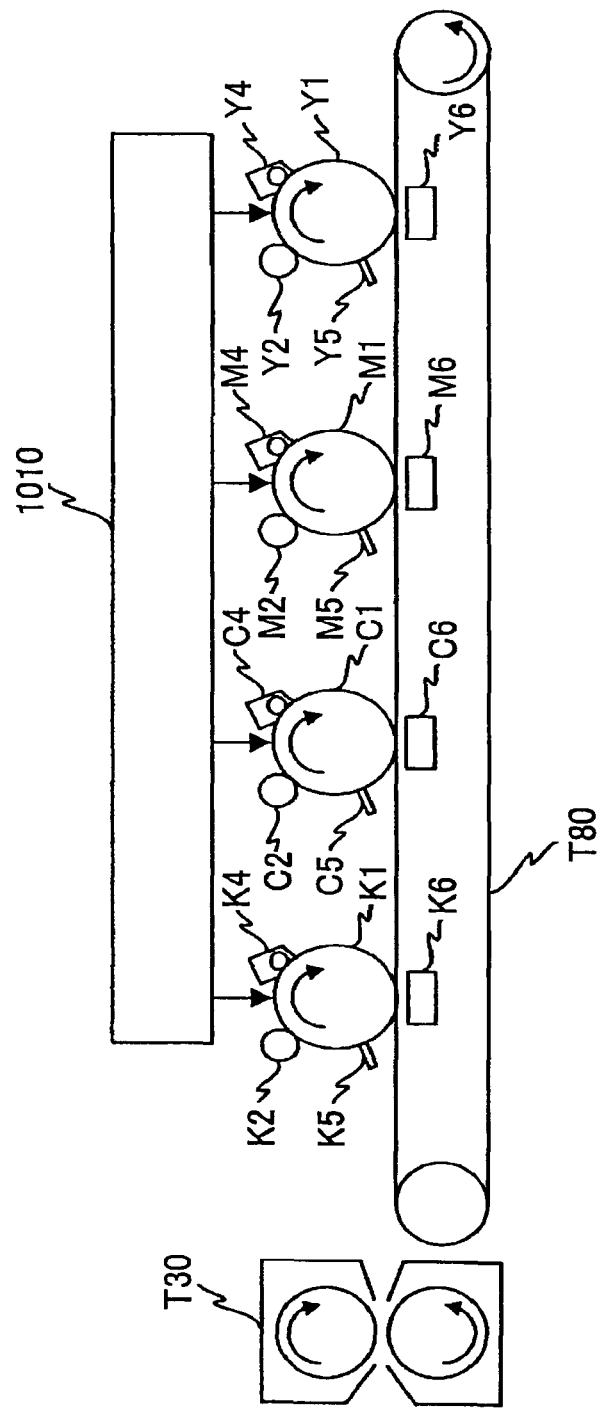
FIG. 45 is a diagram for explaining the schematic construction of a tandem color machine.

For example, the image forming apparatus may be a tandem color apparatus equipped with plural photosensitive drums as shown in FIG. 45. It should be noted that the tandem color apparatus comprises a photosensitive drum K1 for black (K) color, an electrostatic charger K2, a developing unit K4, cleaning means K5, transfer charging means K6, a photosensitive drum C1 for cyan (C) color, an electrostatic charger C2, a developing unit C4, cleaning means C5, transfer charging means C6, a photosensitive drum M1 for magenta (M) color, an electrostatic charger M2, a developing unit M4, cleaning means M5, transfer charging means M6, a photosensitive drum Y1 for yellow (Y) color, an electrostatic charger Y2, a developing unit Y4, cleaning means Y5, transfer charging means Y6, an optical scanning apparatus 1110, a transfer belt T80, fixing means T30, and the like.

In the illustrated example, the optical scanning apparatus 1110 comprises a surface-emission laser array for black color, a surface-emission laser array for cyan color, a surface-emission laser array for magenta color, and a surface-emission laser array for yellow color. Thereby, each of the surface-emission laser arrays comprises a surface-emission laser array equivalent to any of the surface-emission laser arrays 100J-100T.

Thus, the optical beams from the surface-emission laser array for the black color are irradiated upon the photosensitive drum K1 via the scanning optical system for the black color, the optical beams from the surface-emission laser array for the cyan color are irradiated upon the photosensitive drum C1 via the scanning optical system for the cyan color, the optical beams from the surface-emission laser array for the magenta color are irradiated upon the photosensitive drum M1 via the scanning optical system for the magenta color, and the optical beams from the surface-emission laser array for the yellow color are irradiated upon the photosensitive drum Y1 via the scanning optical system for the yellow color. Thereby, the optical scanning apparatus 1110 may be provided to each of the colors.

Each of the photosensitive drums causes rotation in the direction of arrows, and there are provided the charging unit, the developing unit, the transfer charging means and the cleaning means along the direction of rotation for each of the photosensitive drums. It should be noted that each charging unit charges the surface of the corresponding photosensitive drum uniformly. With irradiation of the optical beam upon the photosensitive drum thus charged by the charging unit from the optical scanning apparatus 1010, there is formed an electrostatic latent image on the photosensitive drum. Further, there is formed a toner image on the surface of the photosensitive drum by the corresponding developing unit. Further, the toner images of the respective colors are transferred to a recording sheet by the corresponding transfer charging unit, wherein the color toner image thus formed is fixed upon the recording sheet by fixing means T30.

With such a tandem color apparatus, there can be a case of color misalignment because of mechanical errors or the like, wherein the optical scanning apparatus 1010, using therein the high-density surface-emission laser array, can correct such color misalignment for each of the colors by selecting the surface-emission laser diode elements to be turned on appropriately.

It should be noted that the image forming apparatus may be an image forming apparatus that uses a silver salt film for the image carrier. In this case, there is formed a latent image on the silver salt film by optical scanning, while the latent image thus formed is visualized by carrying out the process similar to the developing process of ordinary silver salt photography process. Likewise, it is possible to transfer the image upon a contact paper by a process similar to the printing process of ordinary silver salt photography. Such an image forming apparatus can be used to construct photoengraving apparatuses, or optical drawing apparatuses drawing images such as CT scan image.

Further, the image forming apparatus may be the one that uses chromogenic medium (positive printing paper) that causes coloration by the thermal energy of the beam spot, for the image carrier. In this case, it is possible to directly form a visual image upon the image carrier by way of optical scanning.

Further, the image forming apparatus may be the one that lacks the optical scanning apparatus, as long as the image forming apparatus is the one that includes the surface-emission laser array equivalent of any of the surface-emission laser arrays 100J-100T.

Further, it should be noted that the embodiments explained above are provided merely for the purpose of showing examples and should not be interpreted that the present invention is limited to such specific embodiments.

The present invention is not limited to the embodiments described heretofore, but various variations and modifications may be made without departing from the scope of the invention as set forth in patent claims.

Industrial Applicability

The present invention is applicable to the surface-emission laser arrays in which plural surface-emission laser diode elements are disposed in the form of array in a first direction and in a second direction, wherein the interval between the surface-emission laser diode elements in the first direction, defined as the interval of the straight lines drawn perpendicularly from the respective centers of the surface-emission laser diode elements forming the surface-emission laser array to the line extending in the first direction, can be reduced. Further, the present invention is applicable to an optical scanning apparatus that uses the surface-emission laser array as set forth above. Further, the present invention is applicable to an image forming apparatus that uses the surface-emission laser array as set forth above.

Further, the present invention provides a surface-emission laser array capable of obtaining a uniform output throughout plural surface-emission laser diode elements constituting the surface-emission laser array even when the plural surface-emission laser diode elements are operated at the same time. Further, the present invention provides a surface-emission laser array of long lifetime.

Further, the present invention is applicable to an optical scanning apparatus and an image forming apparatus that is equipped with the surface-emission laser array including therein a plurality of surface-emission laser diode elements and capable of uniformizing the device characteristics of the plural surface-emission laser diode elements when operated simultaneously in the form of the array. Further, the present invention is applicable to an optical scanning apparatus and image forming apparatus having a surface-emission laser array of long lifetime.

Further, the present invention is by no means limited to the embodiments described heretofore, but various variations and modifications may be made without departing from the scope of the invention.

The present invention is based on Japanese priority applications No. 2007-035652 and No. 2007-057955, respectively filed on Feb. 16, 2007 and Mar. 8, 2007, which are incorporated herein as reference.

The invention claimed is:

1. A surface-emission laser array comprising a plurality of surface-emission laser diode elements arranged in the form of a two-dimensional array,
wherein a plurality of straight lines drawn perpendicularly to a straight line extending in a first direction from respective centers of said plurality of surface emission laser diode elements aligned in a second direction perpendicular to said first direction, are formed with generally equal interval in said first direction,
said surface-emission laser diode elements aligned in the first direction being disposed with a first interval in said first direction,
said surface-emission laser diode elements aligned in the second direction being disposed with a second interval in the second direction, the first interval being smaller than the second interval,
wherein the number of the surface-emission laser diode elements aligned in the first direction is smaller than the number of the surface-emission laser diode elements aligned in the second direction.

2. The surface-emission laser array as claimed in claim 1, wherein the number of said surface-emission laser diode elements aligned in said second direction changes in said first direction, and wherein the number of said surface-emission laser diode elements aligned in said first direction changes in said second direction.

3. The surface-emission laser array as claimed in claim 1, wherein said plurality of surface-emission laser diode elements are aligned zigzag in said first direction.

4. The surface-emission laser array as claimed in claim 1, wherein said plurality of surface-emission laser diode elements are aligned zigzag in said second direction.

5. The surface-emission laser array as claimed in claim 1, wherein said plurality of straight lines drawn perpendicularly to said straight line extending in said first direction from respective centers of said plurality of surface emission laser diode elements aligned in said second direction perpendicular to said first direction, are formed with a generally equal interval C smaller than 5 μm.

6. A surface-emission laser array comprising m×n surface-emission laser diode elements,
m (m being an integer equal to or larger than 2) of said m×n surface-emission laser diode elements being aligned in a first direction,
n (n being an integer equal to or larger than 3) of said m×n surface-emission laser diode elements being aligned in a second direction perpendicular to the first direction,
n straight lines drawn perpendicularly to a line extending in the first direction from respective centers of the n surface-emission laser diode being formed with generally equal interval in said first direction,
wherein there holds a relationship d<x and m<n, where d represents the interval of the m surface-emission laser diode elements aligned in the first direction, and x represents the interval of the n surface-emission laser diode elements aligned in the second direction.

7. A surface-emission laser array comprising a plurality of surface-emission laser diode elements arranged in the form of a two-dimensional array,
wherein a plurality of straight lines drawn perpendicularly to a straight line extending in a first direction from respective centers of said plurality of surface emission laser diode elements aligned in a second direction perpendicular to said first direction, are formed with generally equal interval in said first direction,
at least one interconnection pattern connected to at least one surface-emission laser diode element of said plurality of surface-emission laser diode elements disposed between one surface-emission laser diode element at one side and another surface-emission laser diode element at the other side, being disposed between surface-emission laser diode elements aligned in the second direction,
wherein said plurality of surface-emission laser diode elements comprise m×n surface-emission laser diode elements in which m (m being an integer equal to or larger than 2) surface-emission diode elements are aligned in a first direction and n (n being an integer equal to or larger than 3) surface-emission diode elements are aligned in a second direction perpendicular to the first direction, wherein the m surface-emission laser diode elements aligned in the first direction and the n surface-emission laser diode elements aligned in the second direction have a relationship of:

$$d<x \text{ and } m<n$$

where d represents an interval of the m surface-emission laser diode elements aligned in the first direction, and x represents an interval of the n surface-emission laser diode elements aligned in the second direction.

8. An optical scanning apparatus comprising:
a surface-emission laser array comprising a plurality of surface-emission laser diode elements arranged in the form of a two-dimensional array, wherein a plurality of straight lines drawn perpendicularly to a straight line extending in a first direction from respective centers of said plurality of surface emission laser diode elements aligned in a second direction perpendicular to said first direction, are formed with generally equal interval in said first direction, said surface-emission laser diode elements being disposed with a first interval in said first direction the said surface-emission laser diode elements aligned in the second direction being disposed with a second interval in the second direction, the first interval being smaller than the second interval, wherein the number of said surface-emission laser diode elements aligned in said first direction is smaller than the number of said surface-emission laser diode elements aligned in said second direction;
a deflection device deflecting a plurality of laser beams emitted from said plurality of surface-emission laser diode elements; and
a scanning optical element directing said plurality of laser beams deflected by said deflection device to a scanning surface,
wherein said first direction is set coincident to a sub-scanning direction of said optical scanning direction, and
wherein said second direction is set coincident to a main scanning direction of said optical scanning direction.

9. An image forming apparatus, comprising:
a photosensitive body providing a scanning surface;
an optical source producing a plurality of optical beams, said optical source comprising a surface-emission laser array comprising a plurality of surface-emission laser diode elements arranged in the form of a two-dimensional array, wherein a plurality of straight lines drawn perpendicularly to a straight line extending in a first direction from respective centers of said plurality of surface emission laser diode elements aligned in a second direction perpendicular to said first direction, are formed with generally equal interval in said first direction, said plurality surface-emission laser diode elements being disposed with a first interval in said first direction with said surface-emission laser diode elements aligned in the second direction being disposed with a second interval in the second direction, the first interval being smaller than the second, wherein the number of said surface-emission laser diode elements aligned in said first direction is smaller than the number of said surface-emission laser diode elements aligned in said second direction, said plurality of optical beams emitting said plurality of optical beams;
a deflection device deflecting said plurality of said optical beams emitted from said plurality of surface-emission laser diode elements;
a scanning optical element directing said plurality of laser beams deflected by said deflection device to said scanning surface of said photosensitive body,
wherein said first direction is set coincident to a sub-scanning direction of said optical scanning direction, and
wherein said second direction is set coincident to a main scanning direction of said optical scanning direction.

* * * * *